United States Patent
Owaki et al.

(10) Patent No.: US 8,598,766 B2
(45) Date of Patent: Dec. 3, 2013

(54) SURFACE ACOUSTIC WAVE RESONATOR, SURFACE ACOUSTIC WAVE OSCILLATOR, AND ELECTRONIC APPARATUS

(75) Inventors: Takuya Owaki, Kamiina (JP); Kunihito Yamanaka, Kamiina (JP); Keigo Iizawa, Sakata (JP); Kenichi Hano, Minamisoma (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 13/310,123

(22) Filed: Dec. 2, 2011

(65) Prior Publication Data
US 2012/0139653 A1   Jun. 7, 2012

(30) Foreign Application Priority Data
Dec. 3, 2010 (JP) .................. 2010-270953

(51) Int. Cl.
*H01L 41/09* (2006.01)
(52) U.S. Cl.
USPC .............. 310/313 A; 310/313 R; 310/313 B; 310/365
(58) Field of Classification Search
USPC ...... 310/313 A, 313 B, 313 C, 313 D, 313 R, 310/365–366, 360, 311; 333/195, 193
IPC ....................................................... H01L 41/09
See application file for complete search history.

(56) References Cited

U.S. PATENT DOCUMENTS

| | | |
|---|---|---|
| 4,387,355 A | 6/1983 | Uno et al. |
| 5,179,310 A | 1/1993 | Satoh et al. |
| 6,154,105 A | 11/2000 | Fujimoto et al. |
| 6,329,888 B1 | 12/2001 | Hirota |
| 6,414,414 B1 | 7/2002 | Wright |
| 6,774,747 B2 | 8/2004 | Yamazaki et al. |

(Continued)

FOREIGN PATENT DOCUMENTS

| | | |
|---|---|---|
| JP | 54-156455 | 12/1979 |
| JP | 57-005418 | 1/1982 |

(Continued)

OTHER PUBLICATIONS

Shimizu, Tasutaka et al., "A New Cut of Quartz for Saw With More Stable Temperature Characteristics", Tokyo Institute of Technology and Nippon Electric Co., Ltd., Mar. 26, 1982, pp. 562-563.

(Continued)

*Primary Examiner* — Thomas Dougherty
*Assistant Examiner* — Karen B Addison
(74) *Attorney, Agent, or Firm* — Harness, Dickey & Pierce, P.L.C.

(57) ABSTRACT

A surface acoustic wave resonator includes a quartz crystal substrate with Euler angles ($-1.5° \leq \phi \leq 1.5°$, $117° \leq \theta \leq 142°$, and $42.79° \leq |\Psi| \leq 49.57°$), and an IDT provided on the quartz crystal substrate that includes a plurality of electrode fingers and excites a stop band upper end mode surface acoustic wave. Inter-electrode finger grooves are provided between the electrode fingers. If a line occupation rate of the convex portions of the quartz crystal substrate disposed between the inter-electrode finger grooves is $\eta g$, and a line occupation rate of the electrode fingers disposed on the convex portions is $\eta e$, $\eta_g > \eta_e$ and $0.59 < \eta_{eff} < 0.73$ are satisfied when an effective line occupation rate $\eta eff$ of the IDT is an arithmetic mean of the line occupation rate $\eta g$ and the line occupation rate $\eta e$.

11 Claims, 53 Drawing Sheets

(56) References Cited

U.S. PATENT DOCUMENTS

| | | |
|---|---|---|
| 6,784,595 B2 | 8/2004 | Iizawa et al. |
| 6,856,218 B2 | 2/2005 | Yamazaki et al. |
| 2002/0171512 A1 | 11/2002 | Kadota et al. |
| 2003/0052572 A1* | 3/2003 | Iizawa et al. ............. 310/313 A |
| 2004/0135469 A1* | 7/2004 | Kanna ....................... 310/313 A |
| 2004/0201306 A1 | 10/2004 | Yamanouchi |
| 2005/0127781 A1 | 6/2005 | Yamazaki et al. |
| 2006/0108894 A1* | 5/2006 | Kanna ....................... 310/313 A |
| 2006/0145568 A1 | 7/2006 | Morita et al. |
| 2009/0206955 A1 | 8/2009 | Iizawa |
| 2010/0219913 A1 | 9/2010 | Yamanaka |
| 2010/0244626 A1 | 9/2010 | Yamanaka |

FOREIGN PATENT DOCUMENTS

| | | |
|---|---|---|
| JP | 57-099813 | 6/1982 |
| JP | 58-033309 | 2/1983 |
| JP | 61-092011 | 5/1986 |
| JP | 61-220513 | 9/1986 |
| JP | 61-220514 | 9/1986 |
| JP | 01-231412 | 9/1989 |
| JP | 02-189011 | 7/1990 |
| JP | 03-284009 | 12/1991 |
| JP | 05-090865 | 4/1993 |
| JP | 10-270974 | 10/1998 |
| JP | 11-214958 | 8/1999 |
| JP | 11-298290 | 10/1999 |
| JP | 2000-188521 | 7/2000 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-258601 | 9/2003 |
| JP | 2005-012736 | 1/2005 |
| JP | 2005-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 3851336 | 9/2006 |
| JP | 2006-295311 | 10/2006 |
| JP | 2006-339742 | 12/2006 |
| JP | 2007-028664 | 2/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2008-078984 | 4/2008 |
| JP | 2008-236295 | 10/2008 |
| JP | 2009-225420 | 10/2009 |
| JP | 2010-233203 | 10/2010 |
| WO | 2010-098139 | 9/2010 |

OTHER PUBLICATIONS

Takehiko Uno et al., "Fabrication of Saw Resonators With Groove Gratings and Their Characteristics", Electrical Communication Laboratories, NTT, pp. 45-52.

Martin, G et al., "Improved Temperature Stability of One-Port Saw Resonators Achieved Without Coils", Leibniz Institute for Solid State and Materials Research, Vectron International Telefilter, 2007, pp. 925-928.

* cited by examiner

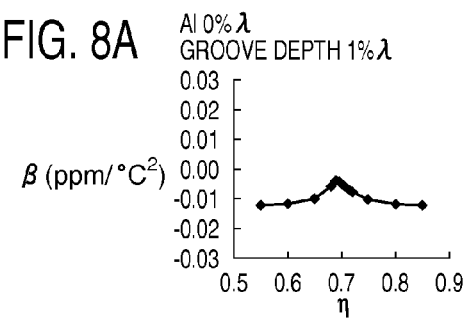
FIG. 8A  Al 0% λ  GROOVE DEPTH 1% λ
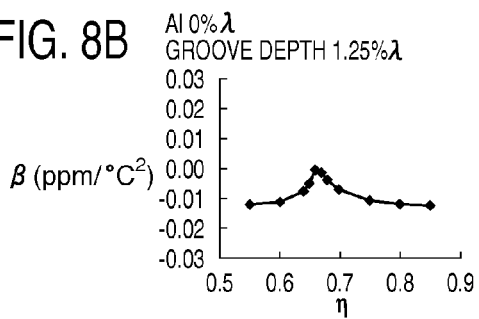
FIG. 8B  Al 0% λ  GROOVE DEPTH 1.25% λ
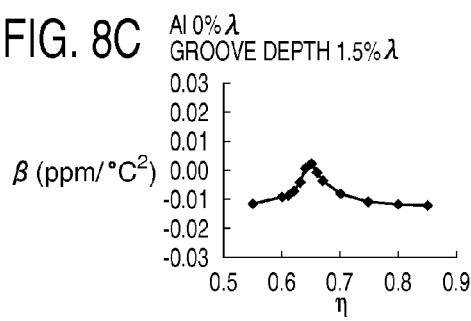
FIG. 8C  Al 0% λ  GROOVE DEPTH 1.5% λ
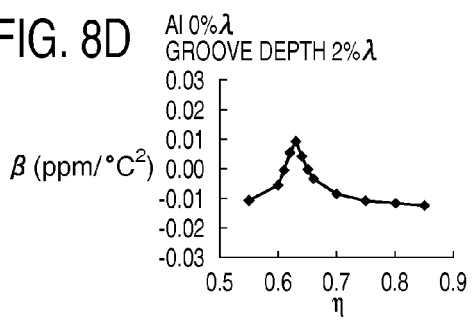
FIG. 8D  Al 0% λ  GROOVE DEPTH 2% λ
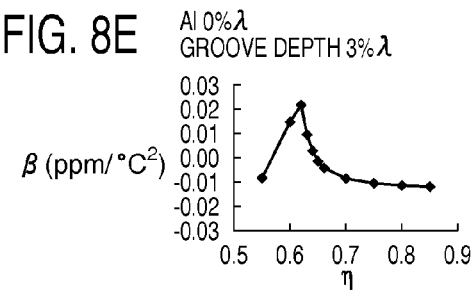
FIG. 8E  Al 0% λ  GROOVE DEPTH 3% λ
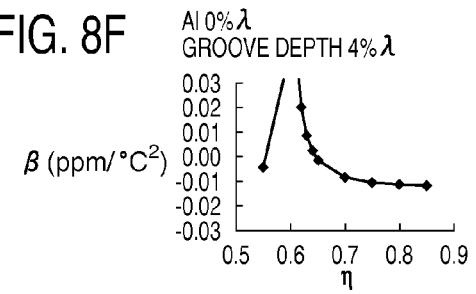
FIG. 8F  Al 0% λ  GROOVE DEPTH 4% λ
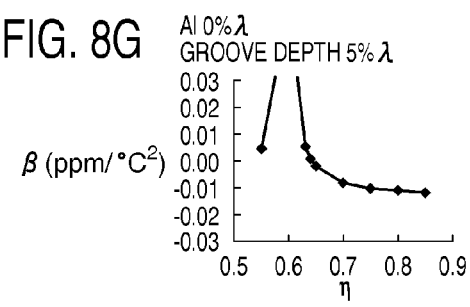
FIG. 8G  Al 0% λ  GROOVE DEPTH 5% λ
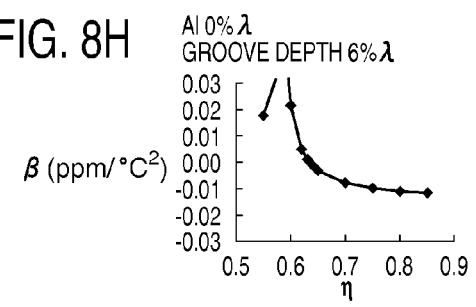
FIG. 8H  Al 0% λ  GROOVE DEPTH 6% λ
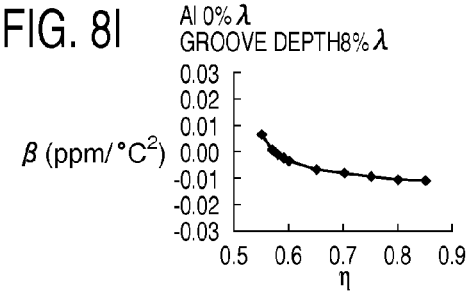
FIG. 8I  Al 0% λ  GROOVE DEPTH 8% λ

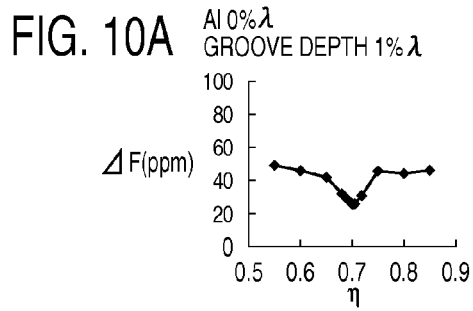
FIG. 10A Al 0%λ GROOVE DEPTH 1%λ
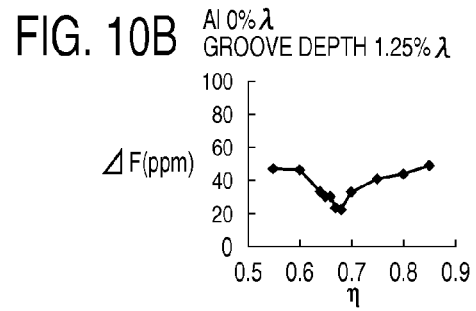
FIG. 10B Al 0%λ GROOVE DEPTH 1.25%λ
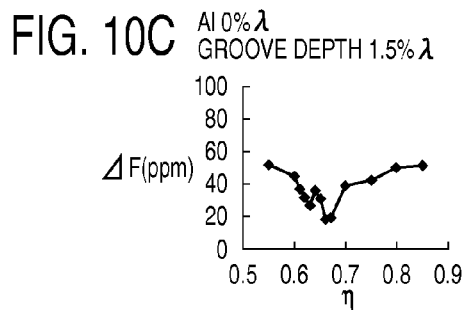
FIG. 10C Al 0%λ GROOVE DEPTH 1.5%λ
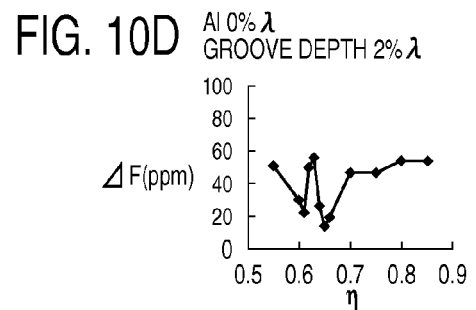
FIG. 10D Al 0%λ GROOVE DEPTH 2%λ
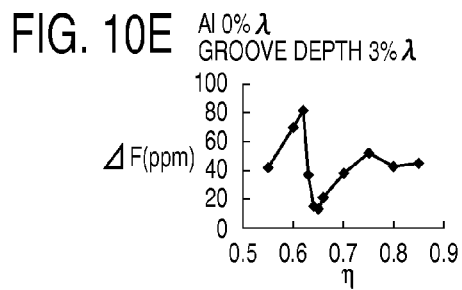
FIG. 10E Al 0%λ GROOVE DEPTH 3%λ
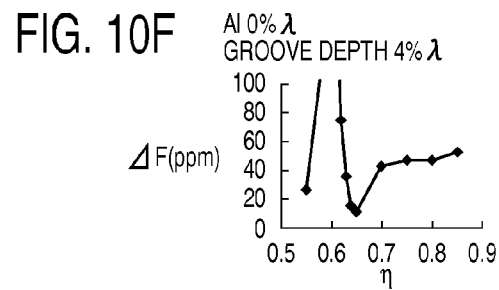
FIG. 10F Al 0%λ GROOVE DEPTH 4%λ
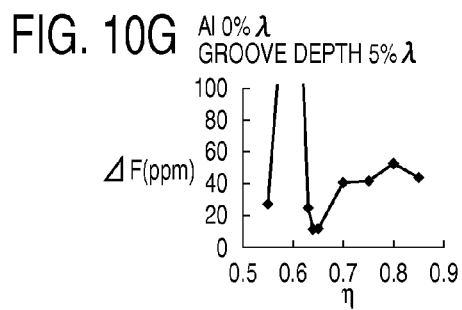
FIG. 10G Al 0%λ GROOVE DEPTH 5%λ
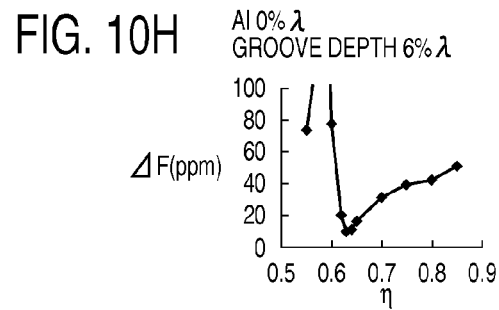
FIG. 10H Al 0%λ GROOVE DEPTH 6%λ
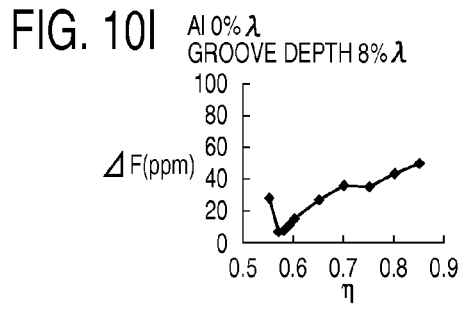
FIG. 10I Al 0%λ GROOVE DEPTH 8%λ

| | F | Q | γ | CI | M |
|---|---|---|---|---|---|
| | MHz | | | Ω | |
| AVG | 318.25 | 13285 | 2476 | 21.8 | 5.4 |

SURFACE ACOUSTIC WAVE RESONATOR, SURFACE ACOUSTIC WAVE OSCILLATOR, AND ELECTRONIC APPARATUS

BACKGROUND

1. Technical Field

The present invention relates to a surface acoustic wave resonator, a surface acoustic wave oscillator in which the resonator is mounted, and an electronic apparatus, and more particularly to a type of surface acoustic wave resonator where grooves are provided in a substrate surface, and a surface acoustic wave oscillator in which the resonator is mounted.

2. Related Art

In a surface acoustic wave (SAW) device (for example, a SAW resonator), the effect of a SAW stop band, piezoelectric substrate (for example, quartz crystal substrate) cut angle, IDT (interdigital transducer) formation shape, and the like, on changes in frequency-temperature characteristics is considerable.

For example, a configuration exciting each of a SAW stop band upper end mode and lower end mode, the distribution of standing waves in each of the stop band upper end mode and lower end mode, and the like, are disclosed in JP-A-11-214958.

In addition, points for which the SAW stop band upper end mode has better frequency-temperature characteristics than the stop band lower end mode are described in JP-A-2006-148622, JP-A-2007-208871, JP-A-2007-267033 and JP-A-2002-100959. Then, it is described in JP-A-2006-148622 and JP-A-2007-208871 that, in order to obtain favorable frequency-temperature characteristics in a SAW device utilizing a Rayleigh wave, as well as adjusting the cut angle of the quartz crystal substrate, the electrode standardizing film thickness (H/λ) is increased to around 0.1.

Further, it is described in JP-A-2007-267033 that, as well as adjusting the cut angle of the quartz crystal substrate in a SAW device utilizing a Rayleigh wave, the electrode standardizing film thickness (H/λ) is increased by around 0.045 or more.

In addition, it is described in JP-A-2002-100959 that, by using a rotated Y-cut, X-propagating quartz crystal substrate, and utilizing the stop band upper end resonance, the frequency-temperature characteristics improve more than in the case of using the stop band lower end resonance.

It is described in JP-A-57-5418 and "Manufacturing Conditions and Characteristics of Grooved SAW Resonators" (Institute of Electronics and Communication Engineers of Japan Technical Research Report MW82-59 (1982)), that grooves are provided between the electrode fingers configuring the IDT, and between the conductor strips configuring the reflectors, in a SAW device using an ST cut quartz crystal substrate. Also, it is described in "Manufacturing Conditions and Characteristics of Grooved SAW Resonators" (Institute of Electronics and Communication Engineers of Japan Technical Research Report MW82-59 (1982)), that a peak temperature in the frequency-temperature characteristics having a quadratic curve shape changes depending on the depth of the grooves, and a second-order temperature coefficient is approximately $-3.4 \times 10^{-8}/°C.^2$.

In Japanese Patent No. 3,851,336, as well as describing a configuration for making a curve indicating the frequency-temperature characteristics a cubic curve in a SAW device using an LST cut quartz crystal substrate, it is described that, in a SAW device using a Rayleigh wave, it has not been possible to find a cut angle substrate having the kind of temperature characteristics indicated by a cubic curve.

As described above, there is a wide range of elements for improving the frequency-temperature characteristics, and it is thought that, particularly with a SAW device using a Rayleigh wave, increasing the film thickness of the electrodes configuring the IDT is one factor contributing to the frequency-temperature characteristics. However, the applicant has found experimentally that on increasing the film thickness of the electrodes, environmental resistance characteristics, such as temporal change characteristics and temperature and shock resistance characteristics, are deteriorated. Further, when having the improvement of frequency-temperature characteristics as a principal object, it is necessary to increase the electrode film thickness, as described above, and an accompanying deterioration of temporal change characteristics, temperature and shock resistance characteristics, and the like, is unavoidable. Since this also applies to the Q value, it is difficult to realize a higher Q without increasing the electrode film thickness.

In order to solve the problem, Pamphlet of International Publication WO2010/098139 discloses a configuration in which grooves are formed on a quartz crystal substrate in a direction perpendicular to the propagation direction of the surface acoustic wave, and electrodes are formed on convex portions formed by the grooves. With this, environmental resistance characteristics such as temporal change characteristics and temperature and shock resistance characteristics are improved, thereby realizing a high Q value. In addition, JP-A-61-220513 or JP-A-61-220514 discloses a configuration in which, in order to realize a high Q value, grooves are formed between stripe-shaped metal films constituting reflectors which are disposed between IDT electrodes or at both sides of the IDT electrode.

Further, in Pamphlet of International Publication WO2010/098139, a groove depth, a film thickness of an electrode formed on the groove, and a line occupation rate of the groove are systematically investigated. In addition, in a case where the surface acoustic wave resonator is excited in a stop band upper end mode, the condition is ascertained that an absolute value of the second-order temperature coefficient of the surface acoustic wave is 0.01 ppm/°$C.^2$ or less by adjusting the line occupation rate with respect to a given groove depth and electrode film thickness. Thereby, since the frequency-temperature characteristics of the surface acoustic wave show a cubic curve, it is expected that a frequency deviation can be suppressed in a temperature range around the inflection point.

In addition, JP-A-2009-225420 discloses a configuration in which a frequency deviation in an operating temperature range of the surface acoustic wave resonator is reduced when the line width of the electrode finger constituting the IDT electrode, that is, a line occupation rate fluctuates.

However, there is a strong demand for reduction in loss in the surface acoustic wave resonator in the surface acoustic wave resonator disclosed in Pamphlet of International Publication WO2010/098139, JP-A-61-220513, JP-A-61-220514, and JP-A-2009-225420 as well, but there is no detailed disclosure thereof at present.

SUMMARY

An advantage of some aspects of the invention is to provide a surface acoustic wave resonator which reduces a frequency deviation of a surface acoustic wave and decreases loss in the surface acoustic wave resonator, and a surface acoustic wave oscillator and an electronic apparatus using the surface acoustic wave resonator.

Application Example 1

This application example of the invention is directed to a surface acoustic wave resonator including a quartz crystal substrate with Euler angles ($-1.5° \leq \phi \leq 1.5°$, $117° \leq \theta \leq 142°$, and $42.79° \leq |\Psi| \leq 49.57°$); and an IDT that is provided on the quartz crystal substrate, includes a plurality of electrode fingers, and excites a stop band upper end mode surface acoustic wave, wherein inter-electrode finger grooves which are depressions of the quartz crystal substrate are provided between the electrode fingers in a plan view, and wherein if a line occupation rate of convex portions of the quartz crystal substrate disposed between the inter-electrode finger grooves is $\eta g$, and a line occupation rate of the electrode fingers disposed on the convex portions is $\eta e$, the following relationships are satisfied in a case where an effective line occupation rate $\eta eff$ of the IDT is an arithmetic mean of the line occupation rate $\eta g$ and the line occupation rate $\eta e$.

$$0.59 < \eta_{eff} < 0.73$$

With the configuration, it is possible to reduce loss in a surface acoustic wave resonator by increasing excitation efficiency, and to suppress a fluctuation amount of the first-order temperature coefficient of the surface acoustic wave resonator so as to suppress variations in the resonance frequency.

Application Example 2

This application example of the invention is directed to the surface acoustic wave resonator according to the above application example of the invention, wherein, if a wavelength of the surface acoustic wave is $\lambda$, a depth of the inter-electrode finger groove is G, an electrode film thickness of the IDT is H, and plane coordinates (G/$\lambda$, $\eta eff$) are indicated using the value G/$\lambda$ obtained by dividing a depth G of the inter-electrode finger groove by the wavelength $\lambda$ of the surface acoustic wave, and the effective line occupation rate $\eta eff$, the plane coordinates (G/$\lambda$, $\eta eff$) are included in one of (1) at $0.000\lambda < H \leq 0.005\lambda$
a range surrounded by a line connecting (0.010, 0.710), (0.020, 0.710), (0.030, 0.710), (0.040, 0.710), (0.050, 0.710), (0.060, 0.710), (0.070, 0.710), (0.080, 0.710), (0.090, 0.710), (0.090, 0.420), (0.080, 0.570), (0.070, 0.590), (0.060, 0.615), (0.050, 0.630), (0.040, 0.635), (0.030, 0.650), (0.020, 0.670), and (0.010, 0.710) in this order, and
a range surrounded by a line connecting (0.030, 0.590), (0.040, 0.580), (0.050, 0.550), (0.060, 0.520), (0.070, 0.480), (0.080, 0.450), (0.090, 0.400), (0.090, 0.180), (0.080, 0.340), (0.070, 0.410), (0.060, 0.460), (0.050, 0.490), (0.040, 0.520), (0.030, 0.550), and (0.030, 0.590) in this order,
(2) at $0.005\lambda < H \leq 0.010\lambda$
a range surrounded by a line connecting (0.010, 0.770), (0.020, 0.740), (0.030, 0.715), (0.040, 0.730), (0.050, 0.740), (0.060, 0.730), (0.070, 0.730), (0.080, 0.730), (0.080, 0.500), (0.070, 0.570), (0.060, 0.610), (0.050, 0.630), (0.040, 0.635), (0.030, 0.655), (0.020, 0.680), (0.010, 0.760), and (0.010, 0.770) in this order, and
a range surrounded by a line connecting (0.020, 0.650), (0.030, 0.610), (0.040, 0.570), (0.050, 0.550), (0.060, 0.520), (0.070, 0.470), (0.070, 0.370), (0.060, 0.440), (0.050, 0.480), (0.040, 0.520), (0.030, 0.550), (0.020, 0.590), and (0.020, 0.650) in this order, (3) at $0.010\lambda < H \leq 0.015\lambda$
a range surrounded by a line connecting (0.010, 0.770), (0.020, 0.760), (0.030, 0.760), (0.040, 0.750), (0.050, 0.750), (0.060, 0.750), (0.070, 0.740), (0.080, 0.740), (0.080, 0.340), (0.070, 0.545), (0.060, 0.590), (0.050, 0.620), (0.040, 0.645), (0.030, 0.670), (0.020, 0.705), (0.010, 0.760), and (0.010, 0.770) in this order, and
a range surrounded by a line connecting (0.010, 0.740), (0.020, 0.650), (0.030, 0.610), (0.040, 0.570), (0.050, 0.540), (0.060, 0.480), (0.070, 0.430), (0.070, 0.350), (0.060, 0.420), (0.050, 0.470), (0.040, 0.510), (0.030, 0.550), (0.020, 0.610), (0.010, 0.700), and (0.010, 0.740) in this order,
(4) at $0.015\lambda < H \leq 0.020\lambda$
a range surrounded by a line connecting (0.010, 0.770), (0.020, 0.770), (0.030, 0.760), (0.040, 0.760), (0.050, 0.760), (0.060, 0.750), (0.070, 0.750), (0.070, 0.510), (0.060, 0.570), (0.050, 0.620), (0.040, 0.640), (0.030, 0.660), (0.020, 0.675), (0.010, 0.700), and (0.010, 0.770) in this order, and
a range surrounded by a line connecting (0.010, 0.690), (0.020, 0.640), (0.030, 0.590), (0.040, 0.550), (0.050, 0.510), (0.060, 0.470), (0.070, 0.415), (0.070, 0.280), (0.060, 0.380), (0.050, 0.470), (0.040, 0.510), (0.030, 0.550), (0.020, 0.610), (0.010, 0.680), and (0.010, 0.690) in this order,
(5) at $0.020\lambda < H \leq 0.025\lambda$
a range surrounded by a line connecting (0.010, 0.770), (0.020, 0.770), (0.030, 0.760), (0.040, 0.760), (0.050, 0.760), (0.060, 0.760), (0.070, 0.760), (0.070, 0.550), (0.060, 0.545), (0.050, 0.590), (0.040, 0.620), (0.030, 0.645), (0.020, 0.680), (0.010, 0.700), and (0.010, 0.770) in this order, and
a range surrounded by a line connecting (0.010, 0.690), (0.020, 0.640), (0.030, 0.590), (0.040, 0.550), (0.050, 0.510), (0.060, 0.420), (0.070, 0.415), (0.070, 0.340), (0.060, 0.340), (0.050, 0.420), (0.040, 0.470), (0.030, 0.520), (0.020, 0.580), (0.010, 0.650), and (0.010, 0.690) in this order,
(6) at $0.025\lambda < H \leq 0.030\lambda$
a range surrounded by a line connecting (0.010, 0.770), (0.020, 0.770), (0.030, 0.770), (0.040, 0.760), (0.050, 0.760), (0.060, 0.760), (0.070, 0.760), (0.070, 0.550), (0.060, 0.505), (0.050, 0.590), (0.040, 0.620), (0.030, 0.645), (0.020, 0.680), (0.010, 0.700), and (0.010, 0.770) in this order, and
a range surrounded by a line connecting (0.010, 0.670), (0.020, 0.605), (0.030, 0.560), (0.040, 0.520), (0.050, 0.470), (0.060, 0.395), (0.070, 0.500), (0.070, 0.490), (0.060, 0.270), (0.050, 0.410), (0.040, 0.470), (0.030, 0.520), (0.020, 0.580), (0.010, 0.620), and (0.010, 0.670) in this order
(7) at $0.030\lambda < H \leq 0.035\lambda$
a range surrounded by a line connecting (0.010, 0.770), (0.020, 0.770), (0.030, 0.770), (0.040, 0.760), (0.050, 0.760), (0.060, 0.760), (0.070, 0.760), (0.070, 0.550), (0.060, 0.500), (0.050, 0.545), (0.040, 0.590), (0.030, 0.625), (0.020, 0.650), (0.010, 0.680), and (0.010, 0.770) in this order
a range surrounded by a line connecting (0.010, 0.655), (0.020, 0.590), (0.030, 0.540), (0.040, 0.495), (0.050, 0.435), (0.060, 0.395), (0.070, 0.500), (0.070, 0.550), (0.060, 0.380), (0.050, 0.330), (0.040, 0.410), (0.030, 0.470), (0.020, 0.520), (0.010, 0.590), and (0.010, 0.655) in this order.

With the configuration, it is possible to suppress an absolute value of the second-order temperature coefficient of the surface acoustic wave resonator to 0.01 ppm/°$C^2$ or less so as to correspond to the thickness of H.

Application Example 3

This application example of the invention is directed to the surface acoustic wave resonator according to the above application example of the invention, wherein the depth G of the inter-electrode finger groove and the effective line occupation rate $\eta eff$ satisfy the following relationships.

$-2.0000 \times G/\lambda + 0.7200 \leq \eta_{\mathit{eff}} \leq -2.5000 \times G/\lambda + 0.7775$ provided that $0.0100\lambda \leq G \leq 0.0500\lambda$.

$-3.5898 \times G/\lambda + 0.7995 \eta_{\mathit{eff}} \leq -2.5000 \times G/\lambda + 0.7775$ provided that $0.0500\lambda < G \leq 0.0695\lambda$.

With the configuration, it is possible to suppress an absolute value of the second-order temperature coefficient of the surface acoustic wave resonator to 0.01 ppm/° C.$^2$ or less.

Application Example 4

This application example of the invention is directed to the surface acoustic wave resonator according to Application Example 3, wherein the electrode film thickness H of the IDT satisfies the following relationship.

$0 < H \leq 0.035\lambda$

With the surface acoustic wave resonator having such a characteristic, it is possible to realize favorable frequency-temperature characteristics in the operating temperature range. In addition, with the characteristics, it is possible to suppress deterioration in environmental resistance characteristics due to the increase in the electrode film thickness.

Application Example 5

This application example of the invention is directed to the surface acoustic wave resonator according to Application Example 4, wherein the effective line occupation rate ηeff satisfies the following relationship.

$$\eta_{\mathit{eff}} = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \pm 0.04$$

By fixing ηeff to satisfy the above Equation in the electrode film thickness range in Application Example 4, it is possible to suppress an absolute value of the second-order temperature coefficient to 0.01 ppm/° C.$^2$ or less.

Application Example 6

This application example of the invention is directed to the surface acoustic wave resonator according to any one of Application Examples 2, 4 and 5, wherein the sum of the depth G of the inter-electrode finger groove and the electrode film thickness H satisfies the following relationship.

$0.0407\lambda \leq G + H$

By setting the sum of the depth G of the inter-electrode finger groove and the electrode film thickness H as in the above Expression, it is possible to obtain a higher Q value than that of the surface acoustic wave resonator in the related art.

Application Example 7

This application example of the invention is directed to the surface acoustic wave resonator according to any one of Application Examples 1 to 6, wherein Ψ and θ satisfy the following relationship.

$\psi = 1.191 \times 10^{-3} \times \theta^3 - 4.490 \times 10^{-1} \times \theta^2 + 5.646 \times 10^{1} \times \theta - 2.324 \times 10^{3} \pm 1.0$ By manufacturing a surface acoustic wave resonator using a quartz crystal substrate which is cut with the cut angle having the characteristics, it is possible to realize a surface acoustic wave resonator showing favorable frequency-temperature characteristics in a wide range.

Application Example 8

This application example of the invention is directed to the surface acoustic wave resonator according to any one of Application Example 1 to 7, wherein, if a stop band upper end frequency of the IDT is ft2, a stop band lower end mode frequency of reflectors provided so as to sandwich the IDT in the propagation direction of the surface acoustic wave is fr1, and a stop band upper end mode frequency of the reflectors is fr2, the following relationship is satisfied.

$fr1 < ft2 < fr2$

With the characteristics, the reflection coefficient |Γ| of the reflectors increases in the stop band upper end mode frequency ft2 of the IDT, and thus the stop band upper end mode surface acoustic wave excited from the IDT is reflected to the IDT side by the reflectors at a high reflection coefficient. Then, energy confinement of the stop band upper end mode surface acoustic wave becomes strong, and thereby it is possible to realize a low-loss surface acoustic wave resonator.

Application Example 9

This application example of the invention is directed to the surface acoustic wave resonator according to any one of Application Examples 1 to 8, an inter-conductor strip groove is provided between conductor strips forming the reflectors, wherein a depth of the inter-conductor strip groove is smaller than that of the inter-electrode finger groove.

With the characteristics, it is possible to shift the reflector stop band to a higher frequency than the IDT stop band. Therefore, it is possible to realize the relationship of the equation described in Application Example 8.

Application Example 10

This application example of the invention is directed to a surface acoustic wave oscillator including the surface acoustic wave resonator according to any one of Application Examples 1 to 9 and a circuit that drives the IDT.

Application Example 11

This application example of the invention is directed to an electronic apparatus including the surface acoustic wave resonator according to any one of Application Examples 1 to 9.

BRIEF DESCRIPTION OF THE DRAWINGS

The invention will be described with reference to the accompanying drawings, wherein like numbers reference like elements.

FIG. 1A is a plan view of the configuration, FIG. 1B is a partial enlarged sectional view of a side surface, FIG. 1C is a partial enlarged view for describing details of FIG. 1B, and FIG. 1D, being the partial enlarged view of FIG. 1C, shows a cross-sectional shape of a groove portion conceivable when manufacturing a SAW resonator using a photolithography technique and an etching technique.

FIG. 3A is an example of an appearance of tilting electrode fingers, making them perpendicular to an X" axis, and FIG. 3B is an example of the SAW device having an IDT in which bus bars connecting the electrode fingers are tilted.

FIG. 7A is a graph illustrating a displacement of a stop band upper end mode second-order temperature coefficient β when a groove depth G is 2%λ, FIG. 7B is a graph illustrating a displacement of a stop band lower end mode second-order temperature coefficient β when the groove depth G is 2%λ, FIG. 7C is a graph illustrating a displacement of the stop band upper end mode second-order temperature coefficient β when the groove depth G is 4%λ, and FIG. 7D is a graph illustrating a displacement of the stop band lower end mode second-order temperature coefficient β when the groove depth G is 4%λ.

FIGS. 8A to 8I are graphs illustrating a relationship between the line occupation rate η and a second-order temperature coefficient β when changing the inter-electrode finger groove depth, with an electrode film thickness as 0, where FIG. 8A is a graph when the groove depth G is 1%λ, FIG. 8B is a graph when the groove depth G is 1.25%λ, FIG. 8C is a graph when the groove depth G is 1.5%λ, FIG. 8D is a graph when the groove depth G is 2%λ, FIG. 8E is a graph when the groove depth G is 3%λ, FIG. 8F is a graph when the groove depth G is 4%λ, FIG. 8G is a graph when the groove depth G is 5%λ, FIG. 8H is a graph when the groove depth G is 6%λ, and FIG. 8I is a graph when the groove depth G is 8%λ.

FIGS. 10A to 10I are graphs illustrating a relationship between the line occupation rate η and a frequency fluctuation amount ΔF when changing the inter-electrode finger groove depth, with the electrode film thickness as 0, where FIG. 10A is a graph when the groove depth G is 1%λ, FIG. 10B is a graph when the groove depth G is 1.25%λ, FIG. 10C is a graph when the groove depth G is 1.5%λ, FIG. 10D is a graph when the groove depth G is 2%λ, FIG. 10E is a graph when the groove depth G is 3%λ, FIG. 10F is a graph when the groove depth G is 4%λ, FIG. 10G is a graph when the groove depth G is 5%λ, FIG. 10H is a graph when the groove depth G is 6%λ, and FIG. 10I is a graph when the groove depth G is 8%λ.

FIG. 12A is a graph when the electrode film thickness is 1%λ, FIG. 12B is a graph when the electrode film thickness is 1.5%λ, FIG. 12C is a graph when the electrode film thickness is 2%λ, FIG. 12D is a graph when the electrode film thickness is 2.5%λ, FIG. 12E is a graph when the electrode film thickness is 3%λ, and FIG. 12F is a graph when the electrode film thickness is 3.5%λ.

FIG. 13A shows a relationship between the groove depth G and η1 when changing the electrode film thickness from 1%λ, to 3.5%λ, and FIG. 13B is a diagram proving that an area in which |β|≤0.01 (ppm/° C.$^2$) is inside a polygon formed by linking points A to H.

FIG. 15A is a graph when the groove depth G is 0, FIG. 15B is a graph when the groove depth G is 1%λ, FIG. 15C is a graph when the groove depth G is 2%λ, FIG. 15D is a graph when the groove depth G is 3%λ, FIG. 15E is a graph when the groove depth G is 4%λ, and FIG. 15F is a graph when the groove depth G is 5%λ.

FIG. 16A is a graph when the groove depth G is 0, FIG. 16B is a graph when the groove depth G is 1%λ, FIG. 16C is a graph when the groove depth G is 1.5%λ, FIG. 16D is a graph when the groove depth G is 2.5%λ, FIG. 16E is a graph when the groove depth G is 3.5%λ, and FIG. 16F is a graph when the groove depth G is 4.5%λ.

FIG. 17A is a graph when the groove depth G is 0, FIG. 17B is a graph when the groove depth G is 1%λ, FIG. 17C is a graph when the groove depth G is 2%λ, FIG. 17D is a graph when the groove depth G is 3%λ, FIG. 17E is a graph when the groove depth G is 4%λ, and FIG. 17F is a graph when the groove depth G is 5%λ.

FIG. 18A is a graph when the groove depth G is 0, FIG. 18B is a graph when the groove depth G is 1%λ, FIG. 18C is a graph when the groove depth G is 1.5%λ, FIG. 18D is a graph when the groove depth G is 2.5%λ, FIG. 18E is a graph when the groove depth G is 3.5%λ, and FIG. 18F is a graph when the groove depth G is 4.5%λ.

FIG. 19A is a graph when the groove depth G is 0, FIG. 19B is a graph when the groove depth G is 1%λ, FIG. 19C is a graph when the groove depth G is 2%λ, FIG. 19D is a graph when the groove depth G is 3%λ, FIG. 19E is a graph when the groove depth G is 4%λ, and FIG. 19F is a graph when the groove depth G is 5%λ.

FIG. 20A is a graph when the groove depth G is 0, FIG. 20B is a graph when the groove depth G is 1%λ, FIG. 20C is a graph when the groove depth G is 2%λ, FIG. 20D is a graph when the groove depth G is 3%λ, FIG. 20E is a graph when the groove depth G is 4%λ, and FIG. 20F is a graph when the groove depth G is 5%λ.

FIG. 21A is a graph when the groove depth G is 0, FIG. 21B is a graph when the groove depth G is 1%λ, FIG. 21C is a graph when the groove depth G is 2%λ, FIG. 21D is a graph when the groove depth G is 3%λ, FIG. 21E is a graph when the groove depth G is 4%λ, and FIG. 21F is a graph when the groove depth G is 5%λ.

FIG. 22A is a graph when the groove depth G is 0, FIG. 22B is a graph when the groove depth G is 1%λ, FIG. 22C is a graph when the groove depth G is 1.5%λ, FIG. 22D is a graph when the groove depth G is 2.5%λ, FIG. 22E is a graph when the groove depth G is 3.5%λ, and FIG. 22F is a graph when the groove depth G is 4.5%λ.

FIG. 23A is a graph when the groove depth G is 0, FIG. 23B is a graph when the groove depth G is 1%λ, FIG. 23C is a graph when the groove depth G is 2%λ, FIG. 23D is a graph when the groove depth G is 3%λ, FIG. 23E is a graph when the groove depth G is 4%λ, and FIG. 23F is a graph when the groove depth G is 5%λ.

FIG. 24A is a graph when the groove depth G is 0, FIG. 24B is a graph when the groove depth G is 1%λ, FIG. 24C is a graph when the groove depth G is 1.5%λ, FIG. 24D is a graph when the groove depth G is 2.5%λ, FIG. 24E is a graph when the groove depth G is 3.5%λ, and FIG. 24F is a graph when the groove depth G is 4.5%λ.

FIG. 25A is a graph when the groove depth G is 0, FIG. 25B is a graph when the groove depth G is 1%λ, FIG. 25C is a graph when the groove depth G is 2%λ, FIG. 25D is a graph when the groove depth G is 3%λ, FIG. 25E is a graph when the groove depth G is 4%λ, and FIG. 25F is a graph when the groove depth G is 5%λ.

FIG. 26A is a graph when the groove depth G is 0, FIG. 26B is a graph when the groove depth G is 1%λ, FIG. 26C is a graph when the groove depth G is 2%λ, FIG. 26D is a graph when the groove depth G is 3%λ, FIG. 26E is a graph when the groove depth G is 4%λ, and FIG. 26F is a graph when the groove depth G is 5%λ.

FIG. 27A shows a case of η1, and FIG. 27B shows a case of η2.

FIG. 28A shows a case of η1, and FIG. 28B shows a case of η2.

FIG. 29A shows a case of η1, and FIG. 29B shows a case of η2.

FIG. 30A shows a case of η1, and FIG. 30B shows a case of η2.

FIG. 31A shows a case of η1, and FIG. 31B shows a case of η2.

FIG. 32A shows a case of η1, and FIG. 32B shows a case of η2.

FIG. 33A shows a case of η1, and FIG. 33B shows a case of η2.

FIG. 34A is a graph when the electrode film thickness is 1%λ, FIG. 34B is a graph when the electrode film thickness is 1.5%λ, FIG. 34C is a graph when the electrode film thickness is 2%λ, FIG. 34D is a graph when the electrode film thickness is 2.5%λ, FIG. 34E is a graph when the electrode film thickness is 3%λ, and FIG. 34F is a graph when the electrode film thickness is 3.5%λ.

FIG. 38A is a graph illustrating a maximum value and minimum value of Ψ, and FIG. 38B is a graph of an area of Ψ which satisfies the requirement of β.

FIG. 39A is a graph illustrating a maximum value and minimum value of Ψ, and FIG. 39B is a graph of an area of Ψ which satisfies the requirement of β.

FIG. 40A is a graph illustrating a maximum value and minimum value of Ψ, and FIG. 40B is a graph of an area of Ψ which satisfies the requirement of β.

FIG. 41A is a graph illustrating a maximum value and minimum value of Ψ, and FIG. 41B is a graph of an area of Ψ which satisfies the requirement of β.

FIG. 42A is a graph illustrating a maximum value and minimum value of Ψ, and FIG. 42B is a graph of an area of Ψ which satisfies the requirement of β.

FIG. 43A is a graph illustrating a maximum value and minimum value of Ψ, and FIG. 43B is a graph of an area of Ψ which satisfies the requirement of β.

FIG. 44A is a graph illustrating a maximum value and minimum value of and FIG. 44B is a graph of an area of Ψ which satisfies the requirement of β.

FIG. 56A is a graph illustrating the frequency-temperature characteristics of the SAW resonator disclosed in JP-A-2006-203408, and FIG. 56B is a graph illustrating a range of the frequency-temperature characteristics in a substantial operating temperature range.

FIG. 59A is a plan view of the configuration of the SAW resonator according to the second embodiment, FIG. 59B is a partial enlarged sectional view of a side surface, FIG. 59C is an enlarged view for describing details of FIG. 59B, and FIG. 59D, related to the partial enlarged view of FIG. 59C, shows a cross-sectional shape of a groove portion conceivable when manufacturing the SAW resonator according to the embodiment using a photolithography technique and an etching technique, which is a diagram illustrating a method of specifying an effective line occupation rate ηeff of an IDT electrode finger when the cross-sectional shape is not rectangular but trapezoidal.

DESCRIPTION OF EXEMPLARY EMBODIMENTS

Hereinafter, a surface acoustic wave resonator and surface acoustic wave oscillator according to embodiments of the invention will be described in detail with reference to the drawings. However, constituent elements, and kinds, combinations, shapes, relative dispositions thereof, and the like are not intended to limit the scope of the invention unless particularly described but are only description examples.

Figure 1A:
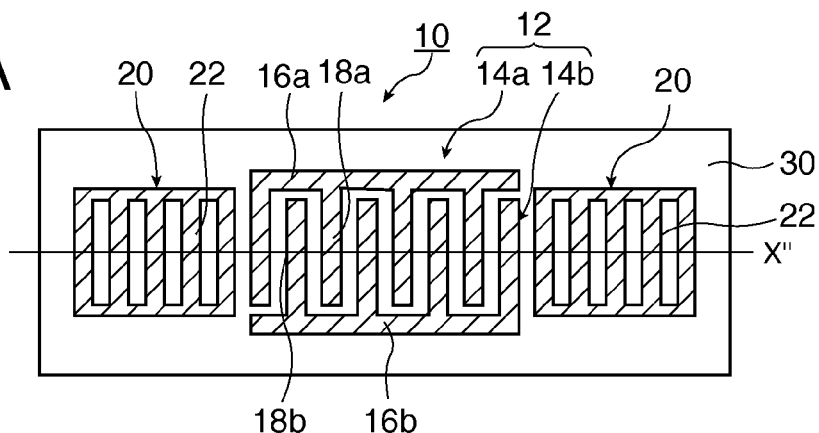
FIGS. 1A to 1D are diagrams illustrating a configuration of a SAW device according to a first embodiment, where
Figure 1B:
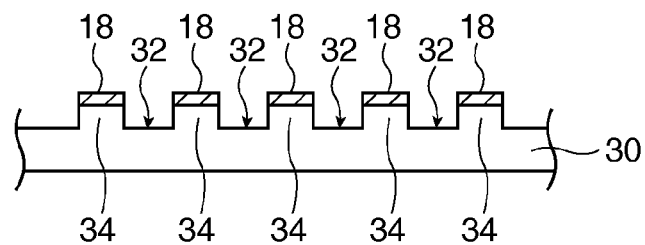
Figure 1C:
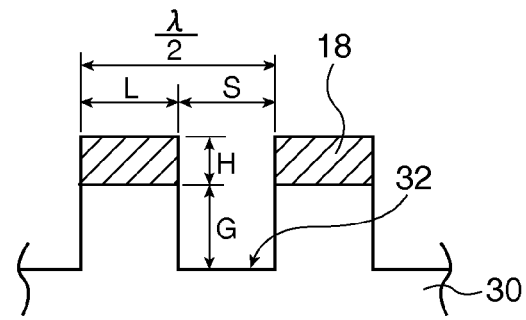
Figure 1D:
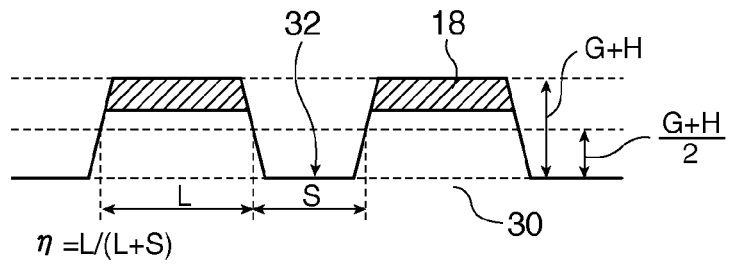

First, a surface acoustic wave (SAW) resonator according to a first embodiment of the invention will be described referring to FIGS. 1A to 1D. In FIGS. 1A to 1D, FIG. 1A is a plan view of the SAW resonator, FIG. 1B is a partial enlarged sectional view, FIG. 1C is an enlarged view for describing details of FIG. 1B, and FIG. 1D is a diagram which, related to the partial enlarged view of FIG. 1C, is for describing an IDT electrode finger line occupation rate η identification method in a case where the cross-sectional shape is not rectangular but trapezoidal, which is a conceivable sectional shape when the SAW resonator according to the embodiment of the invention is manufactured using a photolithography technique and an etching technique. It is appropriate that the line occupation rate η is a proportion occupied by a width L of a value (L+S), wherein a protrusion width L and a width S of a groove 32 are added, at a height from the bottom of the groove 32 which is ½ of (G+H), which is a value where a depth (bump height) G of the groove 32 and an electrode film thickness H are added.

The SAW resonator 10 according to the embodiment is basically constituted by a quartz crystal substrate 30, an IDT 12, and reflectors 20.

Figure 2:
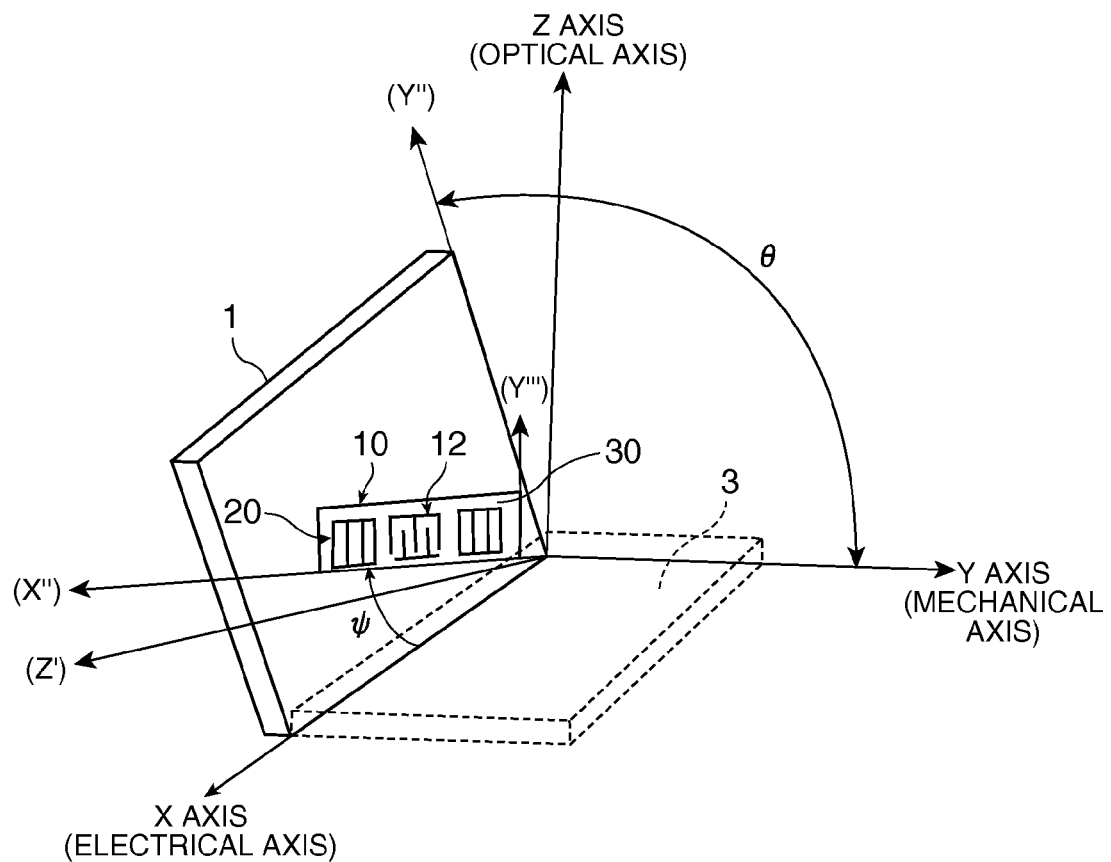
FIG. 2 is a diagram illustrating an example of the orientation of a wafer which is a base material of a quartz crystal substrate used in the invention.

FIG. 2 is a diagram illustrating an orientation of a wafer 1, which is a base material of the quartz crystal substrate 30 used in the invention. In FIG. 2, an X axis is an electrical axis of the quartz crystal, a Y axis is a mechanical axis of the quartz crystal, and a Z axis is an optical axis of the quartz crystal. The wafer 1 has a cut surface with a Z' axis as a normal, and has an X'' axis and a Y''' axis perpendicular to the X'' axis in the cut surface, as described later. Furthermore, the IDT 12 and reflectors 20 configuring the SAW resonator 10 are disposed along an X'' axis in consideration of the propagation direction of the SAW, as described later. The quartz crystal substrate 30 configuring the SAW resonator 10 is diced by being cut out of the wafer 1. Although the shape in a plan view of the quartz crystal substrate 30 is not particularly limited, it may be a rectangle which has long sides parallel to a X'' axis and has short sides parallel to the Y''' axis.

In the embodiment, an in-plane rotation ST cut quartz crystal substrate expressed by Euler angles ($-1.5° \leq \phi \leq 1.5°$, $117° \leq \theta \leq 142°$, and $42.79° \leq |\Psi| \leq 49.57°$) is employed as the quartz crystal substrate 30. Here, a description will be made of the Euler angles with reference to FIG. 2. A substrate expressed by Euler angles (0°, 0°, and 0°) is a Z cut substrate 3 which has a main surface perpendicular to the Z axis.

Here, φ of Euler angles (φ, θ, and Ψ), relating to a first rotation of the Z cut substrate 3, is a first rotation angle, with the Z axis as a rotation axis, and with a direction rotating from the +X axis to a +Y axis side as a positive rotation angle. The X axis and Y axis after a first rotation are respectively an X' axis and a Y' axis. In addition, in FIG. 2, as the description of the Euler angles, φ of the Euler angles is indicated by 0°. Therefore, in FIG. 2, the X axis overlaps the X' axis, and the Y axis overlaps the Y' axis.

The Euler angle θ, relating to a second rotation carried out after the first rotation of the Z cut substrate 3, is a second rotation angle, with the X axis (that is, the X' axis) after the first rotation as a rotation axis, and with a direction rotating from the +Y axis (that is, +Y' axis) after the first rotation to the +Z axis as a positive rotation angle. The cut surface of a piezoelectric substrate, that is, the cut surface of the above-described wafer 1 is determined by the first rotation angle φ and the second rotation angle θ. That is to say, when the Y axis after the second rotation is a Y'' axis and the Z axis after the second rotation is a Z' axis, a surface parallel to both the X' axis and the Y'' axis is the cut surface of the piezoelectric substrate, and the Z' axis is a normal of the cut surface.

The Euler angle Ψ, relating to a third rotation carried out after the second rotation of the Z cut substrate 3, is a third rotation angle, with the Z' axis which is the Z axis after the second rotation as a rotation axis, and with a direction rotating from the +X axis (that is, +X' axis) after the second rotation to the +Y axis (that is, +Y'' axis) side after the second rotation as a positive rotation angle. A propagation direction of the SAW is expressed by the third rotation angle Ψ with respect to the X axis (that is, the X' axis) after the second rotation. That is to say, when the X axis after the third rotation is an X'' axis and the Y axis after the third rotation is a Y''' axis, a surface parallel to both the X'' axis and the Y''' axis is the cut surface of the piezoelectric substrate, and the Z' axis is a normal of the cut surface. As such, since the normal does not vary even if the third rotation is performed, the cut surface of the piezoelectric substrate is also the cut surface of the wafer 1. In addition, a direction parallel to the X'' axis is a propagation direction of the SAW.

Further, a SAW phase velocity direction is a direction parallel to the X'' axis direction. A phenomenon called a SAW power flow is a phenomenon in which a direction where a phase of the SAW progresses (phase velocity direction) and a direction where energy of the SAW progresses (group velocity direction) are deviated from each other. An angle formed by the phase velocity direction and the group velocity direction is called a power flow angle (refer to FIGS. 3A and 3B).

The IDT 12 including a pair of pectinate electrodes 14a and 14b where the base end portions of a plurality of electrode fingers 18a and 18b are connected by bus bars 16a and 16b respectively, and the electrode fingers 18a configuring one of the pectinate electrodes 14a, and the electrode fingers 18b configuring the other pectinate electrode 14b, are alternately disposed with a predetermined space between them. Furthermore, the electrode fingers 18a and 18b are disposed in such a way that the extension direction of the electrode fingers 18a and 18b is perpendicular to the X'' axis, which is the propagation direction of the surface acoustic wave, as shown in FIG. 1A. A SAW excited by the SAW resonator 10 configured in this way, being a Rayleigh type SAW, has oscillatory displacement elements on both the X'' axis and Z' axis. Then, by displacing the SAW propagation direction from the X axis, which is the crystal axis of the quartz crystal, in this way, it is possible to excite a stop band upper end mode SAW.

Figure 3A:
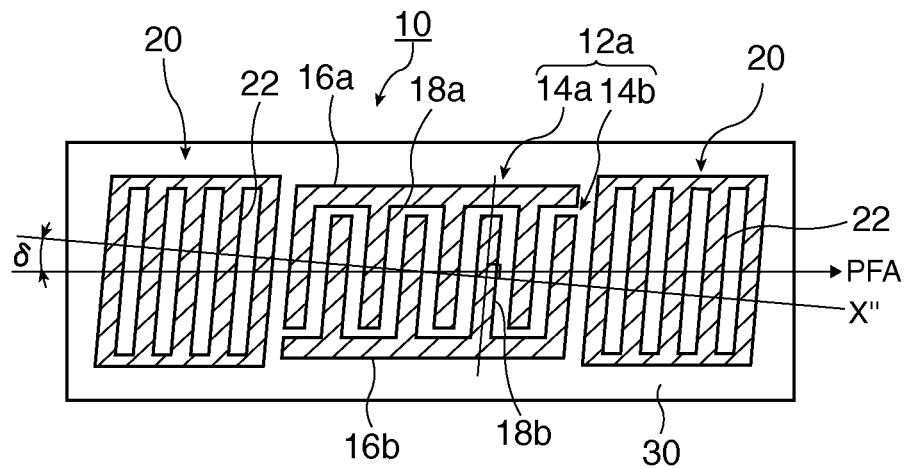
FIGS. 3A and 3B are diagrams illustrating configuration examples of the SAW device when employing a tilted type IDT as a modified example of the first embodiment, where
Figure 3B:
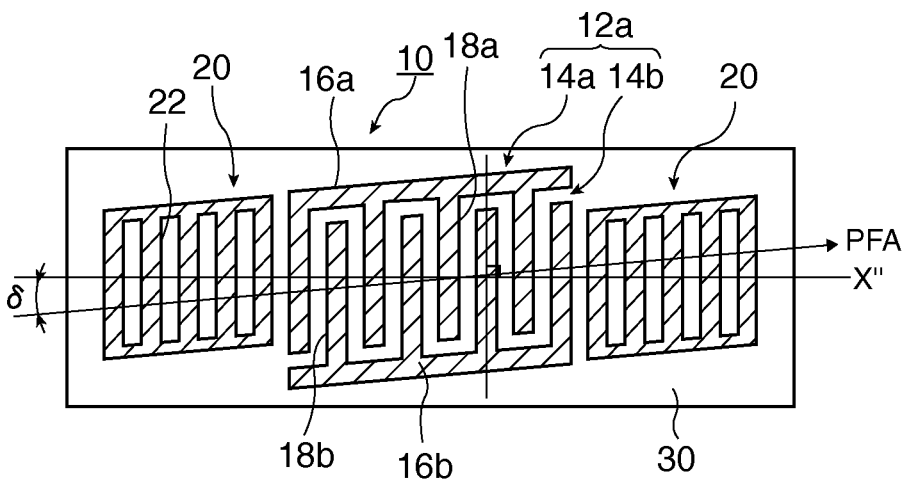

In addition, furthermore, it is possible to give the SAW resonator 10 according to a modified example of the first embodiment the kinds of shape shown in FIGS. 3A and 3B. That is to say, even in a case of applying an IDT which is tilted by a power flow angle (hereinafter, referred to as a PFA) δ from the X'' axis, as shown in FIGS. 3A and 3B, it is possible to achieve a high Q by fulfilling the following requirements. FIG. 3A is a plan view illustrating an embodiment of a tilted type IDT 12a, the disposition conformation of the electrode fingers 18a and 18b in the tilted type IDT 12a is tilted such that the X'' axis, which is the SAW propagation direction determined by the Euler angles, and the extension direction of the electrode fingers 18a and 18b of the tilted type IDT 12a are in a perpendicular relationship.

FIG. 3B is a plan view illustrating another embodiment of the tilted type IDT 12a. In the example, the electrode finger array direction is disposed tilted with respect to the X'' axis by tilting the bus bars 16a and 16b connecting the electrode fingers 18a and 18b respectively, but is configured such that the X'' axis and the extension direction of the electrode fingers 18a and 18b are in a perpendicular relationship, in the same way as in FIG. 3A.

Whichever kind of tilted type IDT is used, by disposing the electrode fingers in such a way that a direction perpendicular to the X″ axis is the extension direction of the electrode fingers, as in the embodiments, it is possible to realize a low-loss SAW resonator, while maintaining good temperature characteristics in the invention.

Figure 4:
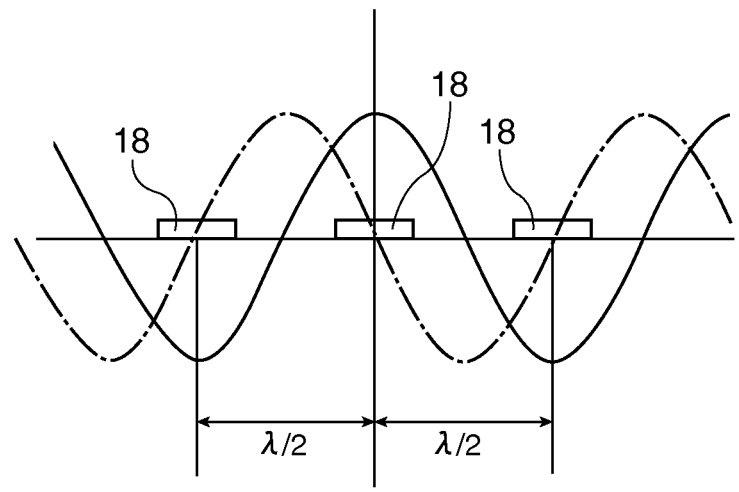
FIG. 4 is a diagram illustrating a relationship between a stop band upper end mode and lower end mode.

Here, a description will be made of the relationship between a stop band upper end mode SAW and a lower end mode SAW. FIG. 4 is a diagram illustrating the distribution of the stop band upper end mode and lower end mode standing waves in the normal IDT 12. In the stop band lower end mode and upper end mode SAWs formed by the kind of normal IDT 12 shown in FIG. 4 (what are shown in FIG. 4 are the electrode fingers 18 configuring the IDT 12), the positions of the anti-nodes (or nodes) of each standing wave are separated from each other by $\pi/2$ (that is, $\lambda/4$).

According to FIG. 4, as described above, the anti-nodes of the stop band lower end mode standing wave shown by the solid line exist in the central position of the electrode fingers 18, that is, in the reflection center position, and the nodes of the stop band upper end mode standing wave shown by the dashed-dotted line exist in the reflection center position. In this kind of mode in which the nodes exist in the central positions between the electrode fingers, it is not possible to efficiently convert the oscillation of the SAW to a charge with the electrode fingers 18 (18a and 18b), and it is often the case that it is not possible to excite or receive the mode as an electrical signal. However, with the method described in the application, by making the Euler angle Ψ other than zero, and displacing the SAW propagation direction from the X axis, which is the crystal axis of the quartz crystal, it is possible to shift the standing wave of the stop band upper end mode to the position of the solid line in FIG. 4, that is, to shift the standing wave anti-nodes of the mode to the central position of the electrode fingers 18, and it is possible to excite the SAW of the stop band upper end mode.

In addition, one pair of the reflectors 20 is provided so as to sandwich the IDT 12 in the SAW propagation direction. As a specific configuration example, both ends of each of a plurality of conductor strips 22, provided parallel to the electrode fingers 18 configuring the IDT 12, are connected.

Here, in another embodiment, only one set of ends of a plurality of conductor strips 22 may be connected to each other. Further, in still another embodiment, parts (for example, centers in the extension direction of a plurality of conductor strips 22) other than both ends of a plurality of conductor strips 22 may be connected to each other.

With an edge reflection type SAW resonator which actively utilizes a reflected wave from the SAW propagation direction end face of the quartz crystal substrate, or a multi-pair IDT type SAW resonator which excites the SAW standing wave with the IDT itself by increasing the number of pairs of IDT electrode fingers, the reflectors are not absolutely necessary.

As the material of the electrode film configuring the IDT 12 and reflectors 20 configured in this way, it is possible to use aluminum (Al), or a metal alloy with Al as its base.

By making the electrode thickness of the electrode film configuring the IDT 12 and reflectors 20 extremely small, the effect of the temperature characteristics possessed by the electrodes is kept to a minimum. Furthermore, by making the depth of the quartz crystal substrate portion grooves large, good frequency-temperature characteristics are derived from the performance of the quartz crystal substrate portion grooves, that is, by utilizing the good temperature characteristics of the quartz crystal. Because of this, it is possible to reduce the effect of the electrode temperature characteristics on the temperature characteristics of the SAW resonator and, provided that the fluctuation of the electrode mass is within 10%, it is possible to maintain good temperature characteristics.

For the above-mentioned reasons, in a case of using an alloy as the electrode film material, the proportion by weight of metals other than the main element Al should be 10% or less, and preferably 3% or less. With this, a case of using pure Al and a case of using an Al alloy can obtain good temperature characteristics or other electrical characteristics equivalent to each other.

In a case of using electrodes with a metal other than Al as a base, the electrode film thickness may be adjusted so that the mass of the electrodes is within ±10% of that when using Al. In this way, good temperature characteristics equivalent to those when using Al can be obtained.

The quartz crystal substrate 30 in the SAW resonator 10 with the above-described basic configuration is provided with the grooves (inter-electrode finger grooves) 32 between the electrode fingers of the IDT 12 and between the conductor strips of the reflectors 20.

When the SAW wavelength in the stop band upper end mode is $\lambda$, and the groove depth is G, the groves 32 provided in the quartz crystal substrate 30 may be such that $$0.01\lambda \leq G \quad (1).$$

Figure 5:
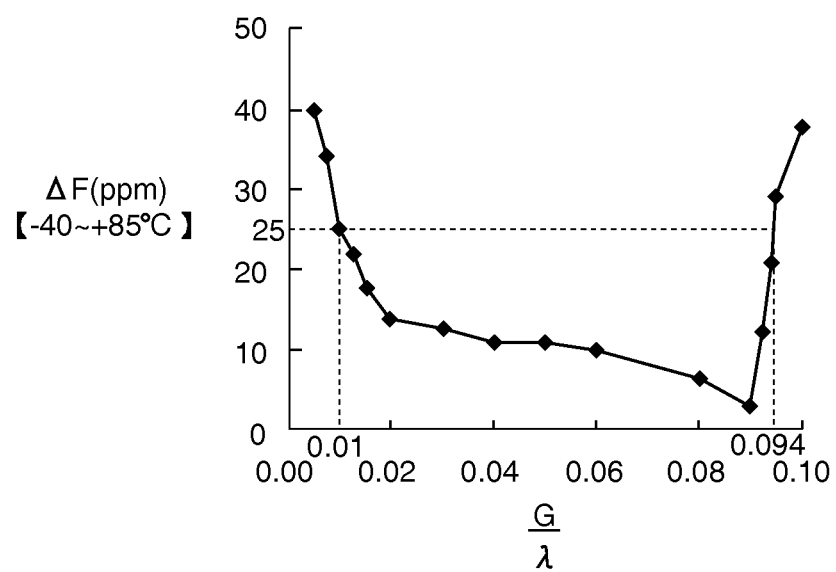
FIG. 5 is a graph illustrating a relationship between the depth of an inter-electrode finger groove and a frequency fluctuation amount in an operating temperature range.

When fixing an upper limit for the groove depth G, as can be seen from FIG. 5, it may be within the range of $$0.01\lambda \leq G \leq 0.094\lambda \quad (2).$$

This is because, by fixing the groove depth G within this range, it is possible to keep the frequency fluctuation amount within the operating temperature range ($-40°$ C. to $+85°$ C.) at or below the target value of 25 ppm, to be described in detail later. In addition, it is preferable that the groove depth G be within the range of $$0.01\lambda \leq G \leq 0.0695\lambda \quad (3).$$

By fixing the groove depth G within this kind of range, even in a case where manufacturing variation occurs in the groove depth G, it is possible to keep the shift amount of resonance frequency between individual SAW resonators 10 within a correctable range.

In addition, the line occupation rate η is a value where the line width L of the electrode finger 18 (in a case of the quartz crystal protrusion only, the width of the protrusion) is divided by the pitch $\lambda/2$ (=L+S) between the electrode fingers 18, as shown in FIGS. 1C and 1D. Consequently, the line occupation rate η can be expressed by Equation (4).

$$\eta = L/(L+S) \quad (4)$$

Here, in relation to the SAW resonator 10 according to the embodiment, the line occupation rate η may be fixed within a range which satisfies Expressions (5) and (6). As can also be seen from Expressions (5) and (6), η can be derived by fixing the depth G of the grooves 32.

$$-2.0000 \times G/\lambda + 0.7200 \leq \eta \leq -2.5000 \times G/\lambda + 0.7775 \text{ provided that } 0.0100\lambda \leq G \leq 0.0500\lambda \quad (5)$$

$$-3.5898 \times G/\lambda + 0.7995 \leq \eta \leq -2.5000 \times G/\lambda + 0.7775 \text{ provided that } 0.0500\lambda < G \leq 0.0695\lambda \quad (6)$$

In addition, it is preferable that the film thickness of the electrode film material (IDT 12, reflectors 20, and the like) in the SAW resonator 10 according to the embodiment be within the range of $$0H \leq 0.035\lambda \quad (7).$$

Furthermore, when taking into consideration the thickness of the electrode film shown in Equation (7) with regard to the line occupation rate η, η can be obtained from Equation (8).

$$\eta = -1963.05 \times (G/\lambda)^3 + 196.28 \times (G/\lambda)^2 - 6.53 \times (G/\lambda) - \\ 135.99 \times (H/\lambda)^2 + 5.817 \times (H/\lambda) + 0.732 - 99.99 \times (G/\lambda) \times (H/\lambda) \quad (8)$$

With the manufacturing variation of the electrical characteristics (particularly the resonance frequency) being greater the greater the electrode film thickness, there is a high probability that the manufacturing variation of the line occupation rate η may be within ±0.04 or less when the electrode film thickness H is within the range of Expressions (5) and (6), and that a manufacturing variation greater than ±0.04 will occur when H>0.035λ. However, provided that the electrode film thickness H is within the range of Equations (5) and (6), and the variation of the line occupation rate η is within ±0.04 or less, it is possible to realize a SAW device with a low absolute value of second-order temperature coefficient β. That is, a line occupation rate η up to the range of Equation (9), where a tolerance of ±0.04 is added to Equation (8), is allowable.

$$\eta = -1963.05 \times (G/\lambda)^3 + 196.28 \times (G/\lambda)^2 - \\ 6.53 \times (G/\lambda) - 135.99 \times (H/\lambda)^2 + 5.817 \times (H/\lambda) + \\ 0.732 - 99.99 \times (G/\lambda) \times (H/\lambda) \pm 0.04 \quad (9)$$

In the SAW resonator 10 according to the embodiment with the above-described kind of configuration, in a case where the second-order temperature coefficient β is within ±0.01 (ppm/° C.$^2$), and the SAW operating temperature range is preferably −40° C. to +85° C., the object is to improve the frequency-temperature characteristics to a degree whereby it is possible to keep a frequency fluctuation amount ΔF in the operating temperature range at or under 25 ppm.

Generally, however, the temperature characteristics of a surface acoustic wave resonator are expressed by the following equation.

$$\Delta f = \alpha \times (T - T_0) + \beta \times (T - T_0)^2$$

Here, Δf represents the frequency change amount (ppm) between the temperature T and the peak temperature $T_0$, α represents the first-order temperature coefficient (ppm/° C.), β represents the second-order temperature coefficient (ppm/° C.$^2$) T represents the temperature, and $T_0$ represents the temperature at which the frequency is highest (the peak temperature).

Figure 6:
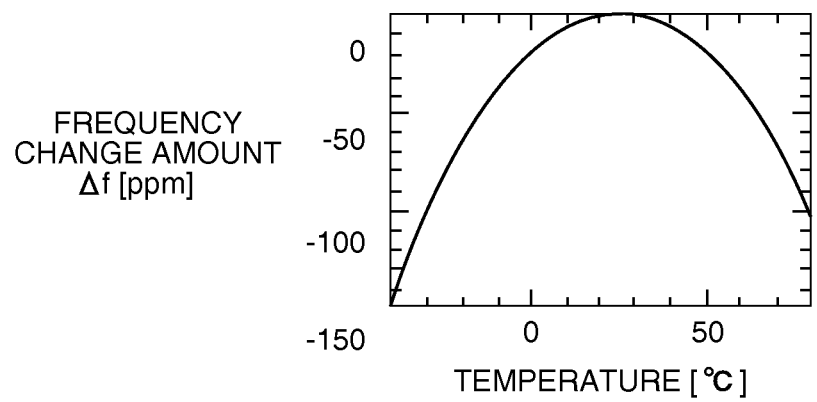
FIG. 6 is a diagram illustrating temperature characteristics in an ST cut quartz crystal substrate.

For example, a case where the piezoelectric substrate is formed of a so-called ST cut (Euler angles (φ, θ, and Ψ)=(0°, 120° to 130°, and 0°) quartz crystal substrate, the first-order temperature coefficient α=0.0 (ppm/° C.), and the second-order temperature coefficient β=−0.034 (ppm/° C.$^2$), is expressed in a graph is as in FIG. 6. In FIG. 6, the temperature characteristics describe an upwardly convex parabola (quadratic curve).

In the SAW resonator shown in FIG. 6, the frequency fluctuation amount with respect to the temperature change is extremely large, and it is necessary to suppress the frequency change amount Δf with respect to the temperature change. Consequently, it is necessary to realize a surface acoustic wave resonator based on new findings, so that the second-order temperature coefficient β shown in FIG. 6 is brought closer to 0, and the frequency change amount Δf with respect to the temperature (operating temperature) change when the SAW resonator is actually used comes closer to 0.

Consequently, an advantage of some aspects of the invention is to solve the above-described kind of problem, making the frequency-temperature characteristics of the surface acoustic wave device extremely good ones, and realizing a surface acoustic wave device which operates with a stable frequency, even though the temperature changes.

How a solution to the above-described kind of problem may be realized with a SAW device to be configured including the above-described kind of technical spirit (technical components), that is, how the inventor arrived at the findings according to the invention by repeatedly carrying out simulations and experiments, will be described in detail and proved hereinafter.

In a SAW resonator using the above-described quartz crystal substrate called an ST cut, with the propagation direction as the crystal X axis direction, in a case where the operating temperature range is the same, the frequency fluctuation amount ΔF in the operating temperature range is approximately 133 (ppm), and the second-order temperature coefficient β is about −0.034 (ppm/° C.$^2$). In addition, in a case of utilizing a stop band lower end mode excitation in a SAW resonator using an in-plane rotation ST cut quartz crystal substrate with the same operating temperature range, with the quartz crystal substrate cut angles and SAW propagation direction as (0, 123°, and 45°) in Euler angle representation, the frequency fluctuation amount ΔF is approximately 63 ppm, and the second-order temperature coefficient β is about −0.016 (ppm/° C.$^2$).

The SAW resonators using the ST cut quartz crystal substrate and in-plane rotation ST cut quartz crystal substrate both utilizing surface acoustic waves called Rayleigh waves, have extremely small variation of frequency and frequency-temperature characteristics with respect to the machining accuracy of the quartz crystal substrate and electrodes in comparison with the surface acoustic wave, called a leaky wave, of an LST cut quartz crystal substrate, meaning that they are most suitable for mass production, and are used in various kinds of SAW device. However, with the SAW resonators using the ST cut quartz crystal substrate, in-plane rotation ST cut quartz crystal substrate, or the like utilized to date, as described above, the second-order temperature characteristics being such that the curve indicating the frequency-temperature characteristics is a quadratic curve, and furthermore, the absolute value of the second-order temperature coefficient of the second-order temperature characteristics being large, the frequency fluctuation amount in the operating temperature range is large, and they may not be utilized in a SAW device such as a resonator or oscillator used in a wired communication device or wireless communication device which requires a stability of frequency. For example, in a case where it is possible to obtain frequency-temperature characteristics which have second-order temperature characteristics where the second-order temperature coefficient β is ±0.01 (ppm/° C.$^2$) or less, corresponding to an improvement in the ST cut quartz crystal substrate second-order temperature coefficient β of ⅓ or less, and in the in-plane rotation ST cut quartz crystal substrate second-order temperature coefficient β of 37% or more, it is possible to realize a device which requires that kind of frequency stability. Furthermore, in a case where it is possible to obtain third-order temperature characteristics, where the second-order temperature coefficient β is substantially zero, and the curve indicating the frequency-temperature characteristics is a cubic curve, it is more preferable, as the frequency stability in the operating temperature range further increases. In third-order temperature characteristics such as these, it is possible to obtain an extremely high frequency stability of ±25 ppm or less, which has not been realizable with the SAW device in the related art, even in the wide operating temperature range of −40° C. to +85° C.

The fact that the electrode finger 18 line occupation rate η in the IDT 12, electrode film thickness H, groove depth G, and the like, are related to the change in the frequency-temperature characteristics of the SAW resonator 10, as described above, has been made clear by the findings based on the simulations and experiments carried out by the inventor. Then, the SAW resonator 10 according to the embodiment utilizes the excitation of the stop band upper end mode.

Figure 7A:
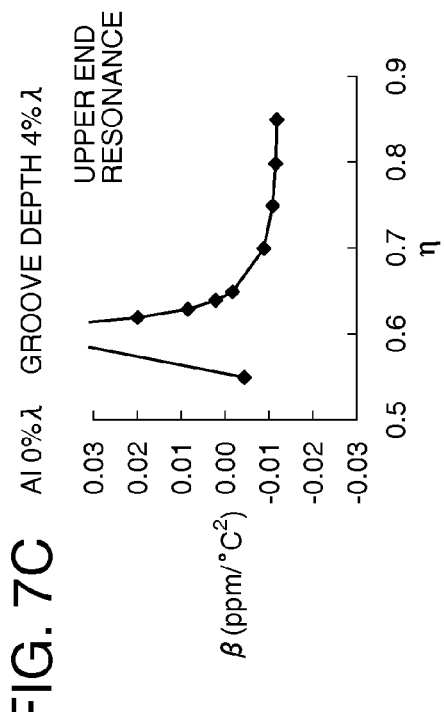
FIGS. 7A to 7D are graphs illustrating differences in a change in a second-order temperature coefficient accompanying a change in a line occupation rate η at a stop band upper end mode resonance point and a stop band lower end mode resonance point, where
Figure 7C:
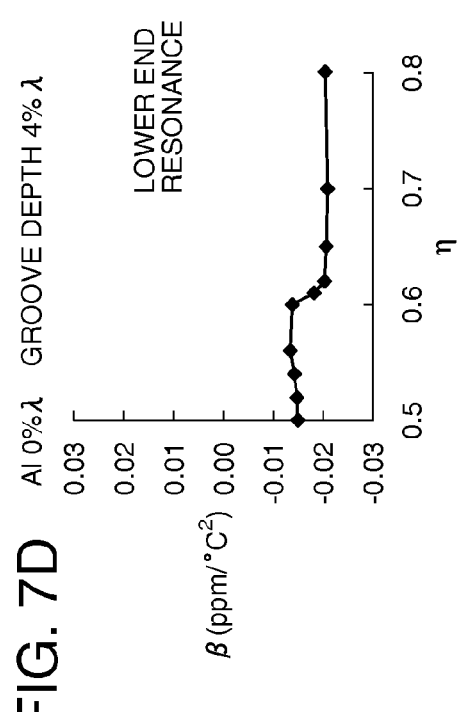
Figure 7B:
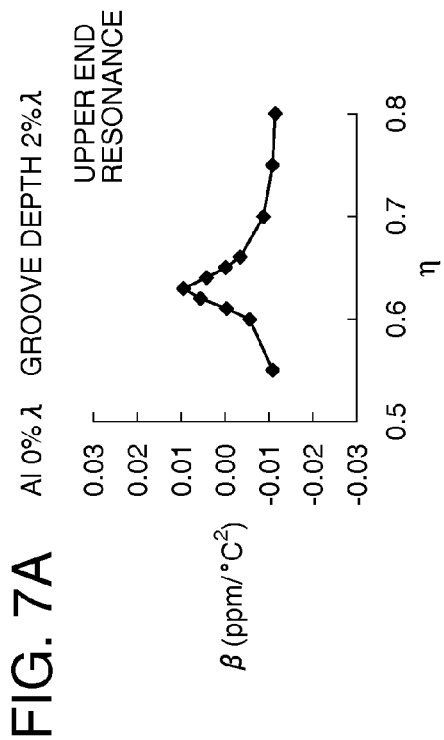
Figure 7D:
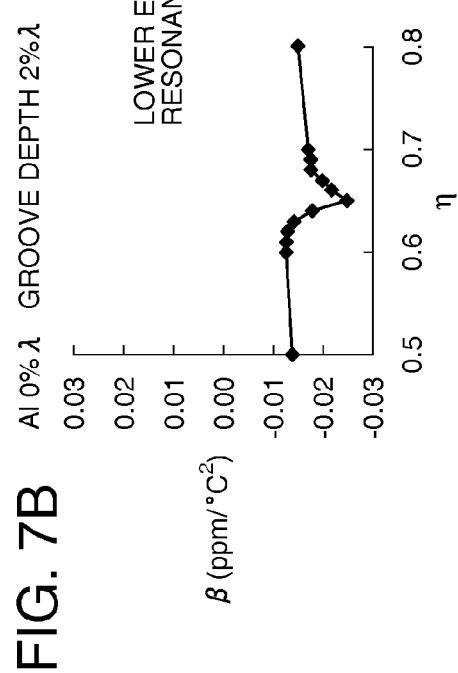

FIGS. 7A to 7D are graphs illustrating the change in the second-order temperature coefficient β with respect to the change in the line occupation rate η in a case of exciting and propagating a SAW on the surface of the quartz crystal substrate 30, with the electrode film thickness H in FIG. 1C as zero (H=0%λ), that is, in a condition in which the grooves 32 configured of uneven quartz crystal are formed in the surface of the quartz crystal substrate 30. In FIGS. 7A to 7D, FIG. 7A shows the second-order temperature coefficient β for the stop band upper end mode resonance when the groove depth G is 0.02λ, and FIG. 7B shows the second-order temperature coefficient β for the stop band lower end mode resonance when the groove depth G is 0.02λ. In addition, of FIGS. 7A to 7D, FIG. 7C shows the second-order temperature coefficient β for the stop band upper end mode resonance when the groove depth G is 0.04λ, and FIG. 7D shows the second-order temperature coefficient β for the stop band lower end mode resonance when the groove depth G is 0.04λ. The simulations shown in FIGS. 7A to 7D show examples of cases in which a SAW is propagated in some way in a quartz crystal substrate 30 on which no electrode film is provided, in order to reduce factors causing the frequency-temperature characteristics to fluctuate. In addition, Euler angles (0°, 123°, and Ψ) are used for the cut angles of the quartz crystal substrate 30. With regard to Ψ, a value which is the minimum absolute value of the second-order temperature coefficient β is selected as appropriate.

From FIGS. 7A to 7D, it can be seen that, both in the case of the stop band upper end mode and in the case of the lower end mode, the second-order temperature coefficient β changes considerably in the area in which the line occupation rate η is 0.6 to 0.7. Then, when comparing the change in the second-order temperature coefficient β in the stop band upper end mode and the change in the second-order temperature coefficient β in the stop band lower end mode, the following points can be seen. That is, the change in the second-order temperature coefficient β in the stop band lower end mode is such that the characteristics deteriorate due to the second-order temperature coefficient β changing from the minus side to farther on the minus side (the absolute value of the second-order temperature coefficient β increases). As opposed to this, the change in the second-order temperature coefficient β in the stop band upper end mode is such that the characteristics improve due to the second-order temperature coefficient β changing from the minus side to the plus side (a point exists at which the absolute value of the second-order temperature coefficient β decreases).

From this, it is clear that in order to obtain good frequency-temperature characteristics in a SAW device, it is preferable to use the oscillation of the stop band upper end mode.

Next, the inventor investigated the relationship between the line occupation rate η and second-order temperature coefficient β when propagating a stop band upper end mode SAW in quartz crystal substrates with variously changed groove depths G.

FIGS. 8A to 8I are graphs illustrating evaluation results when simulating the relationship between the line occupation rate η and second-order temperature coefficient β when changing the groove depth G from 0.01λ (1%λ) to 0.08λ (8%λ), with the electrode film thickness H as zero (H=0%λ), as in FIGS. 7A to 7D. From the evaluation results, it can be seen that a point at which β=0, that is, a point at which the approximate curve indicating the frequency-temperature characteristics describes a cubic curve, begins to appear from around the point at which the groove depth G is made to be 0.0125λ (1.250λ), as shown in FIG. 8B. Then, it is also clear from FIGS. 8A to 8I that η at which β=0 exists in two places (a point (η1) at which β=0 where η is larger, and a point (η2) at which β=0 where η is smaller). Furthermore, it can also be seen from the evaluation results shown in FIGS. 8A to 8I that the fluctuation amount of the line occupation rate η with respect to the change in the groove depth G is greater at η2 than at η1.

Figure 9:
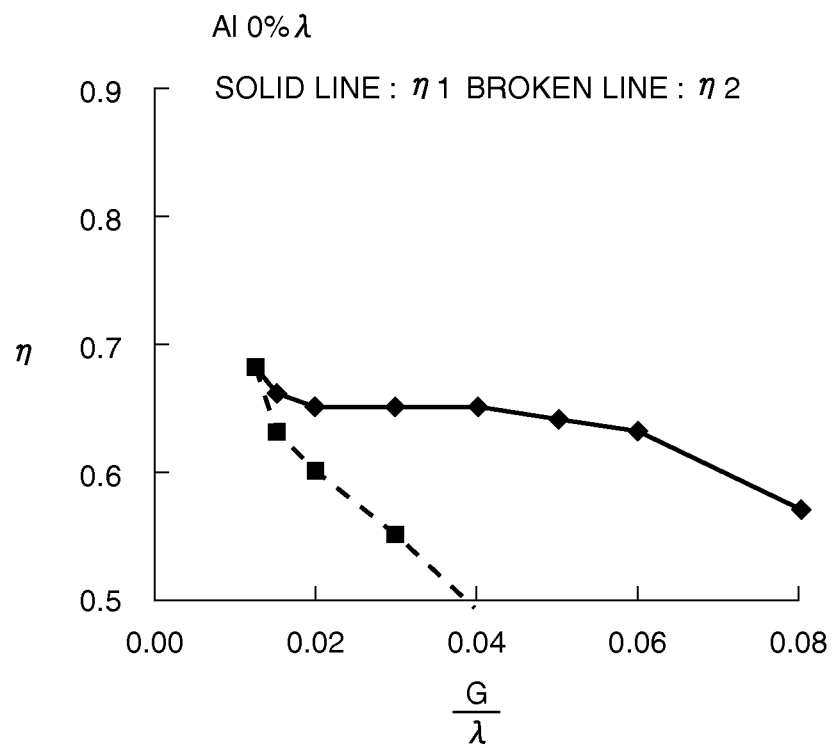
FIG. 9 is a graph illustrating a relationship between an inter-electrode finger groove depth at which the second-order temperature coefficient becomes 0 and the line occupation rate η, when the electrode film thickness is 0.

Regarding this, it is possible to increase an understanding thereof by referring to FIG. 9. FIG. 9 is a graph plotting η1 and η2, at which the second-order temperature coefficient β becomes 0, in a case of changing the groove depth G. From FIG. 9, it can be seen that η1 and η2 both become smaller as the groove depth G increases, but the fluctuation amount of η2 is so great that, on a graph in which the scale of the vertical axis η is shown in a range of 0.5λ to 0.9λ, it goes off the scale around the point at which the groove depth G=0.04λ. That is to say, it can be said that the fluctuation amount of η2 with respect to the change in the groove depth G is large.

FIG. 10A to FIG. 10I are graphs with the electrode film thickness H as zero (H=0%λ), as in FIGS. 7A to 8I, and with the vertical axis of FIGS. 8A to 8I shown as the frequency fluctuation amount ΔF instead of the second-order temperature coefficient β. From FIGS. 10A to 10I, it can of course be seen that the frequency fluctuation amount ΔF decreases at the two points (η1 and η2) at which β=0. Furthermore, it can be seen from FIGS. 10A to 10I that of the two points at which β=0, the frequency fluctuation amount ΔF is kept smaller at the point corresponding to η1 in every graph in which the groove depth G is changed.

According to the above-described tendency, it can be supposed that it is preferable to employ the β=0 point at which the frequency fluctuation amount with respect to the fluctuation in the groove depth G is smaller, that is, η1, for a mass production article in which discrepancies are liable to occur when manufacturing. FIG. 5 shows a graph of the relationship between the frequency fluctuation amount ΔF at the point (η1) at which the second-order temperature coefficient β is smallest and the groove depth G, for each groove depth G. According to FIG. 5, with the lower limit value of the groove depth G for which the frequency fluctuation amount ΔF is the target value of 25 ppm or less being the groove depth G of 0.01λ, the range of the groove depth G is that or greater, that is, 0.01≤G.

In FIG. 5, examples are also added of cases in which, by simulation, the groove depth G is 0.08 or more. According to the simulation, the frequency fluctuation amount ΔF is 25 ppm or less when the groove depth G is 0.01λ or more, and subsequently, the frequency fluctuation amount ΔF decreases every time the groove depth G increases. However, when the groove depth G becomes approximately 0.9λ or more, the frequency fluctuation amount ΔF increases again, and on the groove depth G exceeding 0.094λ, the frequency fluctuation amount ΔF exceeds 25 ppm.

The graph shown in FIG. 5 is of a simulation in a condition in which no electrode film is formed on the IDT 12, reflectors 20, and the like, on the quartz crystal substrate 30 but, as can be understood by referring to FIGS. 21A to 26F, whose details are shown hereinafter, it is supposed that it is possible to reduce the frequency fluctuation amount ΔF more in a SAW resonator 10 on which an electrode film is provided. Therefore, when fixing the upper limit value of the groove depth G, it may be made the maximum value in the condition in which no electrode film is formed, that is, G≤0.94λ, and it is possible to represent the preferred range of the groove depth G for achieving the target as $$0.01\lambda \le G \le 0.094\lambda \tag{2}$$

Figure 11:
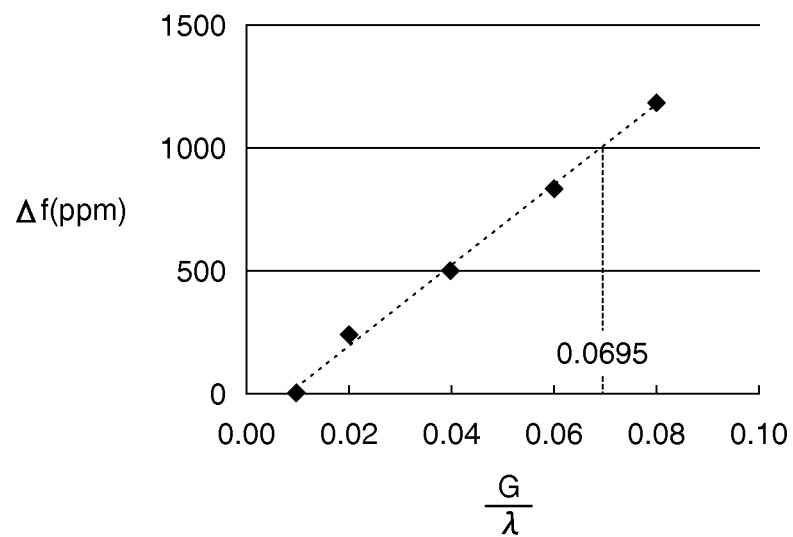
FIG. 11 is a graph illustrating a relationship between the inter-electrode finger groove depth and the frequency fluctuation amount when the inter-electrode finger groove depth deviates by ±0.001λ.

The groove depth G has a maximum variation of around ±0.001λ in the mass production process. Therefore, the individual frequency fluctuation amounts Δf of the SAW resonator 10 in a case in which the groove depth G deviates by ±0.001λ, when the line occupation rate η is taken to be a constant, are shown in FIG. 11. According to FIG. 11, it can be seen that in a case in which the groove depth G deviates by ±0.001λ when G=0.04λ, that is, when the groove depth is in a range of 0.039λ≤G≤0.041λ, the frequency fluctuation amount ΔF is around ±500 ppm.

Here, in a case where the frequency fluctuation amount ΔF is less than ±1000 ppm, frequency adjustment is possible using various frequency fine adjustment unit. However, in a case where the frequency fluctuation amount Δf is ±1000 ppm or more, adjusting the frequency has an effect on static characteristics such as the Q value and CI (crystal impedance) value, and on long-term reliability, leading to a reduction in the yield rate as the SAW resonator 10.

By deriving an approximate equation indicating the relationship between the frequency fluctuation amount Δf (ppm) and groove depth G for the straight line linking the plots shown in FIG. 11, it is possible to obtain Equation (10).

$$\Delta f = 16334(G/\lambda) - 137 \tag{10}$$

Here, on calculating the values of G at which Δf<1000 ppm, it is found that G≤0.0695λ. Consequently, it can be said that it is preferable that the range of the groove depth G according to the embodiment be optimally $$0.01\lambda \le G \le 0.0695\lambda \tag{3}$$

Figure 12A:
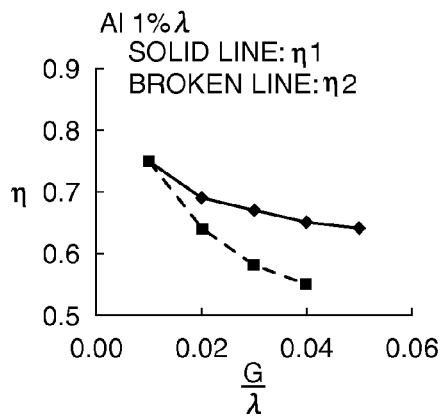
FIGS. 12A to 12F are graphs illustrating a relationship between the inter-electrode finger groove depth at which the second-order temperature coefficient becomes 0 and the line occupation rate η, when the electrode film thickness is changed, where
Figure 12B:
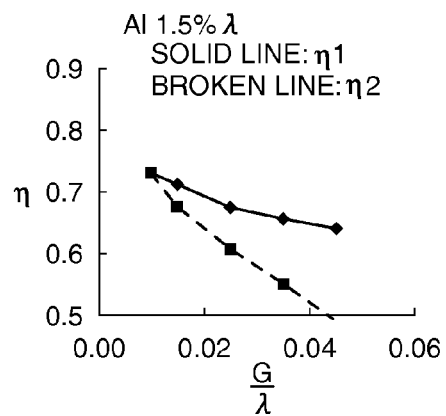
Figure 12C:
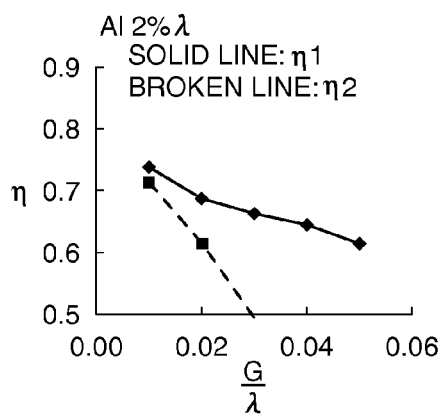
Figure 12D:
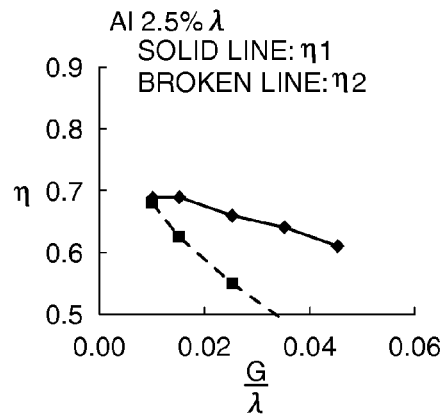
Figure 12E:
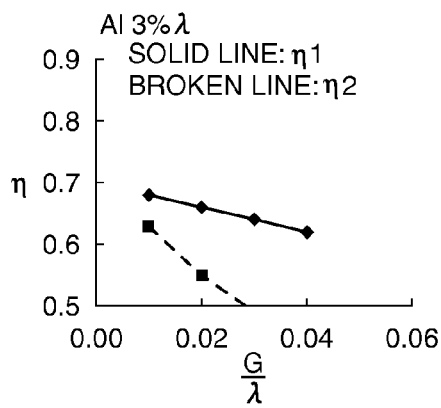
Figure 12F:
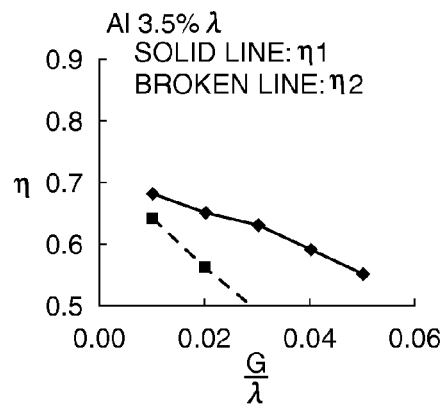

Next, FIGS. 12A and 12F are graphs illustrating evaluation results when simulating the relationship between η at which the second-order temperature coefficient β=0, that is, the line occupation rate η indicating the third-order temperature characteristics, and the groove depth G. The quartz crystal substrate 30 has Euler angles of (0°, 123°, and Ψ). Here, Ψ is appropriately selected as the angle at which the frequency-temperature characteristics indicate the tendency of the cubic curve, that is, the angle at which the second-order temperature coefficient β=0. The relationship between the Euler φ angle and the groove depth G when obtaining η at which β=0, under the same conditions as in FIGS. 12A to 12F, is shown in FIGS. 34A to 34F. Of FIGS. 34A to 34F, in the graph (FIG. 34C) in which the electrode film thickness H=0.02λ, although the plots of Ψ<42° are not shown, the η2 plot of the graph is Ψ=41.9° at G=0.03λ. The plots of the relationship between the groove depth G and line occupation rate η for each electrode film thickness are obtained based on FIG. 15A to FIG. 20F, which will be described in detail hereinafter.

Figure 13A:
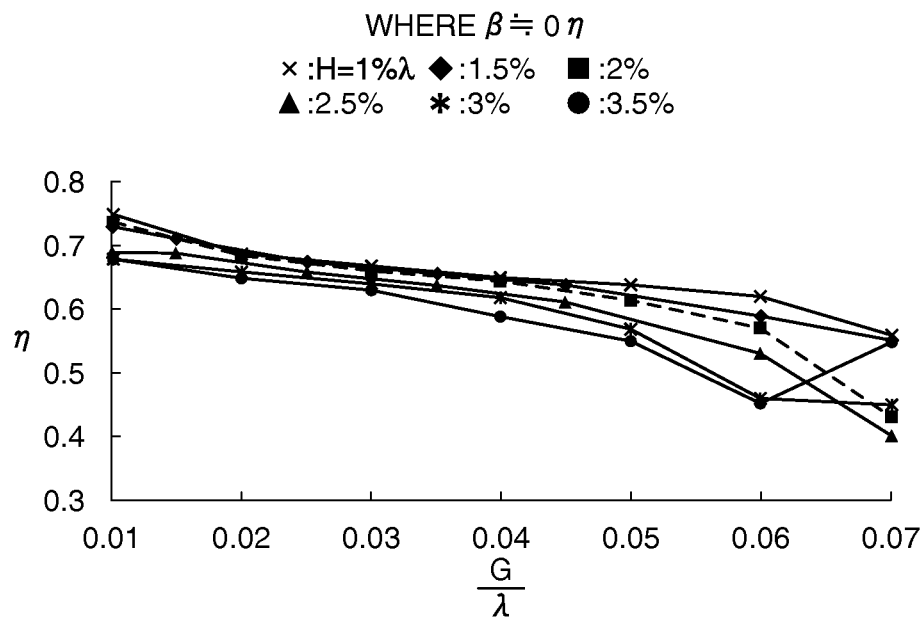
FIGS. 13A to 13B are diagrams in which relationships between η1 at which the second-order temperature coefficient β≅0 (ppm/° C.$^2$) and the inter-electrode finger groove depth for each electrode film thickness are summarized in graphs, where

From the evaluation results shown in FIGS. 12A to 12F, it can be seen that for every film thickness, as described above, the fluctuation of η1 due to the change in the groove depth G is small in comparison with that of η2. For this reason, η1 has been extracted from the graphs illustrating the relationship between the groove depth G and line occupation rate η for each film thickness in FIGS. 12A to 12F, and summarized by plotting points at which β≅0 in FIG. 13A. In contrast, on evaluating an area in which, although not reaching β≅0, |β|≤0.01 (ppm/° C.$^2$) is satisfied, it becomes clear that η1 are concentrated in the polygon indicated by the solid line, as shown in FIG. 13B.

Figure 13B:
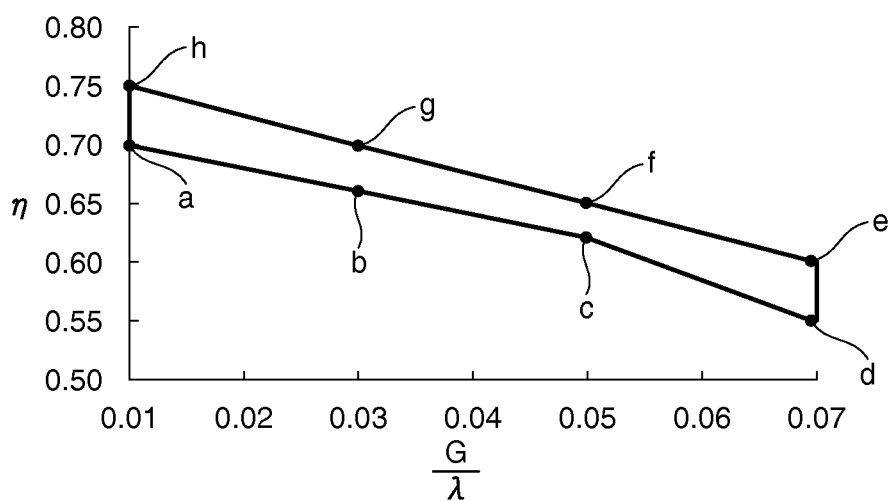

The coordinates of points a to h in FIG. 13B are shown in Table 1 below.

TABLE 1

| Point | G/λ | η |
|---|---|---|
| a | 0.01 | 0.70 |
| b | 0.03 | 0.66 |
| c | 0.05 | 0.62 |
| d | 0.07 | 0.55 |
| e | 0.07 | 0.60 |
| f | 0.05 | 0.65 |
| g | 0.03 | 0.70 |
| h | 0.01 | 0.75 |

FIG. 13B shows that, provided that it is inside the polygon surrounded by points a to h, |β|≤0.01 (ppm/° C.$^2$) is guaranteed regardless of the size of the electrode film thickness H, and good frequency-temperature characteristics can be obtained. A range within which the good frequency-temperature characteristics can be obtained is a range which satisfies both Equations (11) and (12), and Equation (13), shown below.

$$\eta \le -2.5000 \times G/\lambda + 0.7775 \text{ provided that}$$
$$0.0100\lambda \le G \le 0.0695\lambda \tag{11}$$

$$\eta \ge -2.0000 \times G/\lambda + 0.7200 \text{ provided that}$$
$$0.0100\lambda \le G \le 0.0500\lambda \tag{12}$$

$$\eta \ge -3.5898 \times G/\lambda + 0.7995 \text{ provided that}$$
$$0.0500\lambda < G \le 0.0695\lambda \tag{13}$$

From Equations (11), (12), and (13), it can be said that it is possible to specify the line occupation rates η in the range surrounded by the solid line in FIG. 13B as a range satisfying both Equation (5) and Equation (6).

$$-2.0000 \times G/\lambda + 0.7200 \le \eta \le -2.5000 \times G/\lambda + 0.7775 \text{ provided that } 0.0100\lambda \le G \le 0.0500\lambda \tag{5}$$

$$-3.5898 \times G/\lambda + 0.7995 \le \eta \le -2.5000 \times G/\lambda + 0.7775 \text{ provided that } 0.0500\lambda < G \le 0.0695\lambda \tag{6}$$

Here, in a case of allowing the second-order temperature coefficient β to be within ±0.01 (ppm/° C.$^2$), it is confirmed that by configuring so as to satisfy both Equation (3) and Equation (5) when 0.0100λ≤G≤0.0500λ, and satisfy both Equation (3) and Equation (6) when 0.0500λ≤G≤0.0695λ, the second-order temperature coefficient β comes within ±0.01 (ppm/° C.$^2$).

The values of the second-order temperature coefficient β (ppm/° C.$^2$) for each electrode film thickness H at the points a to h are shown in Table 2 below. From Table 2, it can be confirmed that |β|≤0.01 (ppm/° C.$^2$) at all of the points.

TABLE 2

| Point | Electrode Film Thickness H | | | | | |
|---|---|---|---|---|---|---|
| | 1% λ | 1.5% λ | 2% λ | 2.5% λ | 3% λ | 3.5% λ |
| a | $-0.099 \times 10^{-1}$ | $-0.070 \times 10^{-1}$ | $-0.030 \times 10^{-1}$ | $0.030 \times 10^{-1}$ | $-0.050 \times 10^{-1}$ | $-0.060 \times 10^{-1}$ |
| b | $0.040 \times 10^{-1}$ | $0.030 \times 10^{-1}$ | $0.000 \times 10^{-1}$ | $0.000 \times 10^{-1}$ | $-0.020 \times 10^{-1}$ | $-0.040 \times 10^{-1}$ |
| c | $0.070 \times 10^{-1}$ | $-0.040 \times 10^{-1}$ | $0.010 \times 10^{-1}$ | $-0.036 \times 10^{-1}$ | $-0.040 \times 10^{-1}$ | $-0.057 \times 10^{-1}$ |
| d | $0.067 \times 10^{-1}$ | $-0.022 \times 10^{-1}$ | $-0.070 \times 10^{-1}$ | $-0.080 \times 10^{-1}$ | $-0.090 \times 10^{-1}$ | $-0.099 \times 10^{-1}$ |
| e | $-0.039 \times 10^{-1}$ | $-0.060 \times 10^{-1}$ | $-0.090 \times 10^{-1}$ | $-0.080 \times 10^{-1}$ | $-0.090 \times 10^{-1}$ | $-0.094 \times 10^{-1}$ |
| f | $-0.023 \times 10^{-1}$ | $-0.070 \times 10^{-1}$ | $-0.050 \times 10^{-1}$ | $-0.062 \times 10^{-1}$ | $-0.060 \times 10^{-1}$ | $-0.070 \times 10^{-1}$ |
| g | $-0.070 \times 10^{-1}$ | $-0.060 \times 10^{-1}$ | $-0.090 \times 10^{-1}$ | $-0.070 \times 10^{-1}$ | $-0.070 \times 10^{-1}$ | $-0.070 \times 10^{-1}$ |
| h | $-0.099 \times 10^{-1}$ | $-0.030 \times 10^{-1}$ | $-0.091 \times 10^{-1}$ | $-0.080 \times 10^{-1}$ | $-0.080 \times 10^{-1}$ | $-0.080 \times 10^{-1}$ |

Figure 14:
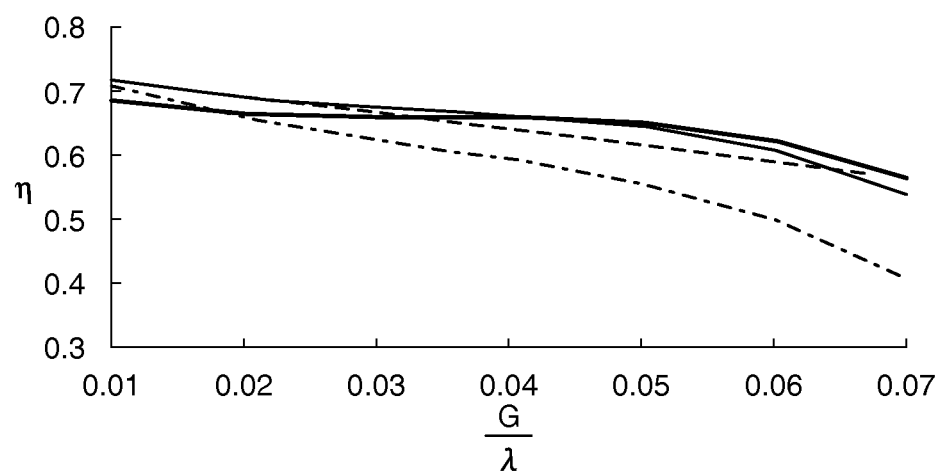
FIG. 14 is a diagram illustrating in an approximate curve a relationship between the inter-electrode finger groove depth and line occupation rate η for electrode film thicknesses from H≅0 to H=0.035λ.
Figure 15A:
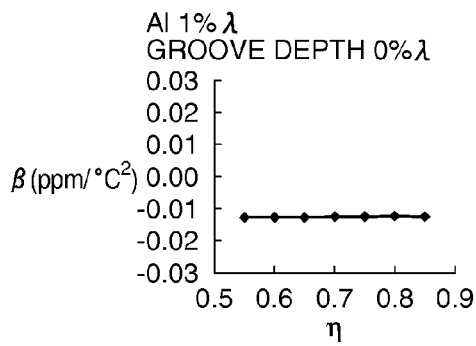
FIGS. 15A to 15F are graphs illustrating the relationship between the line occupation rate η and the second-order temperature coefficient β when changing the inter-electrode finger groove depth, with the electrode film thickness as 0.01λ, where
Figure 15B:
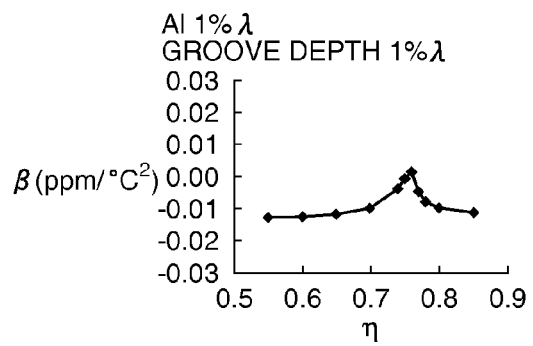
Figure 15C:
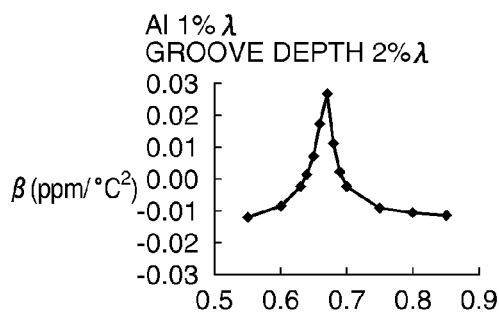
Figure 15D:
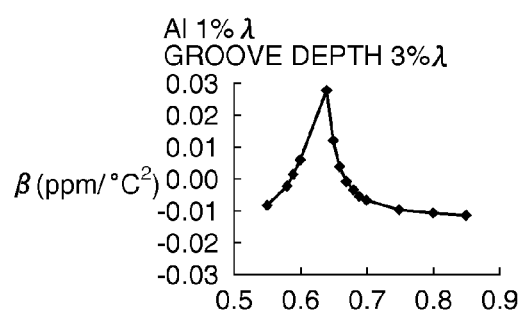
Figure 15E:
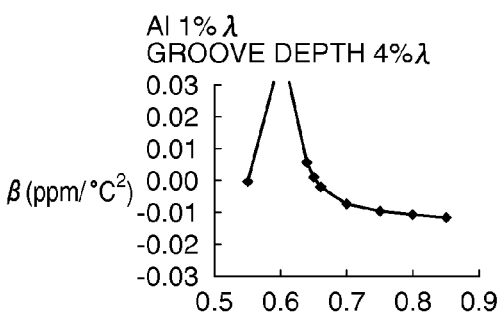
Figure 15F:
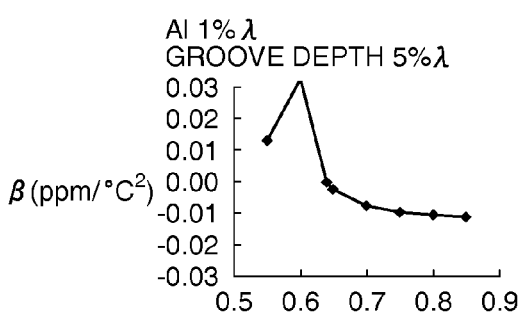
Figure 16A:
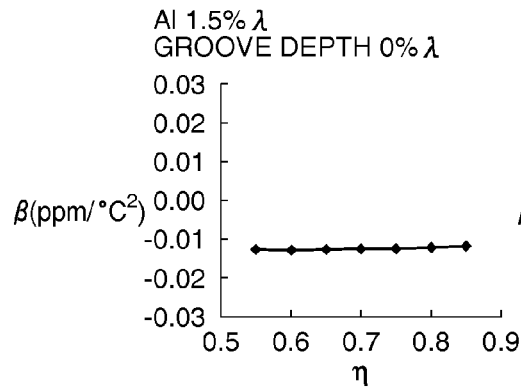
FIGS. 16A to 16F are graphs illustrating the relationship between the line occupation rate η and the second-order temperature coefficient β when changing the inter-electrode finger groove depth, with the electrode film thickness as 0.015λ, where
Figure 16B:
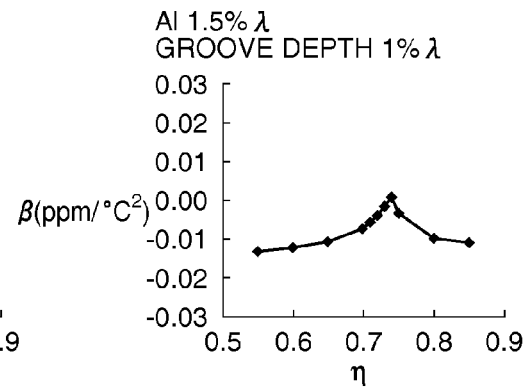
Figure 16C:
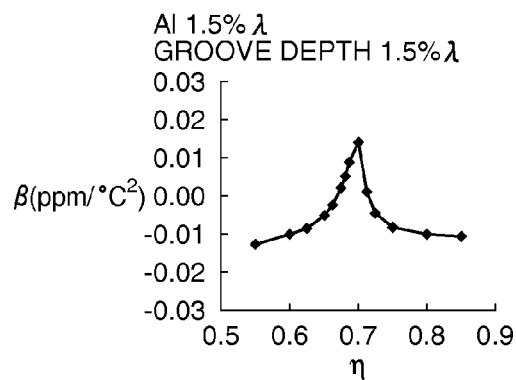
Figure 16D:
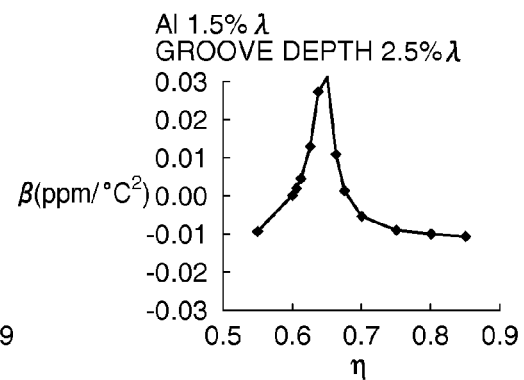
Figure 16E:
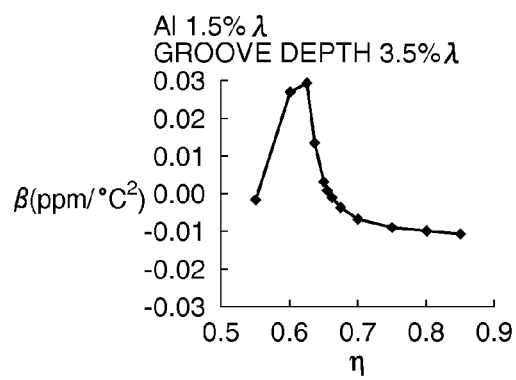
Figure 16F:
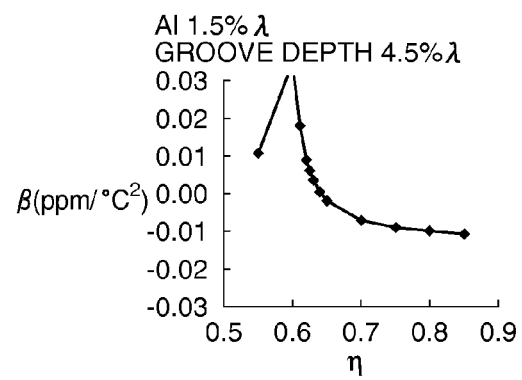
Figure 17A:
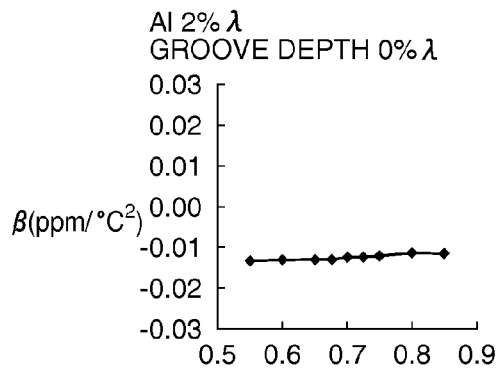
FIGS. 17A to 17F are graphs illustrating the relationship between the line occupation rate η and the second-order temperature coefficient β when changing the inter-electrode finger groove depth, with the electrode film thickness as 0.02λ, where
Figure 17B:
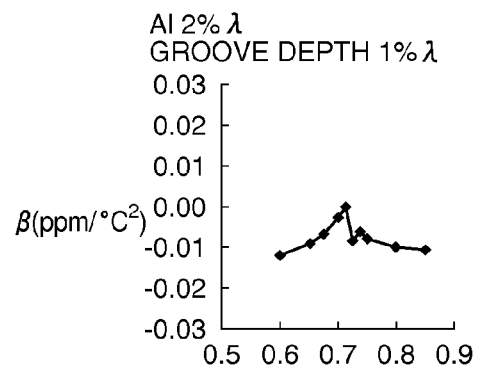
Figure 17C:
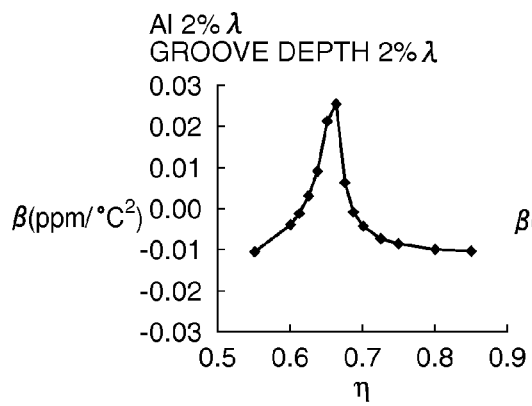
Figure 17D:
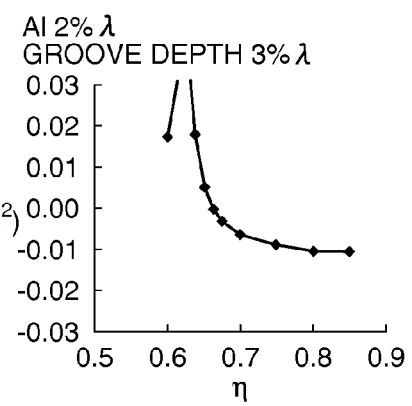
Figure 17E:
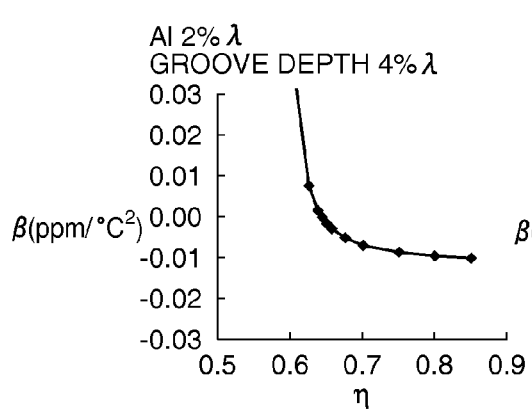
Figure 17F:
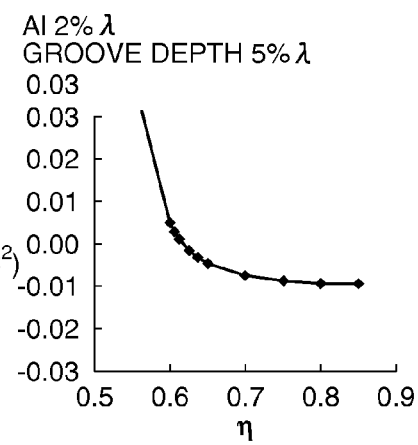
Figure 18A:
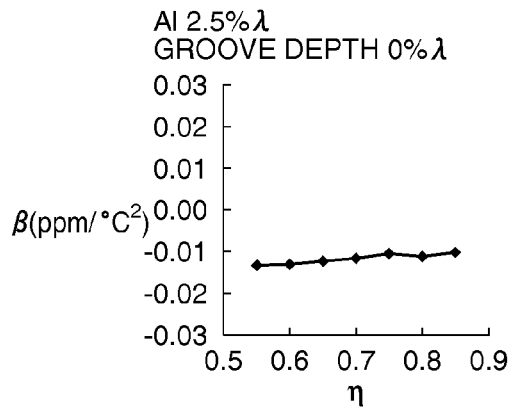
FIGS. 18A to 18F are graphs illustrating the relationship between the line occupation rate η and the second-order temperature coefficient β when changing the inter-electrode finger groove depth, with the electrode film thickness as 0.025λ, where
Figure 18B:
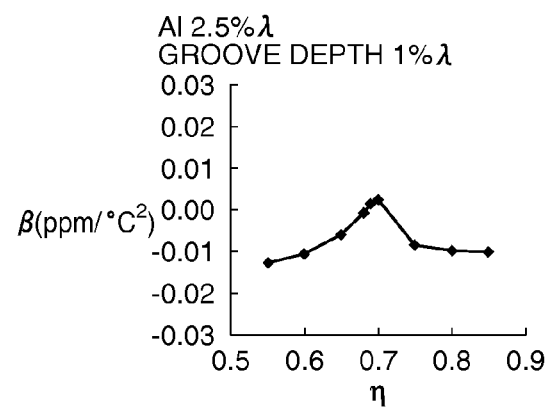
Figure 18C:
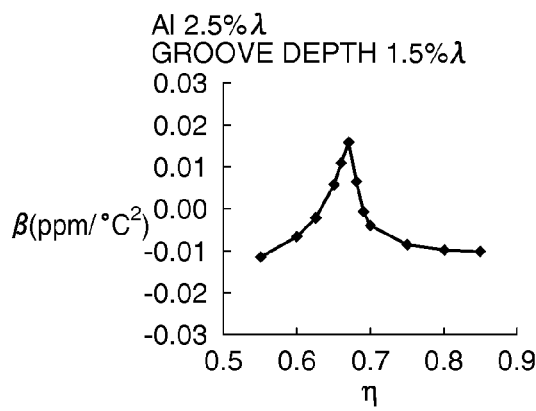
Figure 18D:
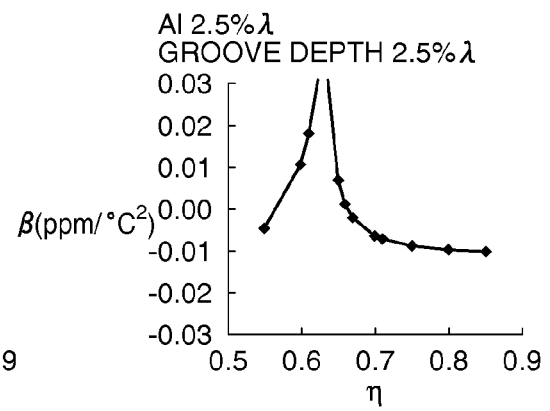
Figure 18E:
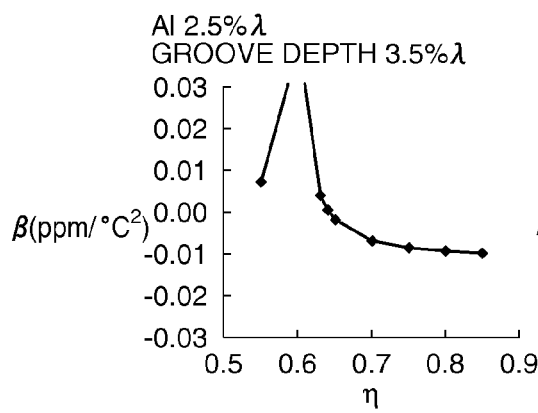
Figure 18F:
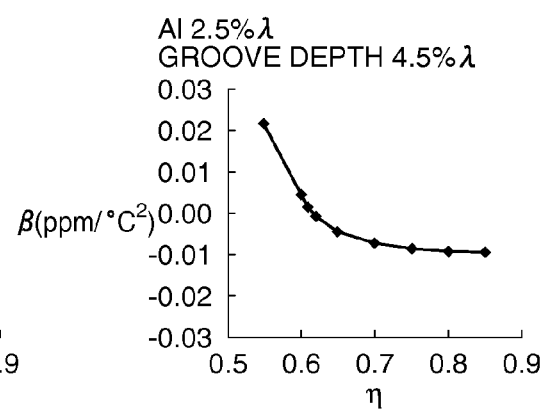
Figure 19A:
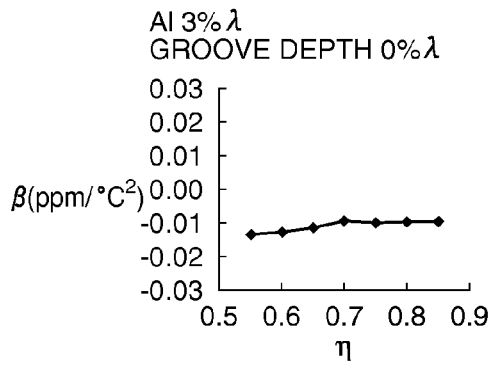
FIGS. 19A to 19F are graphs illustrating the relationship between the line occupation rate η and the second-order temperature coefficient β when changing the inter-electrode finger groove depth, with the electrode film thickness as 0.03λ, where
Figure 19B:
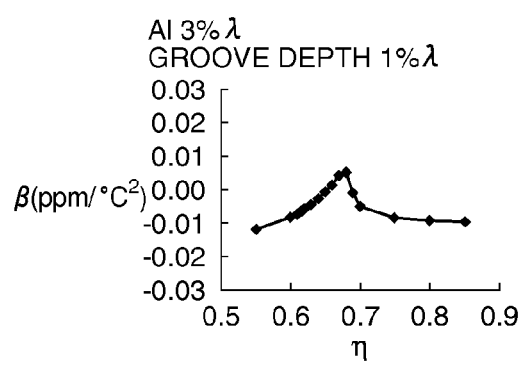
Figure 19C:
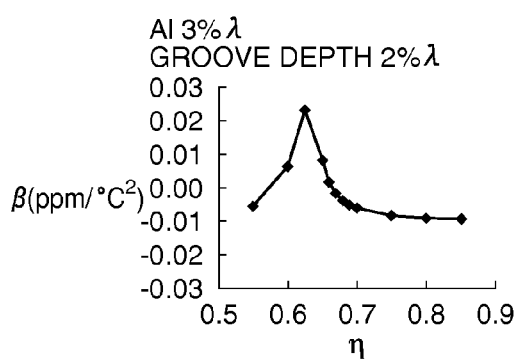
Figure 19D:
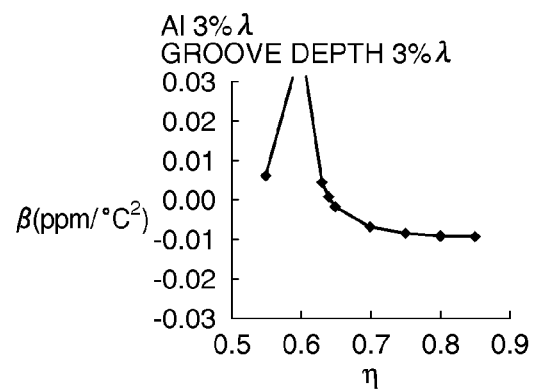
Figure 19E:
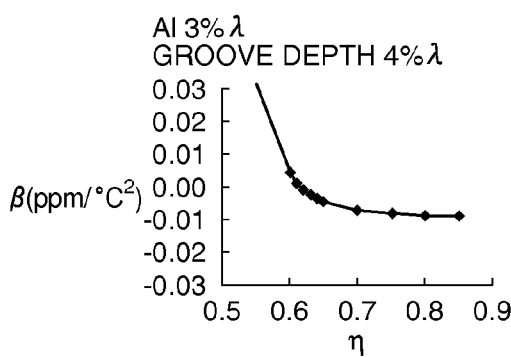
Figure 19F:
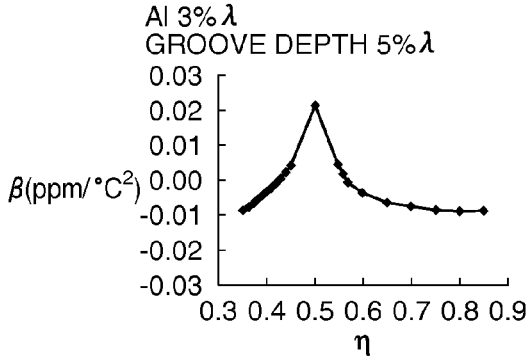
Figure 20A:
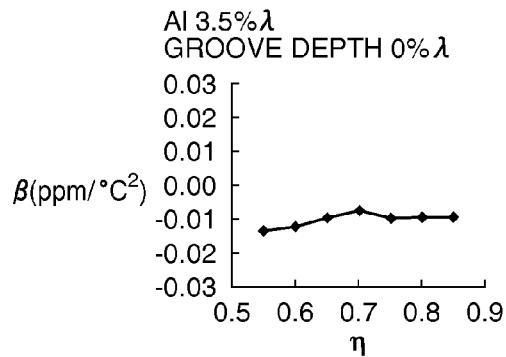
FIGS. 20A to 20F are graphs illustrating the relationship between the line occupation rate η and the second-order temperature coefficient β when changing the inter-electrode finger groove depth, with the electrode film thickness as 0.035λ, where
Figure 20B:
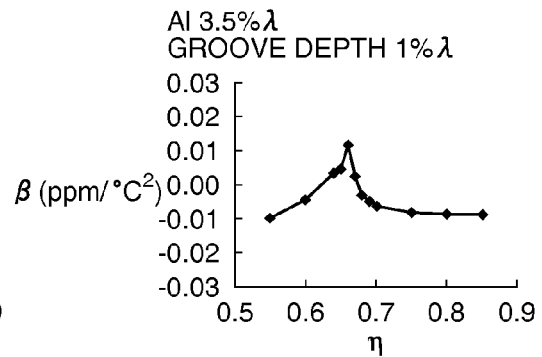
Figure 20C:
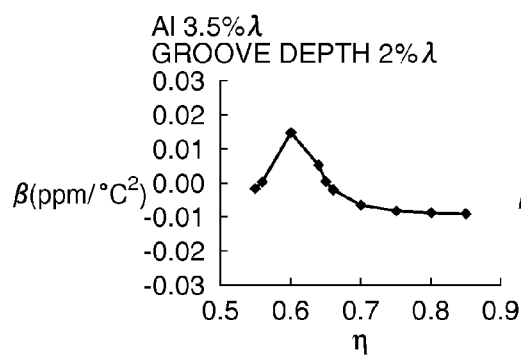
Figure 20D:
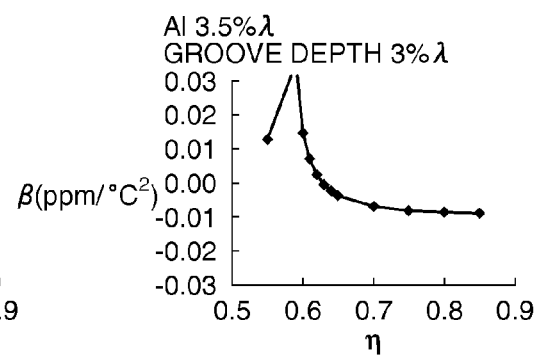
Figure 20E:
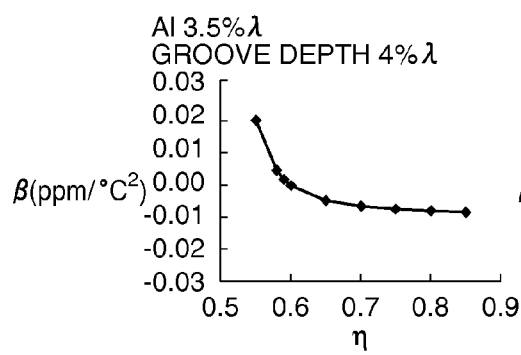
Figure 20F:
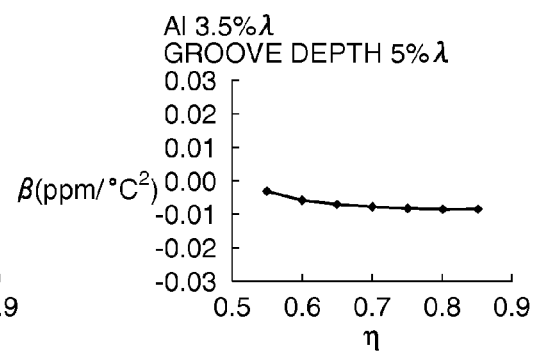
Figure 21A:
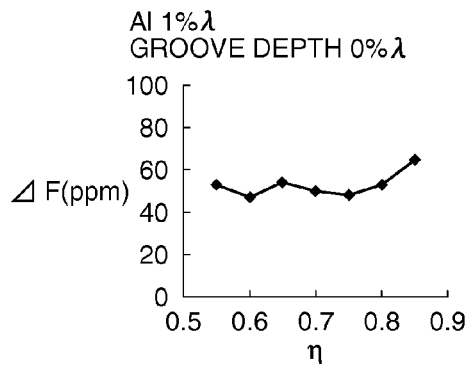
FIGS. 21A to 21F are graphs illustrating the relationship between the line occupation rate η and frequency fluctuation amount ΔF when changing the inter-electrode finger groove depth, with the electrode film thickness as 0.01λ, where
Figure 21B:
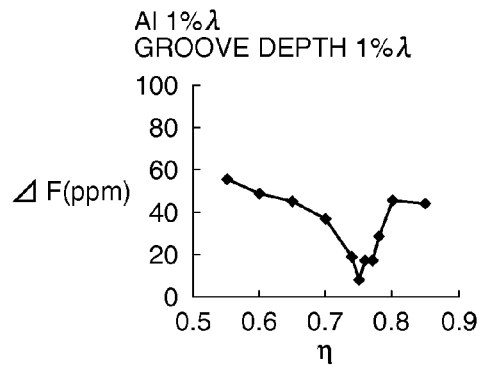
Figure 21C:
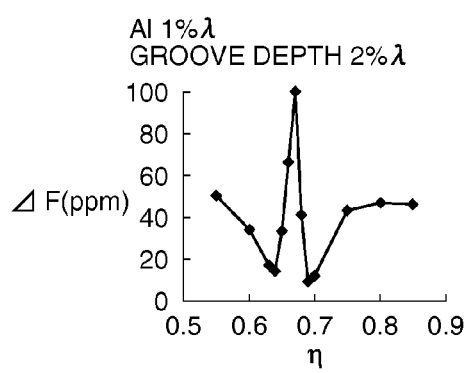
Figure 21D:
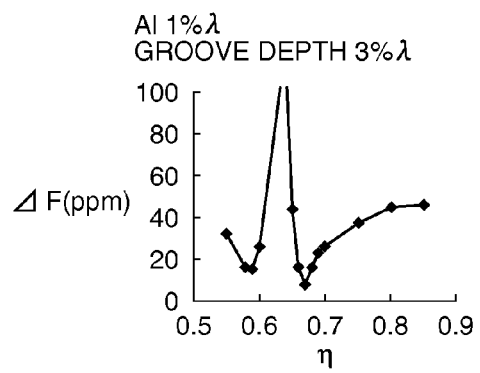
Figure 21E:
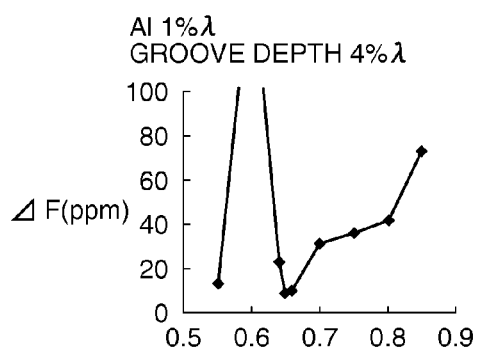
Figure 21F:
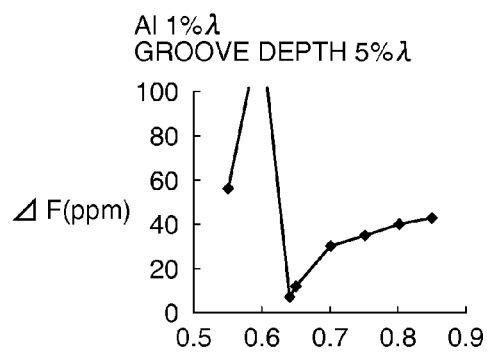
Figure 22A:
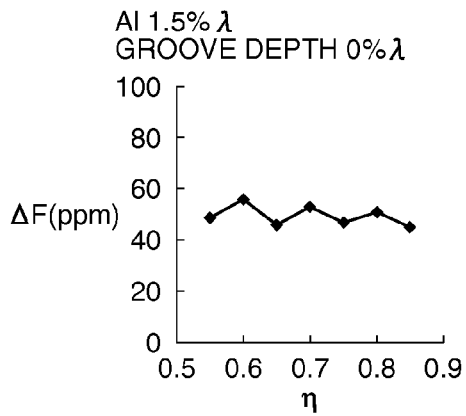
FIGS. 22A to 22F are graphs illustrating the relationship between the line occupation rate η and frequency fluctuation amount ΔF when changing the inter-electrode finger groove depth, with the electrode film thickness as 0.015λ, where
Figure 22B:
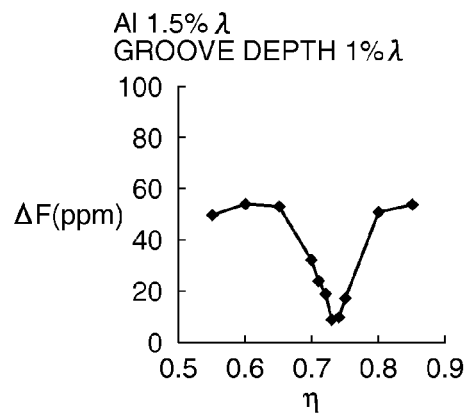
Figure 22C:
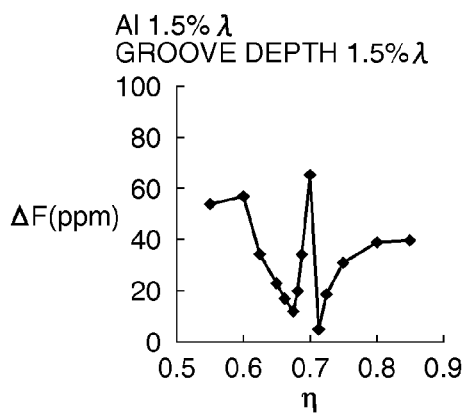
Figure 22D:
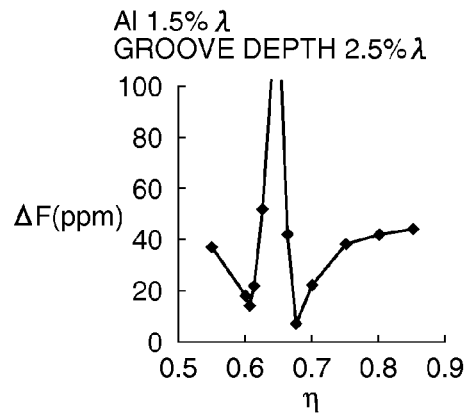
Figure 22E:
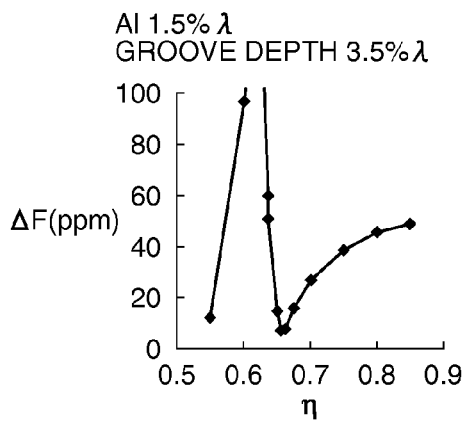
Figure 22F:
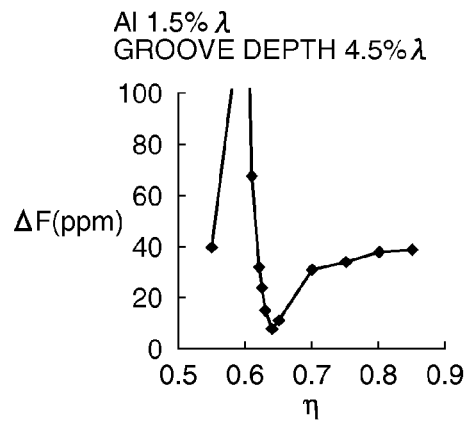
Figure 23A:
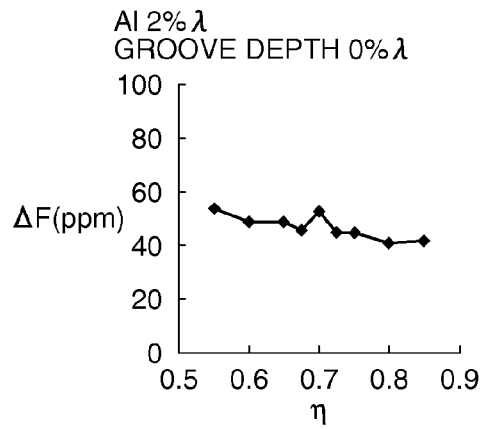
FIGS. 23A to 23F are graphs illustrating the relationship between the line occupation rate η and frequency fluctuation amount ΔF when changing the inter-electrode finger groove depth, with the electrode film thickness as 0.02λ, where
Figure 23B:
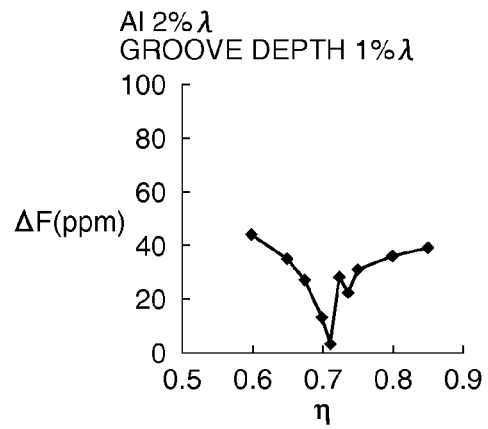
Figure 23C:
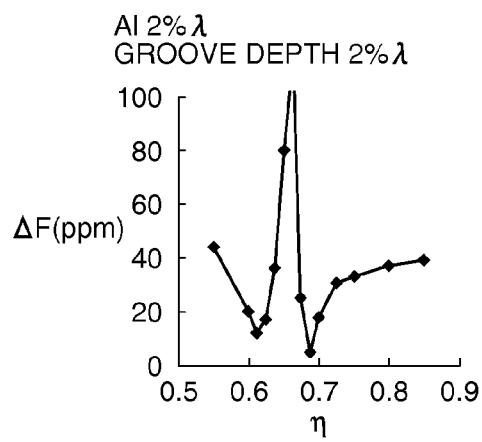
Figure 23D:
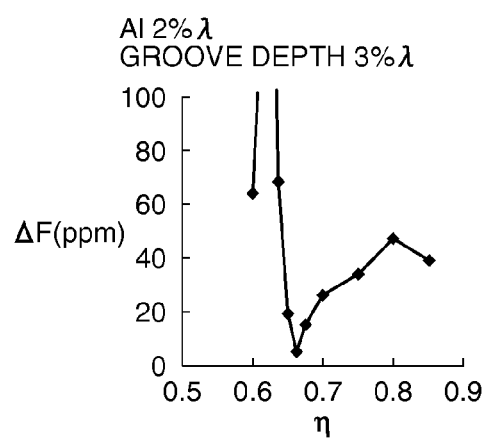
Figure 23E:
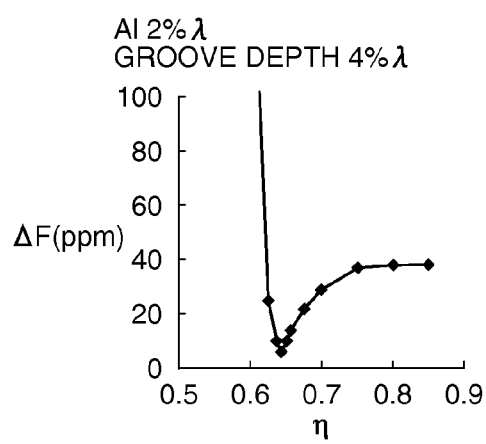
Figure 23F:
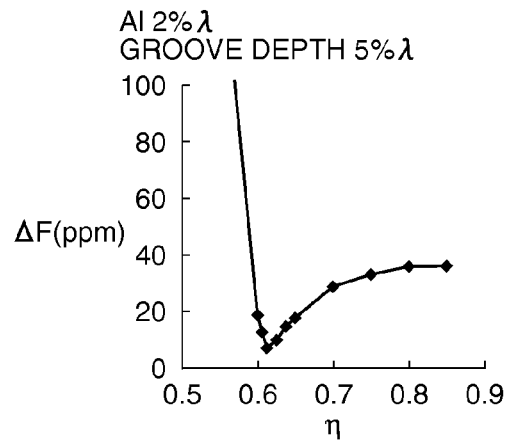
Figure 24A:
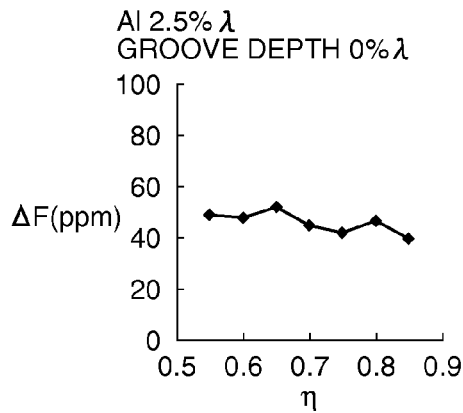
FIGS. 24A to 24F are graphs illustrating the relationship between the line occupation rate η and frequency fluctuation amount ΔF when changing the inter-electrode finger groove depth, with the electrode film thickness as 0.025λ, where
Figure 24B:
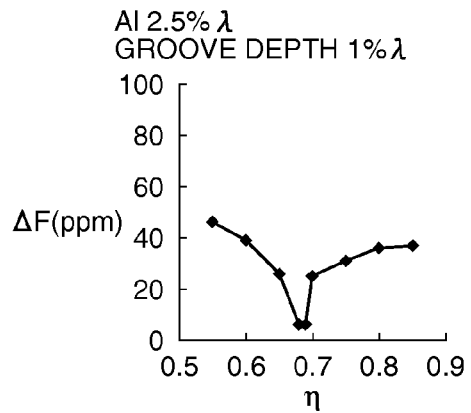
Figure 24C:
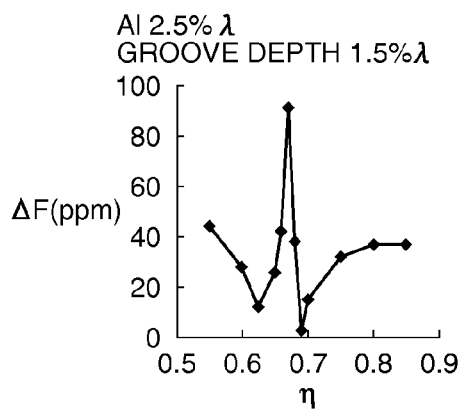
Figure 24D:
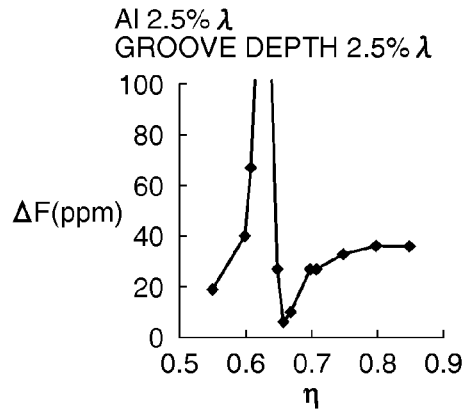
Figure 24E:
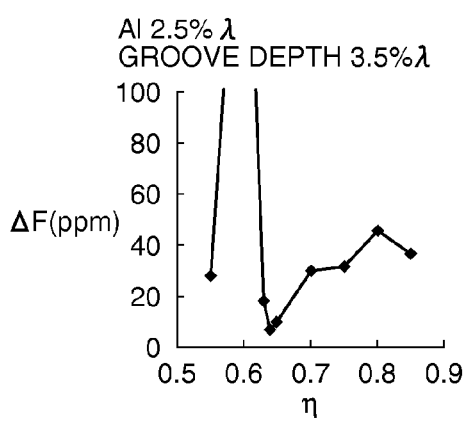
Figure 24F:
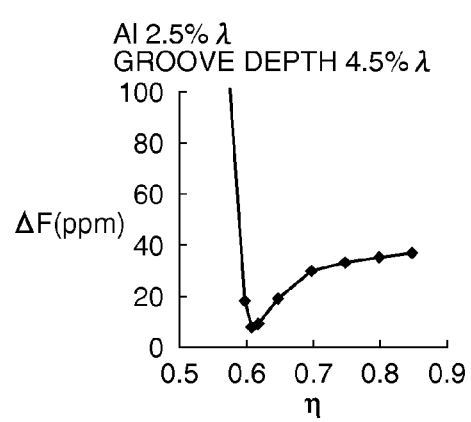
Figure 25A:
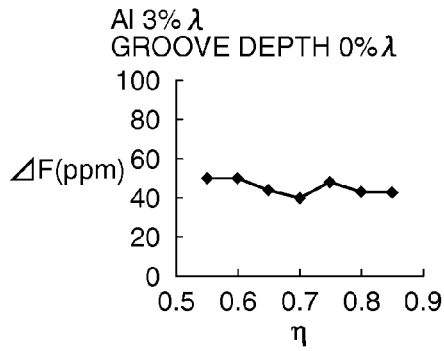
FIGS. 25A to 25F are graphs illustrating the relationship between the line occupation rate η and frequency fluctuation amount ΔF when changing the inter-electrode finger groove depth, with the electrode film thickness as 0.03λ, where
Figure 25B:
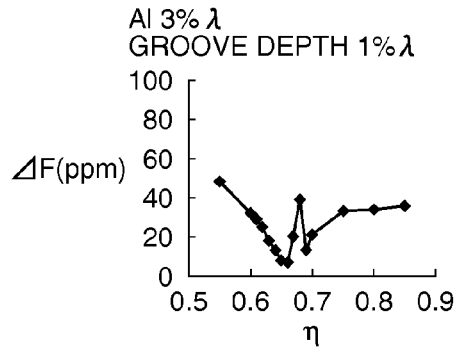
Figure 25C:
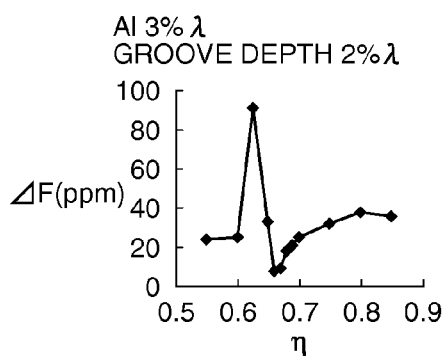
Figure 25D:
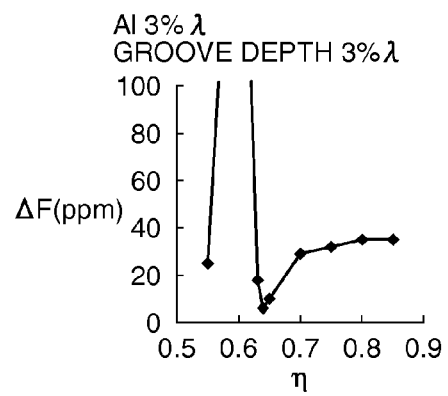
Figure 25E:
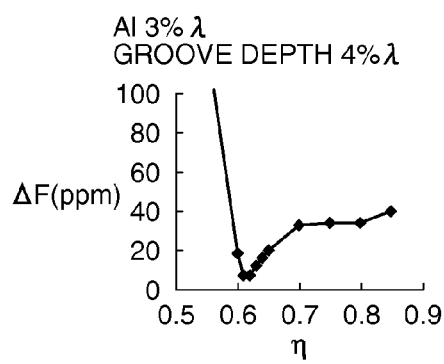
Figure 25F:
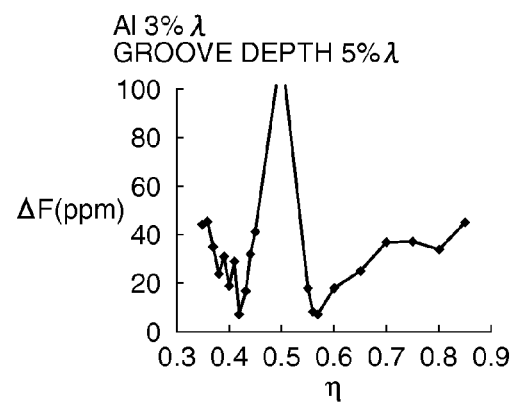
Figure 26A:
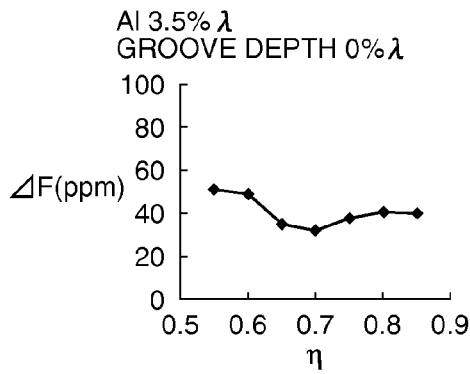
FIGS. 26A to 26F are graphs illustrating the relationship between the line occupation rate η and frequency fluctuation amount ΔF when changing the inter-electrode finger groove depth, with the electrode film thickness as 0.035λ, where
Figure 26B:
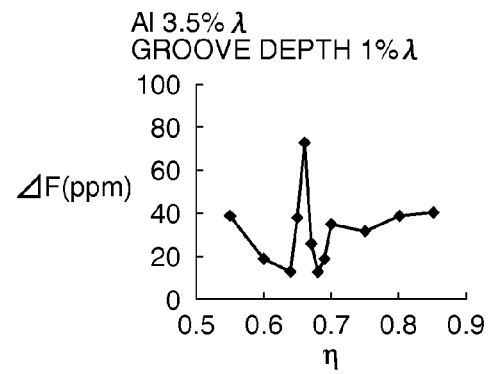
Figure 26C:
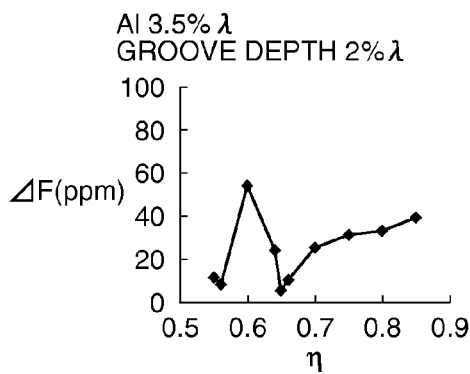
Figure 26D:
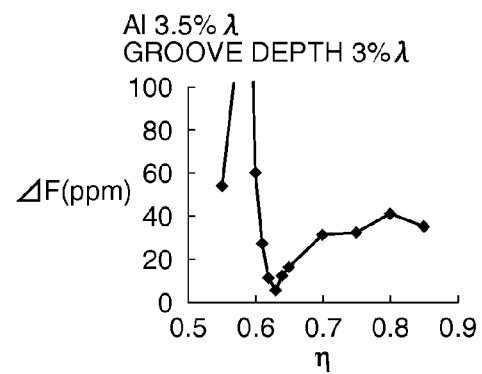
Figure 26E:
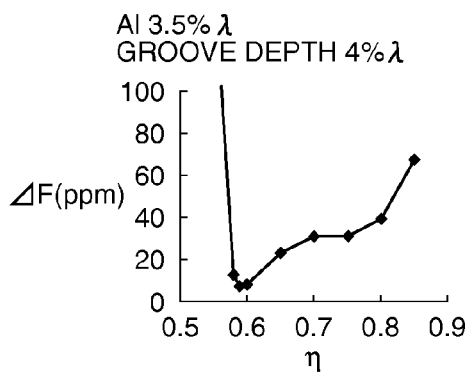
Figure 26F:
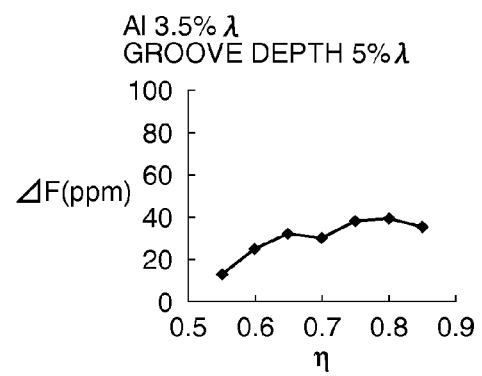

In addition, when the relationship between the groove depth G and line occupation rate η at each point at which β=0 for SAW resonators 10 in which the electrode film thickness H≅0, 0.01λ, 0.02λ, 0.03λ, based on Equations (11) to (13) and Equations (5) and (6) derived therefrom, is indicated by an approximate line, the result is as in FIG. 14. The relationship between the groove depth G and line occupation rate η in the quartz crystal substrate 30 on which no electrode film is provided is as shown in FIG. 9.

When changing the electrode film thickness H at 3.0%λ (0.030λ) or less, the frequency-temperature characteristics of β=0, that is, the cubic curve, can be obtained. At this time, a relational equation for G and η when the frequency-temperature characteristics are good can be expressed by Equation (8).

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad (8)$$

Here, the units of G and H are λ.

It is noted that Equation (8) is established when the electrode film thickness H is in the range of 0<H≤0.030λ.

With the manufacturing variation of the electrical characteristics (particularly the resonance frequency) being greater the greater the electrode film thickness, there is a high probability that the manufacturing variation of the line occupation rate η may be ±0.04 or less when the electrode film thickness H is within the range of Equations (5) and (6), and that a manufacturing variation greater than ±0.04 will occur when H>0.035λ. However, provided that the electrode film thickness H is within the range of Equations (5) and (6), and the variation of the line occupation rate η is ±0.04 or less, it is possible to realize a SAW device with a low second-order temperature coefficient β. That is, when taking into consideration the manufacturing variation of the line occupation rate, and keeping the second-order temperature coefficient β within ±0.01 ppm/° C.², a line occupation rate η up to the range of Equation (9), where a tolerance of ±0.04 is added to Equation (8), is allowable.

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \pm 0.04 \quad (9)$$

FIGS. 15A to 20F show graphs of the relationship between the line occupation rate η and second-order temperature coefficient β when the groove depth G is changed, in cases in which the electrode film thickness is 0.01λ, (1%λ), 0.015λ (1.5%λ), 0.02λ, (2%λ), 0.025λ (2.5%λ), 0.03λ, (3%λ), and 0.035λ (3.5%λ), respectively.

In addition, FIGS. 21A to 26F show graphs of the relationship between the line occupation rate η and frequency fluctuation amount ΔF in the SAW resonator 10 corresponding to each of the FIGS. 15A to 20F. The quartz crystal substrates used are all ones with Euler angles (0°, 123°, and Ψ), and with regard to Ψ, an angle at which ΔF is smallest is appropriately selected.

Here, FIGS. 15A to 15F are diagrams illustrating the relationship between the line occupation rate η and second-order temperature coefficient β when the electrode film thickness H is 0.01λ, and FIGS. 21A to 21F are diagrams illustrating the relationship between the line occupation rate η and frequency fluctuation amount ΔF when the electrode film thickness H is 0.01λ.

In addition, FIGS. 16A to 16F are diagrams illustrating the relationship between the line occupation rate η and second-order temperature coefficient β when the electrode film thickness H is 0.015λ, and FIGS. 22A to 22F are diagrams illustrating the relationship between the line occupation rate η and frequency fluctuation amount ΔF when the electrode film thickness H is 0.015λ.

In addition, FIGS. 17A to 17F are diagrams illustrating the relationship between the line occupation rate η and second-order temperature coefficient β when the electrode film thickness H is 0.02λ, and FIGS. 23A to 23F are diagrams illustrating the relationship between the line occupation rate η and frequency fluctuation amount ΔF when the electrode film thickness H is 0.02λ.

In addition, FIGS. 18A to 18F are diagrams illustrating the relationship between the line occupation rate η and second-order temperature coefficient β when the electrode film thickness H is 0.025λ, and FIGS. 24A to 24F are diagrams illustrating the relationship between the line occupation rate η and frequency fluctuation amount ΔF when the electrode film thickness H is 0.025λ.

In addition, FIGS. 19A to 19F are diagrams illustrating the relationship between the line occupation rate η and second-order temperature coefficient β when the electrode film thickness H is 0.03λ, and FIGS. 25A to 25F are diagrams illustrating the relationship between the line occupation rate η and frequency fluctuation amount ΔF when the electrode film thickness H is 0.03λ.

In addition, FIGS. 20A to 20F are diagrams illustrating the relationship between the line occupation rate η and second-order temperature coefficient β when the electrode film thickness H is 0.035λ, and FIGS. 26A to 26F are diagrams illustrating the relationship between the line occupation rate η and frequency fluctuation amount ΔF when the electrode film thickness H is 0.035λ.

Although there are slight differences in all of the graphs in these diagrams (FIGS. 15A to 26F), regarding the change tendencies thereof, it is seen that they are similar to those in FIGS. 8A to 8I and 10A to 10I, which are graphs illustrating the relationship between the line occupation rate η and second-order temperature coefficient β, and line occupation rate η and frequency fluctuation amount ΔF, in the quartz crystal substrate 30 only.

That is, it can be said that an advantage according to the embodiment of the invention is that it can be achieved even when propagating a surface acoustic wave on an individual quartz crystal substrate 30 from which the electrode film is omitted.

For each of the two points η1 and η2 at which the second-order temperature coefficient β becomes zero, a simulation is performed for each of the range of η1 and η2 when the range of β is expanded to $|\beta| \leq 0.01$ (ppm/° C.$^2$), and the case in which the range of the electrode film thickness H is fixed, and the groove depth G is changed. Of η1 and η2, the larger η at which $|\beta| \leq 0.01$ (ppm/° C.$^2$) is taken to be η1, and the smaller η at which $|\beta| \leq 0.01$ (ppm/° C.$^2$) is η2. The quartz crystal substrates used are all ones with Euler angles (0°, 123°, and Ψ), and with regard to Ψ, an angle at which ΔF is smallest is appropriately selected.

Figure 27A:
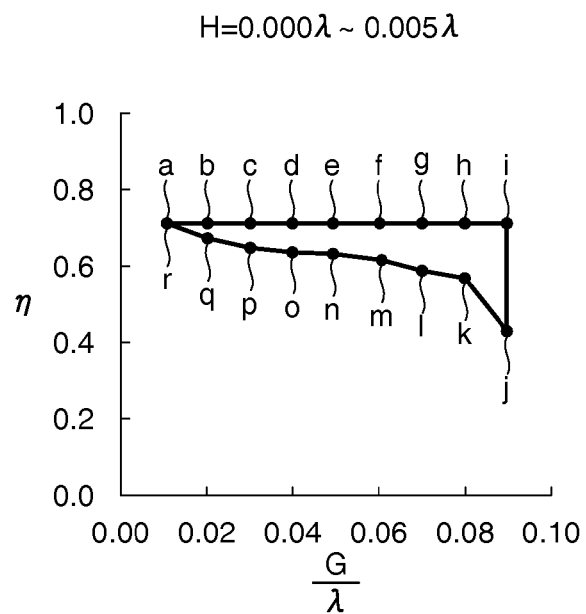
FIGS. 27A and 27B are diagrams illustrating a range in which $|\beta| \le 0.01$ (ppm/° C.$^2$) by means of graphs illustrating a relationship between the line occupation rate η and groove depth G when the electrode film thickness H is $0 \le H < 0.005\lambda$, where

FIG. 27A is a graph illustrating the relationship between η1 which satisfies the above-described range of β and the groove depth G, when the electrode film thickness H is $0.000\lambda < H \leq 0.005\lambda$, and Table 3 is a table illustrating the coordinates (G/λ, η) of principal measurement points for fixing the range shown in FIG. 27A, and the value of β at the measurement points.

TABLE 3

| Point | G/λ | η | β (ppm/° C.$^2$) |
|---|---|---|---|
| a | 0.010 | 0.710 | $-0.098 \times 10^{-1}$ |
| b | 0.020 | 0.710 | $-0.099 \times 10^{-1}$ |
| c | 0.030 | 0.710 | $-0.095 \times 10^{-1}$ |
| d | 0.040 | 0.710 | $-0.100 \times 10^{-1}$ |
| e | 0.050 | 0.710 | $-0.100 \times 10^{-1}$ |
| f | 0.060 | 0.710 | $-0.098 \times 10^{-1}$ |
| g | 0.070 | 0.710 | $-0.099 \times 10^{-1}$ |
| h | 0.080 | 0.710 | $-0.097 \times 10^{-1}$ |
| i | 0.090 | 0.710 | $-0.100 \times 10^{-1}$ |
| j | 0.090 | 0.420 | $0.073 \times 10^{-1}$ |
| k | 0.080 | 0.570 | $0.086 \times 10^{-1}$ |
| l | 0.070 | 0.590 | $0.093 \times 10^{-1}$ |
| m | 0.060 | 0.615 | $0.077 \times 10^{-1}$ |
| n | 0.050 | 0.630 | $0.054 \times 10^{-1}$ |
| o | 0.040 | 0.635 | $0.097 \times 10^{-1}$ |
| p | 0.030 | 0.650 | $0.097 \times 10^{-1}$ |
| q | 0.020 | 0.670 | $0.074 \times 10^{-1}$ |
| r | 0.010 | 0.710 | $0.091 \times 10^{-1}$ |

From FIG. 27A and Table 3, it can be seen that when the electrode film thickness H at η1 is within the above-described range, and when the groove depth G is in the range of $0.01\lambda \leq G \leq 0.09\lambda$, β satisfies the above-described requirement in the area surrounded by the polygon with the measurement points a to r as the vertices.

Figure 27B:
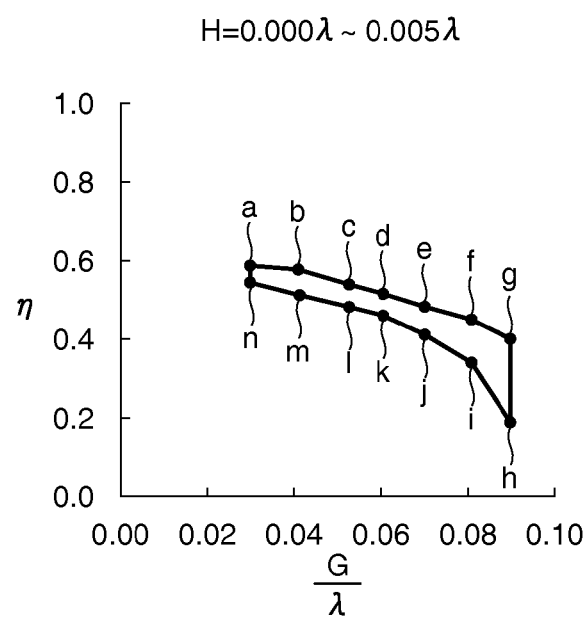

FIG. 27B is a graph illustrating the relationship between η2 which satisfies the above-described range of β and the groove depth G, when the electrode film thickness H is $0.000\lambda < H \leq 0.005\lambda$, and Table 4 is a table illustrating the coordinates (G/λ, η) of principal measurement points for fixing the range shown in FIG. 27B, and the value of β at the measurement points.

TABLE 4

| Point | G/λ | η | β (ppm/° C.$^2$) |
|---|---|---|---|
| a | 0.030 | 0.590 | $0.097 \times 10^{-1}$ |
| b | 0.040 | 0.580 | $0.097 \times 10^{-1}$ |
| c | 0.050 | 0.550 | $0.054 \times 10^{-1}$ |
| d | 0.060 | 0.520 | $0.077 \times 10^{-1}$ |
| e | 0.070 | 0.480 | $0.093 \times 10^{-1}$ |
| f | 0.080 | 0.450 | $0.086 \times 10^{-1}$ |
| g | 0.090 | 0.400 | $0.073 \times 10^{-1}$ |
| h | 0.090 | 0.180 | $0.056 \times 10^{-1}$ |
| i | 0.080 | 0.340 | $0.093 \times 10^{-1}$ |
| j | 0.070 | 0.410 | $0.078 \times 10^{-1}$ |
| k | 0.060 | 0.460 | $0.094 \times 10^{-1}$ |
| l | 0.050 | 0.490 | $0.085 \times 10^{-1}$ |
| m | 0.040 | 0.520 | $0.099 \times 10^{-1}$ |
| n | 0.030 | 0.550 | $0.098 \times 10^{-1}$ |

From FIG. 27B and Table 4, it can be seen that when the electrode film thickness H at η2 is within the above-described range, and when the groove depth G is in the range of $0.03\lambda \leq G \leq 0.09\lambda$, β satisfies the above-described requirement in the area surrounded by the polygon with the measurement points a to n as the vertices.

Figure 28A:
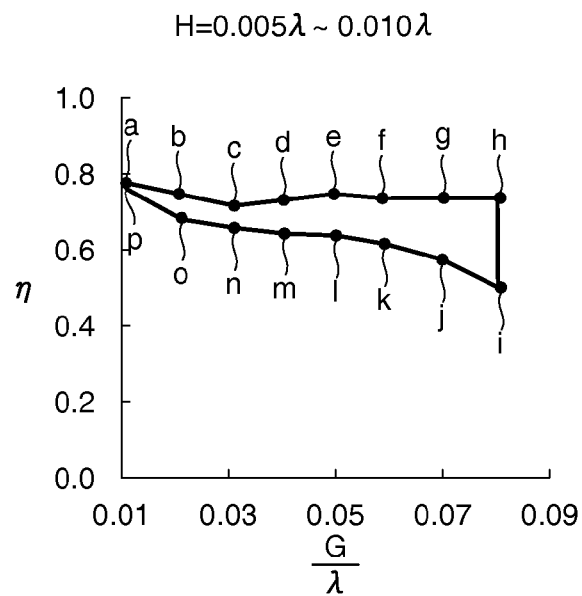
FIGS. 28A and 28B are diagrams illustrating a range in which $|\beta| \le 0.01$ (ppm/° C.$^2$) by means of graphs illustrating a relationship between the line occupation rate η and groove depth G when the electrode film thickness H is $0.05\lambda \le H < 0.010\lambda$, where

FIG. 28A is a graph illustrating the relationship between η1 which satisfies the above-described range of β and the groove depth G, when the electrode film thickness H is $0.005\lambda < H \leq 0.010\lambda$, and Table 5 is a table illustrating the coordinates (G/λ, η) of principal measurement points for fixing the range shown in FIG. 28A, and the value of β at the measurement points.

TABLE 5

| Point | G/λ | η | β (ppm/° C.$^2$) |
|---|---|---|---|
| a | 0.010 | 0.770 | $-0.099 \times 10^{-1}$ |
| b | 0.020 | 0.740 | $-0.100 \times 10^{-1}$ |
| c | 0.030 | 0.715 | $-0.100 \times 10^{-1}$ |
| d | 0.040 | 0.730 | $-0.098 \times 10^{-1}$ |
| e | 0.050 | 0.740 | $-0.100 \times 10^{-1}$ |
| f | 0.060 | 0.730 | $-0.098 \times 10^{-1}$ |
| g | 0.070 | 0.730 | $-0.100 \times 10^{-1}$ |
| h | 0.080 | 0.730 | $-0.100 \times 10^{-1}$ |
| i | 0.080 | 0.500 | $0.086 \times 10^{-1}$ |
| j | 0.070 | 0.570 | $0.100 \times 10^{-1}$ |
| k | 0.060 | 0.610 | $0.095 \times 10^{-1}$ |
| l | 0.050 | 0.630 | $0.100 \times 10^{-1}$ |
| m | 0.040 | 0.635 | $0.097 \times 10^{-1}$ |
| n | 0.030 | 0.655 | $0.070 \times 10^{-1}$ |
| o | 0.020 | 0.680 | $0.100 \times 10^{-1}$ |
| p | 0.010 | 0.760 | $0.016 \times 10^{-1}$ |

From FIG. 28A and Table 5, it can be seen that when the electrode film thickness H at η1 is within the above-described range, and when the groove depth G is in the range of $0.01\lambda \leq G \leq 0.08\lambda$, β satisfies the above-described requirement in the area surrounded by the polygon with the measurement points a to p as the vertices.

Figure 28B:
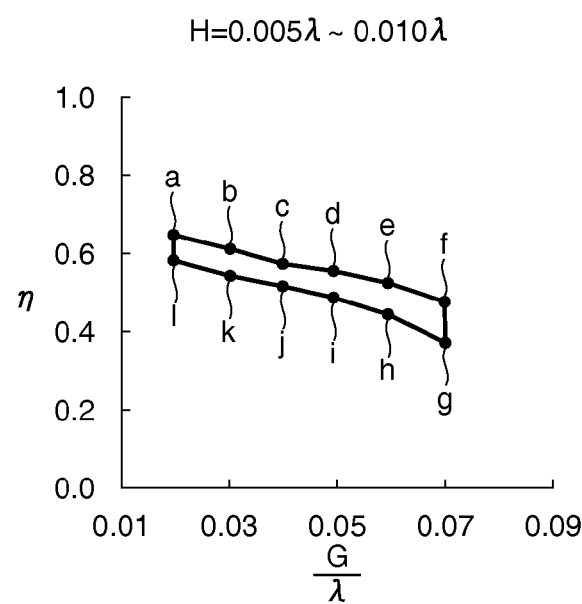

FIG. 28B is a graph illustrating the relationship between η2 which satisfies the above-described range of β and the groove depth G, when the electrode film thickness H is $0.005\lambda < H \leq 0.010\lambda$, and Table 6 is a table illustrating the coordinates (G/λ, η) of principal measurement points for fixing the range shown in FIG. 28B, and the value of β at the measurement points.

TABLE 6

| Point | G/λ | η | β (ppm/° C.$^2$) |
|---|---|---|---|
| a | 0.020 | 0.650 | $0.090 \times 10^{-1}$ |
| b | 0.030 | 0.610 | $0.098 \times 10^{-1}$ |

TABLE 6-continued

| Point | G/λ | η | β (ppm/° C.$^2$) |
|---|---|---|---|
| c | 0.040 | 0.570 | $0.097 \times 10^{-1}$ |
| d | 0.050 | 0.550 | $0.040 \times 10^{-1}$ |
| e | 0.060 | 0.520 | $0.066 \times 10^{-1}$ |
| f | 0.070 | 0.470 | $0.070 \times 10^{-1}$ |
| g | 0.070 | 0.370 | $-0.094 \times 10^{-1}$ |
| h | 0.060 | 0.440 | $-0.096 \times 10^{-1}$ |
| i | 0.050 | 0.480 | $-0.096 \times 10^{-1}$ |
| j | 0.040 | 0.520 | $-0.095 \times 10^{-1}$ |
| k | 0.030 | 0.550 | $-0.099 \times 10^{-1}$ |
| l | 0.020 | 0.590 | $-0.100 \times 10^{-1}$ |

From FIG. 28B and Table 6, it can be seen that when the electrode film thickness H at η2 is within the above-described range, and when the groove depth G is in the range of 0.02λ≤G≤0.07λ, β satisfies the above-described requirement in the area surrounded by the polygon with the measurement points a to l as the vertices.

Figure 29A:
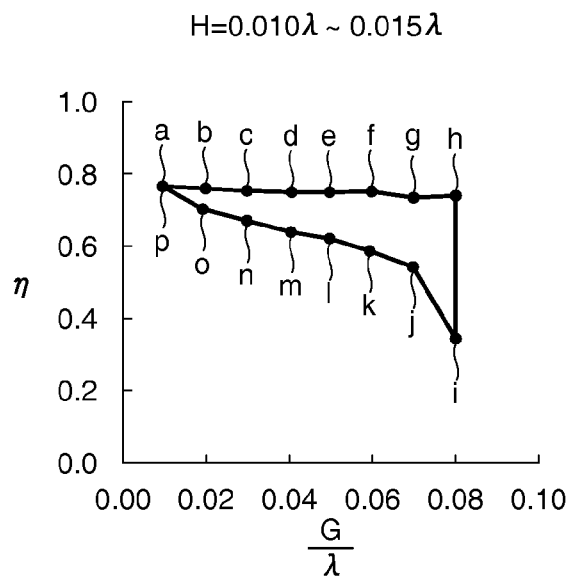
FIGS. 29A and 29B are diagrams illustrating a range in which $|\beta| \le 0.01$ (ppm/° C.$^2$) by means of graphs illustrating a relationship between the line occupation rate η and groove depth G when the electrode film thickness H is $0.010\lambda \le H < 0.015\lambda$, where

FIG. 29A is a graph illustrating the relationship between η1 which satisfies the above-described range of β and the groove depth G, when the electrode film thickness H is 0.010λ<H≤0.015λ, and Table 7 is a table illustrating the coordinates (G/λ, η) of principal measurement points for fixing the range shown in FIG. 29A, and the value of β at the measurement points.

TABLE 7

| Point | G/λ | η | β (ppm/° C.$^2$) |
|---|---|---|---|
| a | 0.010 | 0.770 | $-0.099 \times 10^{-1}$ |
| b | 0.020 | 0.760 | $-0.099 \times 10^{-1}$ |
| c | 0.030 | 0.760 | $-0.099 \times 10^{-1}$ |
| d | 0.040 | 0.750 | $-0.099 \times 10^{-1}$ |
| e | 0.050 | 0.750 | $-0.099 \times 10^{-1}$ |
| f | 0.060 | 0.750 | $-0.099 \times 10^{-1}$ |
| g | 0.070 | 0.740 | $-0.099 \times 10^{-1}$ |
| h | 0.080 | 0.740 | $-0.098 \times 10^{-1}$ |
| i | 0.080 | 0.340 | $0.088 \times 10^{-1}$ |
| j | 0.070 | 0.545 | $0.088 \times 10^{-1}$ |
| k | 0.060 | 0.590 | $0.099 \times 10^{-1}$ |
| l | 0.050 | 0.620 | $0.090 \times 10^{-1}$ |
| m | 0.040 | 0.645 | $0.060 \times 10^{-1}$ |
| n | 0.030 | 0.670 | $0.030 \times 10^{-1}$ |
| o | 0.020 | 0.705 | $0.076 \times 10^{-1}$ |
| p | 0.010 | 0.760 | $0.010 \times 10^{-1}$ |

From FIG. 29A and Table 7, it can be seen that when the electrode film thickness H at η1 is within the above-described range, and when the groove depth G is in the range of 0.01λ≤G≤0.08λ, β satisfies the above-described requirement in the area surrounded by the polygon with the measurement points a to p as the vertices.

Figure 29B:
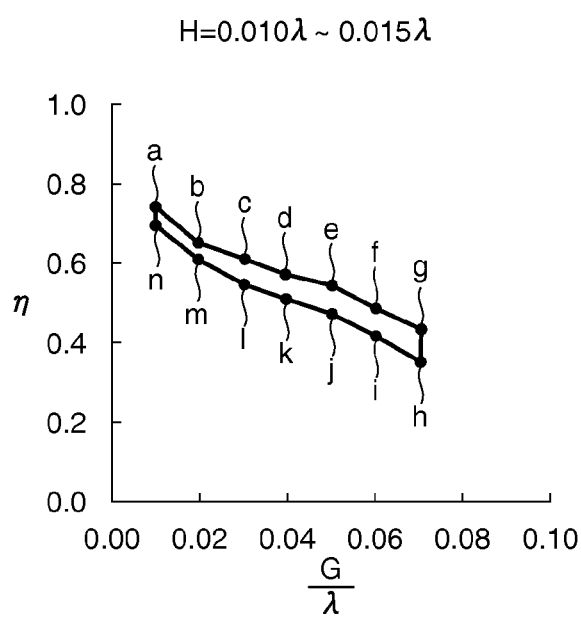

FIG. 29B is a graph illustrating the relationship between η2 which satisfies the above-described range of β and the groove depth G, when the electrode film thickness H is 0.010λ<H≤0.015λ, and Table 8 is a table illustrating the coordinates (G/λ, η) of principal measurement points for fixing the range shown in FIG. 29B, and the value of β at the measurement points.

TABLE 8

| Point | G/λ | η | β (ppm/° C.$^2$) |
|---|---|---|---|
| a | 0.010 | 0.740 | $0.099 \times 10^{-1}$ |
| b | 0.020 | 0.650 | $0.090 \times 10^{-1}$ |
| c | 0.030 | 0.610 | $0.090 \times 10^{-1}$ |
| d | 0.040 | 0.570 | $0.080 \times 10^{-1}$ |
| e | 0.050 | 0.540 | $0.060 \times 10^{-1}$ |

TABLE 8-continued

| Point | G/λ | η | β (ppm/° C.$^2$) |
|---|---|---|---|
| f | 0.060 | 0.480 | $0.060 \times 10^{-1}$ |
| g | 0.070 | 0.430 | $0.099 \times 10^{-1}$ |
| h | 0.070 | 0.350 | $-0.099 \times 10^{-1}$ |
| i | 0.060 | 0.420 | $-0.090 \times 10^{-1}$ |
| j | 0.050 | 0.470 | $-0.090 \times 10^{-1}$ |
| k | 0.040 | 0.510 | $-0.090 \times 10^{-1}$ |
| l | 0.030 | 0.550 | $-0.090 \times 10^{-1}$ |
| m | 0.020 | 0.610 | $-0.099 \times 10^{-1}$ |
| n | 0.010 | 0.700 | $-0.099 \times 10^{-1}$ |

From FIG. 29B and Table 8, it can be seen that when the electrode film thickness H at η2 is within the above-described range, and when the groove depth G is in the range of 0.01λ≤G≤0.07λ, β satisfies the above-described requirement in the area surrounded by the polygon with the measurement points a to n as the vertices.

Figure 30A:
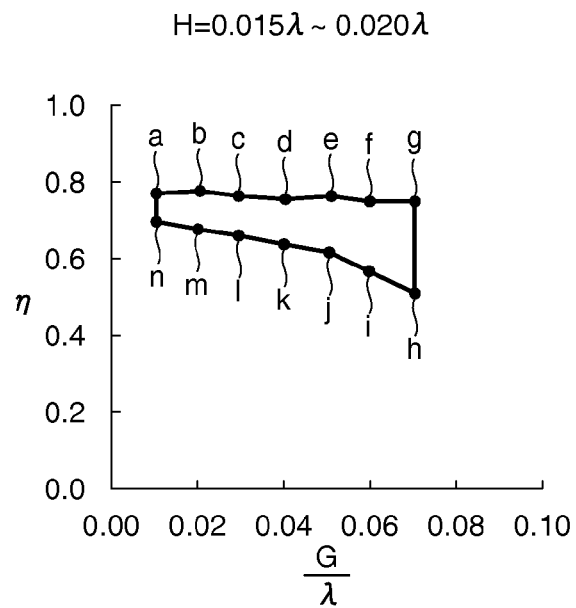
FIGS. 30A and 30B are diagrams illustrating a range in which $|\beta| \le 0.01$ (ppm/° C.$^2$) by means of graphs illustrating a relationship between the line occupation rate η and groove depth G when the electrode film thickness H is $0.015\lambda \le H < 0.020\lambda$, where

FIG. 30A is a graph illustrating the relationship between η1 which satisfies the above-described range of β and the groove depth G, when the electrode film thickness H is 0.015λ<H≤0.020λ, and Table 9 is a table illustrating the coordinates (G/λ, η) of principal measurement points for fixing the range shown in FIG. 30A, and the value of β at the measurement points.

TABLE 9

| Point | G/λ | η | β (ppm/° C.$^2$) |
|---|---|---|---|
| a | 0.010 | 0.770 | $-0.100 \times 10^{-1}$ |
| b | 0.020 | 0.770 | $-0.100 \times 10^{-1}$ |
| c | 0.030 | 0.760 | $-0.100 \times 10^{-1}$ |
| d | 0.040 | 0.760 | $-0.100 \times 10^{-1}$ |
| e | 0.050 | 0.760 | $-0.100 \times 10^{-1}$ |
| f | 0.060 | 0.750 | $-0.100 \times 10^{-1}$ |
| g | 0.070 | 0.750 | $-0.100 \times 10^{-1}$ |
| h | 0.070 | 0.510 | $0.100 \times 10^{-1}$ |
| i | 0.060 | 0.570 | $0.099 \times 10^{-1}$ |
| j | 0.050 | 0.620 | $0.097 \times 10^{-1}$ |
| k | 0.040 | 0.640 | $0.096 \times 10^{-1}$ |
| l | 0.030 | 0.660 | $0.080 \times 10^{-1}$ |
| m | 0.020 | 0.670 | $0.076 \times 10^{-1}$ |
| n | 0.010 | 0.700 | $0.010 \times 10^{-1}$ |

From FIG. 30A and Table 9, it can be seen that when the electrode film thickness H at η1 is within the above-described range, and when the groove depth G is in the range 0.01λ≤G≤0.07λ, β satisfies the above-described requirement in the area surrounded by the polygon with the measurement points a to n as the vertices.

Figure 30B:
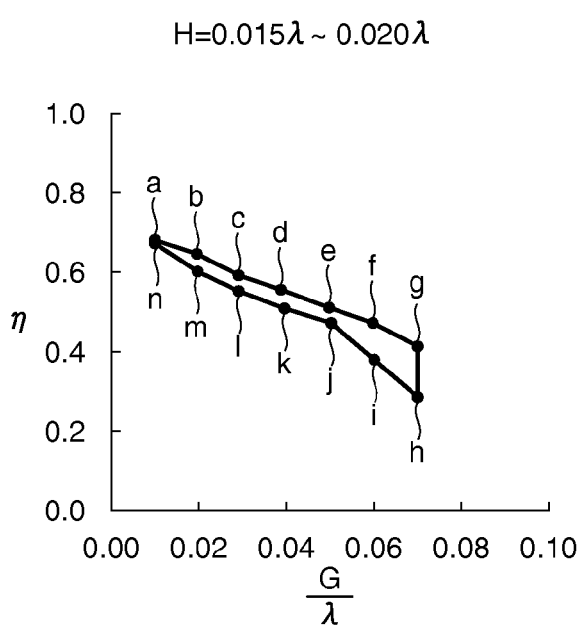

FIG. 30B is a graph illustrating the relationship between η2 which satisfies the above-described range of β and the groove depth G, when the electrode film thickness H is 0.015λ<H≤0.020λ, and Table 10 is a table illustrating the coordinates (G/λ, η) of principal measurement points for fixing the range shown in FIG. 30B, and the value of β at the measurement points.

TABLE 10

| Point | G/λ | η | β (ppm/° C.$^2$) |
|---|---|---|---|
| a | 0.010 | 0.690 | $0.010 \times 10^{-1}$ |
| b | 0.020 | 0.640 | $0.090 \times 10^{-1}$ |
| c | 0.030 | 0.590 | $0.090 \times 10^{-1}$ |
| d | 0.040 | 0.550 | $0.080 \times 10^{-1}$ |
| e | 0.050 | 0.510 | $0.080 \times 10^{-1}$ |
| f | 0.060 | 0.470 | $0.090 \times 10^{-1}$ |
| g | 0.070 | 0.415 | $0.100 \times 10^{-1}$ |
| h | 0.070 | 0.280 | $-0.100 \times 10^{-1}$ |

TABLE 10-continued

| Point | G/λ | η | β (ppm/° C.²) |
|---|---|---|---|
| i | 0.060 | 0.380 | −0.090 × 10⁻¹ |
| j | 0.050 | 0.470 | −0.090 × 10⁻¹ |
| k | 0.040 | 0.510 | −0.090 × 10⁻¹ |
| l | 0.030 | 0.550 | −0.090 × 10⁻¹ |
| m | 0.020 | 0.610 | −0.100 × 10⁻¹ |
| n | 0.010 | 0.680 | −0.100 × 10⁻¹ |

From FIG. 30B and Table 10, it can be seen that when the electrode film thickness H at $\eta 2$ is within the above-described range, and when the groove depth G is in the range of $0.01\lambda \le G \le 0.07\lambda$, $\beta$ satisfies the above-described requirement in the area surrounded by the polygon with the measurement points a to n as the vertices.

Figure 31A:
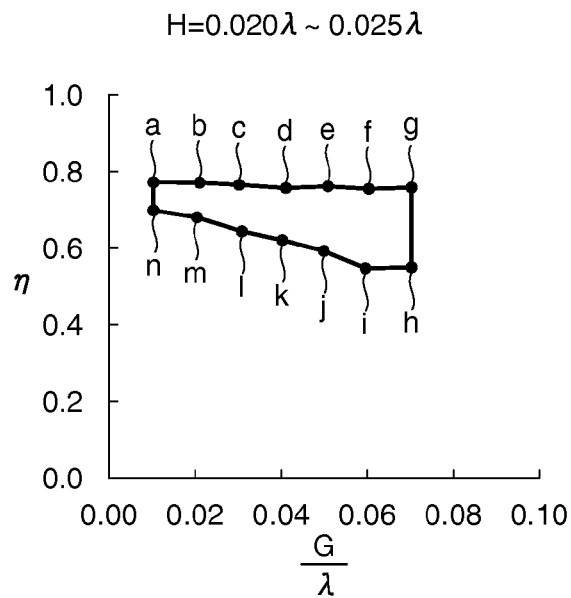
FIGS. 31A and 31B are diagrams illustrating a range in which $|\beta| \le 0.01$ (ppm/° C.$^2$) by means of graphs illustrating a relationship between the line occupation rate η and groove depth G when the electrode film thickness H is $0.020\lambda \le H < 0.025\lambda$, where

FIG. 31A is a graph illustrating the relationship between $\eta 1$ which satisfies the above-described range of $\beta$ and the groove depth G, when the electrode film thickness H is $0.020\lambda < H \le 0.025\lambda$, and Table 11 is a table illustrating the coordinates (G/λ, η) of principal measurement points for fixing the range shown in FIG. 31A, and the value of $\beta$ at the measurement points.

TABLE 11

| Point | G/λ | η | β (ppm/° C.²) |
|---|---|---|---|
| a | 0.010 | 0.770 | −0.100 × 10⁻¹ |
| b | 0.020 | 0.770 | −0.100 × 10⁻¹ |
| c | 0.030 | 0.760 | −0.100 × 10⁻¹ |
| d | 0.040 | 0.760 | −0.100 × 10⁻¹ |
| e | 0.050 | 0.760 | −0.096 × 10⁻¹ |
| f | 0.060 | 0.760 | −0.100 × 10⁻¹ |
| g | 0.070 | 0.760 | −0.100 × 10⁻¹ |
| h | 0.070 | 0.550 | 0.100 × 10⁻¹ |
| i | 0.060 | 0.545 | 0.090 × 10⁻¹ |
| j | 0.050 | 0.590 | 0.097 × 10⁻¹ |
| k | 0.040 | 0.620 | 0.100 × 10⁻¹ |
| l | 0.030 | 0.645 | 0.100 × 10⁻¹ |
| m | 0.020 | 0.680 | 0.070 × 10⁻¹ |
| n | 0.010 | 0.700 | 0.030 × 10⁻¹ |

From FIG. 31A and Table 11, it can be seen that when the electrode film thickness H at $\eta 1$ is within the above-described range, and when the groove depth G is in the range of $0.01\lambda \le G \le 0.07\lambda$, $\beta$ satisfies the above-described requirement in the area surrounded by the polygon with the measurement points a to n as the vertices.

Figure 31B:
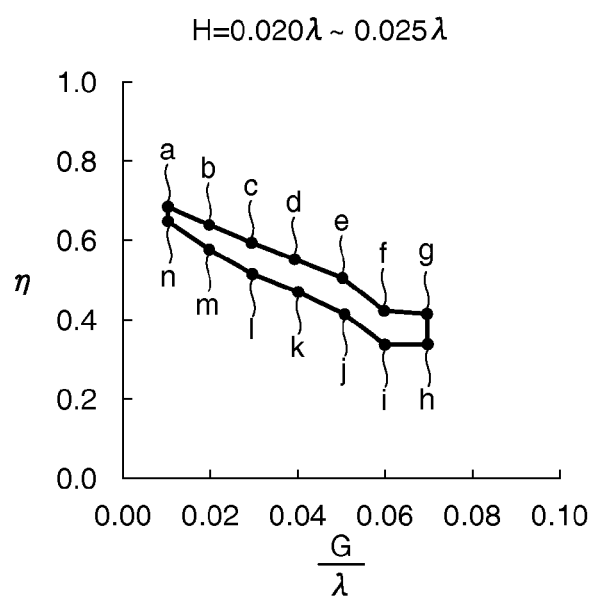

FIG. 31B is a graph illustrating the relationship between $\eta 2$ which satisfies the above-described range of $\beta$ and the groove depth G, when the electrode film thickness H is $0.020\lambda < H \le 0.025\lambda$, and Table 12 is a table illustrating the coordinates (G/λ, η) of principal measurement points for fixing the range shown in FIG. 31B, and the value of $\beta$ at the measurement points.

TABLE 12

| Point | G/λ | η | β (ppm/° C.²) |
|---|---|---|---|
| a | 0.010 | 0.690 | 0.030 × 10⁻¹ |
| b | 0.020 | 0.640 | 0.090 × 10⁻¹ |
| c | 0.030 | 0.590 | 0.090 × 10⁻¹ |
| d | 0.040 | 0.550 | 0.090 × 10⁻¹ |
| e | 0.050 | 0.510 | 0.080 × 10⁻¹ |
| f | 0.060 | 0.420 | 0.090 × 10⁻¹ |
| g | 0.070 | 0.415 | 0.080 × 10⁻¹ |
| h | 0.070 | 0.340 | −0.098 × 10⁻¹ |
| i | 0.060 | 0.340 | −0.100 × 10⁻¹ |
| j | 0.050 | 0.420 | −0.100 × 10⁻¹ |
| k | 0.040 | 0.470 | −0.100 × 10⁻¹ |

TABLE 12-continued

| Point | G/λ | η | β (ppm/° C.²) |
|---|---|---|---|
| l | 0.030 | 0.520 | −0.093 × 10⁻¹ |
| m | 0.020 | 0.580 | −0.100 × 10⁻¹ |
| n | 0.010 | 0.650 | −0.090 × 10⁻¹ |

From FIG. 31B and Table 12, it can be seen that when the electrode film thickness H at $\eta 2$ is within the above-described range, and when the groove depth G is in the range of $0.01\lambda \le G \le 0.07\lambda$, $\beta$ satisfies the above-described requirement in the area surrounded by the polygon with the measurement points a to n as the vertices.

Figure 32A:
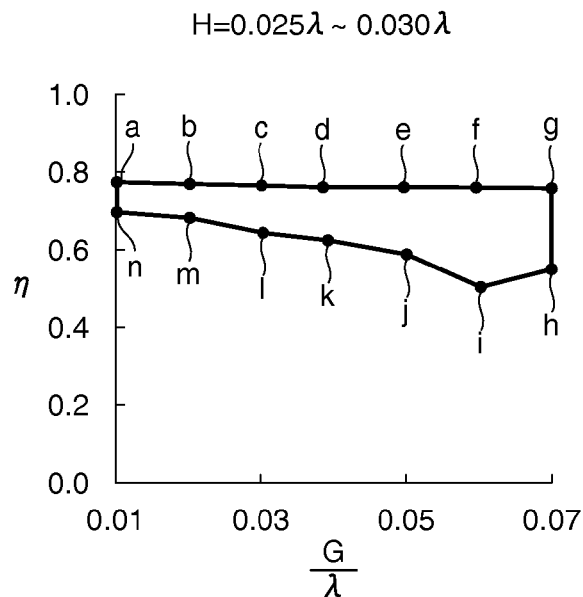
FIGS. 32A and 32B are diagrams illustrating a range in which $|\beta| \le 0.01$ (ppm/° C.$^2$) by means of graphs illustrating a relationship between the line occupation rate η and groove depth G when the electrode film thickness H is $0.025\lambda \le H < 0.030\lambda$, where

FIG. 32A is a graph illustrating the relationship between $\eta 1$ which satisfies the above-described range of $\beta$ and the groove depth G, when the electrode film thickness H is $0.025\lambda < H \le 0.030\lambda$, and Table 13 is a table illustrating the coordinates (G/λ, η) of principal measurement points for fixing the range shown in FIG. 32A, and the value of $\beta$ at the measurement points.

TABLE 13

| Point | G/λ | η | β (ppm/° C.²) |
|---|---|---|---|
| a | 0.010 | 0.770 | −0.098 × 10⁻¹ |
| b | 0.020 | 0.770 | −0.100 × 10⁻¹ |
| c | 0.030 | 0.770 | −0.100 × 10⁻¹ |
| d | 0.040 | 0.760 | −0.100 × 10⁻¹ |
| e | 0.050 | 0.760 | −0.099 × 10⁻¹ |
| f | 0.060 | 0.760 | −0.100 × 10⁻¹ |
| g | 0.070 | 0.760 | −0.100 × 10⁻¹ |
| h | 0.070 | 0.550 | 0.080 × 10⁻¹ |
| i | 0.060 | 0.505 | 0.087 × 10⁻¹ |
| j | 0.050 | 0.590 | 0.090 × 10⁻¹ |
| k | 0.040 | 0.620 | 0.100 × 10⁻¹ |
| l | 0.030 | 0.645 | 0.100 × 10⁻¹ |
| m | 0.020 | 0.680 | 0.083 × 10⁻¹ |
| n | 0.010 | 0.700 | 0.052 × 10⁻¹ |

From FIG. 32A and Table 13, it can be seen that when the electrode film thickness H at $\eta 1$ is within the above-described range, and when the groove depth G is in the range $0.01\lambda \le G \le 0.07\lambda$, $\beta$ satisfies the above-described requirement in the area surrounded by the polygon with the measurement points a to n as the vertices.

Figure 32B:
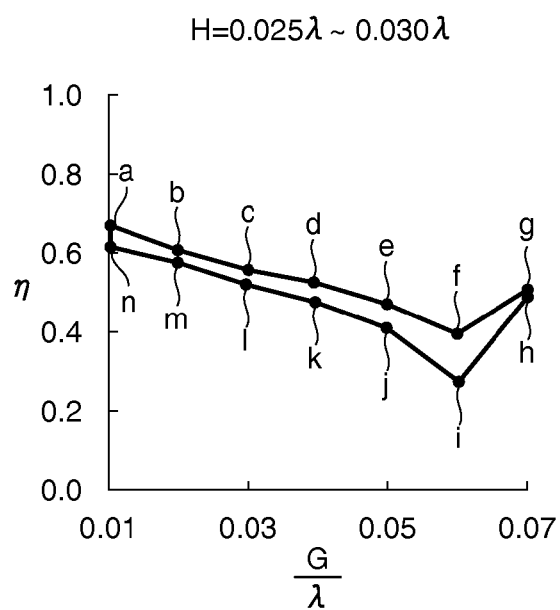

FIG. 32B is a graph illustrating the relationship between $\eta 2$ which satisfies the above-described range of $\beta$ and the groove depth G, when the electrode film thickness H is $0.025\lambda < H \le 0.030\lambda$, and Table 14 is a table illustrating the coordinates (G/λ, η) of principal measurement points for fixing the range shown in FIG. 32B, and the value of $\beta$ at the measurement points.

TABLE 14

| Point | G/λ | η | β (ppm/° C.²) |
|---|---|---|---|
| a | 0.010 | 0.670 | 0.052 × 10⁻¹ |
| b | 0.020 | 0.605 | 0.081 × 10⁻¹ |
| c | 0.030 | 0.560 | 0.092 × 10⁻¹ |
| d | 0.040 | 0.520 | 0.099 × 10⁻¹ |
| e | 0.050 | 0.470 | 0.086 × 10⁻¹ |
| f | 0.060 | 0.395 | 0.070 × 10⁻¹ |
| g | 0.070 | 0.500 | 0.080 × 10⁻¹ |
| h | 0.070 | 0.490 | −0.100 × 10⁻¹ |
| i | 0.060 | 0.270 | −0.100 × 10⁻¹ |
| j | 0.050 | 0.410 | −0.100 × 10⁻¹ |
| k | 0.040 | 0.470 | −0.100 × 10⁻¹ |
| l | 0.030 | 0.520 | −0.093 × 10⁻¹ |
| m | 0.020 | 0.580 | −0.099 × 10⁻¹ |
| n | 0.010 | 0.620 | −0.090 × 10⁻¹ |

From FIG. 32B and Table 14, it can be seen that when the electrode film thickness H at η2 is within the above-described range, and when the groove depth G is in the range of 0.01λ≤G≤0.07λ, β satisfies the above-described requirement in the area surrounded by the polygon with the measurement points a to n as the vertices.

Figure 33A:
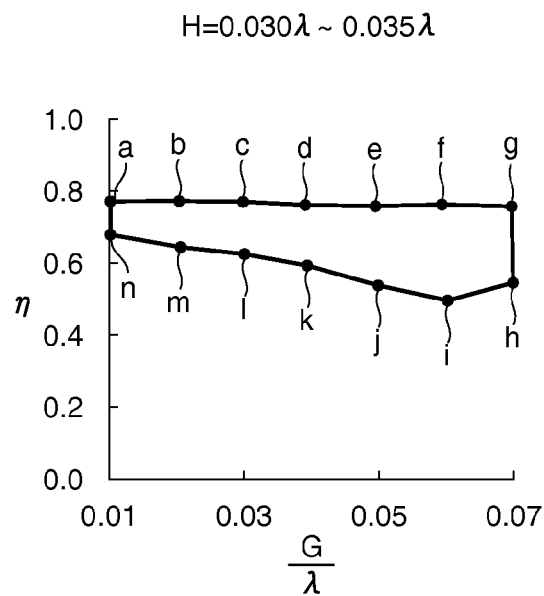
FIGS. 33A and 33B are diagrams illustrating a range in which $|\beta| \le 0.01$ (ppm/° C.$^2$) by means of graphs illustrating a relationship between the line occupation rate η and groove depth G when the electrode film thickness H is $0.030\lambda \le H < 0.035\lambda$, where

FIG. 33A is a graph illustrating the relationship between η1 which satisfies the above-described range of β and the groove depth G, when the electrode film thickness H is 0.030λ<H≤0.035λ, and Table 15 is a table illustrating the coordinates (G/λ, η) of principal measurement points for fixing the range shown in FIG. 33A, and the value of β at the measurement points.

TABLE 15

| Point | G/λ | η | β (ppm/° C.$^2$) |
|---|---|---|---|
| a | 0.010 | 0.770 | $-0.100 \times 10^{-1}$ |
| b | 0.020 | 0.770 | $-0.098 \times 10^{-1}$ |
| c | 0.030 | 0.770 | $-0.100 \times 10^{-1}$ |
| d | 0.040 | 0.760 | $-0.100 \times 10^{-1}$ |
| e | 0.050 | 0.760 | $-0.100 \times 10^{-1}$ |
| f | 0.060 | 0.760 | $-0.100 \times 10^{-1}$ |
| g | 0.070 | 0.760 | $-0.100 \times 10^{-1}$ |
| h | 0.070 | 0.550 | $0.090 \times 10^{-1}$ |
| i | 0.060 | 0.500 | $0.087 \times 10^{-1}$ |
| j | 0.050 | 0.545 | $0.090 \times 10^{-1}$ |
| k | 0.040 | 0.590 | $0.091 \times 10^{-1}$ |
| l | 0.030 | 0.625 | $0.080 \times 10^{-1}$ |
| m | 0.020 | 0.650 | $0.083 \times 10^{-1}$ |
| n | 0.010 | 0.680 | $0.093 \times 10^{-1}$ |

From FIG. 33A and Table 15, it can be seen that when the electrode film thickness H at η1 is within the above-described range, and when the groove depth G is in the range of 0.01λ≤G≤0.07λ, β satisfies the above-described requirement in the area surrounded by the polygon with the measurement points a to n as the vertices.

Figure 33B:
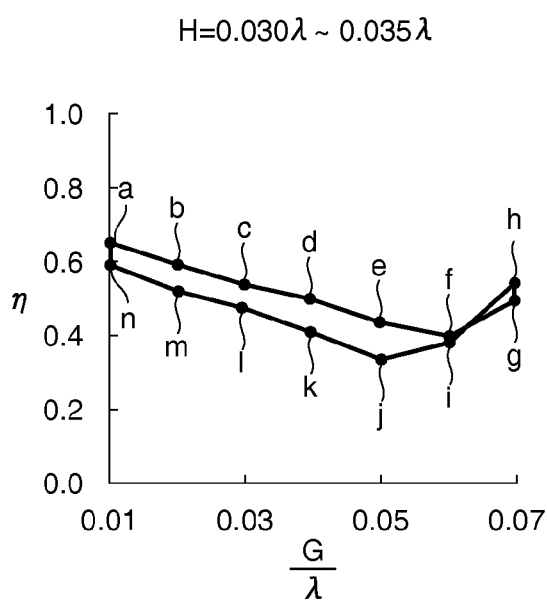
Figure 34A:
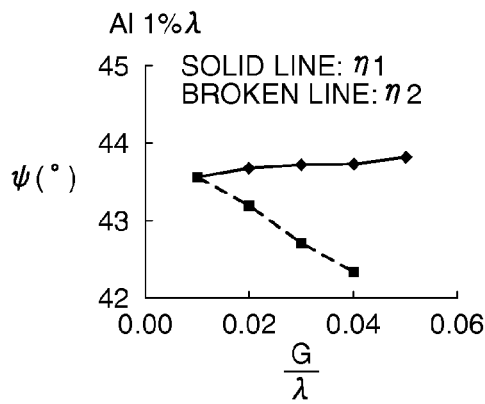
FIGS. 34A to 34F are graphs illustrating relationships between the inter-electrode finger groove depth and an Euler angle Ψ when the electrode film thickness and line occupation rate η (η1 solid line, η2: broken line) are fixed, where
Figure 34B:
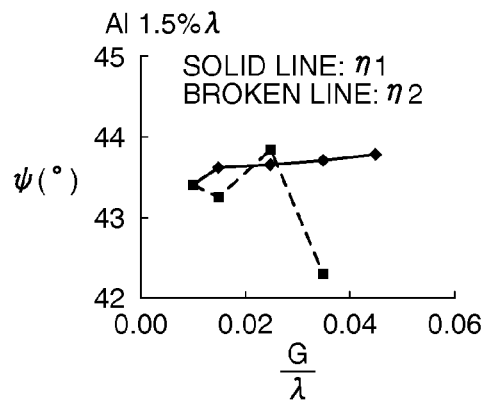
Figure 34C:
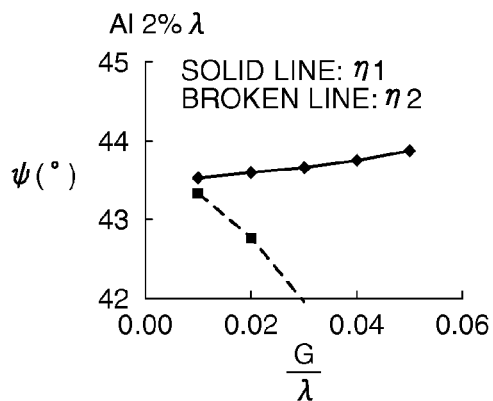
Figure 34D:
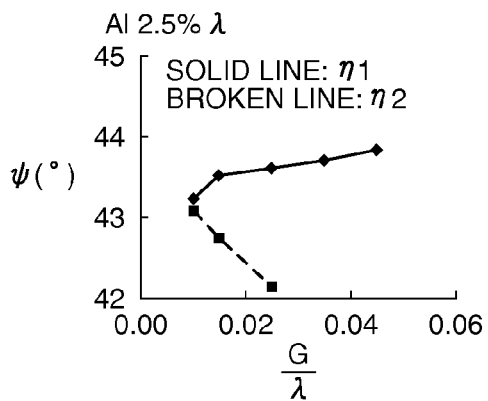
Figure 34E:
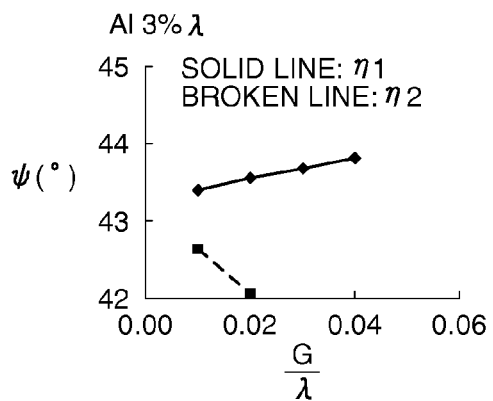
Figure 34F:
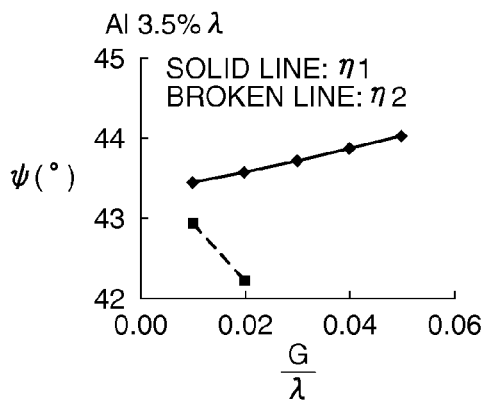

FIG. 33B is a graph illustrating the relationship between η2 which satisfies the above-described range of β and the groove depth G, when the electrode film thickness H is 0.030λ<H≤0.035λ, and Table 16 is a table illustrating the coordinates (G/λ, η) of principal measurement points for fixing the range shown in FIG. 33B, and the value of β at the measurement points.

TABLE 16

| Point | G/λ | η | β (ppm/° C.$^2$) |
|---|---|---|---|
| a | 0.010 | 0.655 | $0.080 \times 10^{-1}$ |
| b | 0.020 | 0.590 | $0.081 \times 10^{-1}$ |
| c | 0.030 | 0.540 | $0.092 \times 10^{-1}$ |
| d | 0.040 | 0.495 | $0.099 \times 10^{-1}$ |
| e | 0.050 | 0.435 | $0.090 \times 10^{-1}$ |
| f | 0.060 | 0.395 | $0.061 \times 10^{-1}$ |
| g | 0.070 | 0.500 | $0.090 \times 10^{-1}$ |
| h | 0.070 | 0.550 | $-0.100 \times 10^{-1}$ |
| i | 0.060 | 0.380 | $-0.090 \times 10^{-1}$ |
| j | 0.050 | 0.330 | $-0.100 \times 10^{-1}$ |
| k | 0.040 | 0.410 | $-0.095 \times 10^{-1}$ |
| l | 0.030 | 0.470 | $-0.099 \times 10^{-1}$ |
| m | 0.020 | 0.520 | $-0.100 \times 10^{-1}$ |
| n | 0.010 | 0.590 | $-0.100 \times 10^{-1}$ |

From FIG. 33B and Table 16, it can be seen that when the electrode film thickness H at η2 is within the above-described range, and when the groove depth G is in the range of 0.01λ≤G≤0.07λ, β satisfies the above-described requirement in the area surrounded by the polygon with the measurement points a to n as the vertices.

Figure 35:
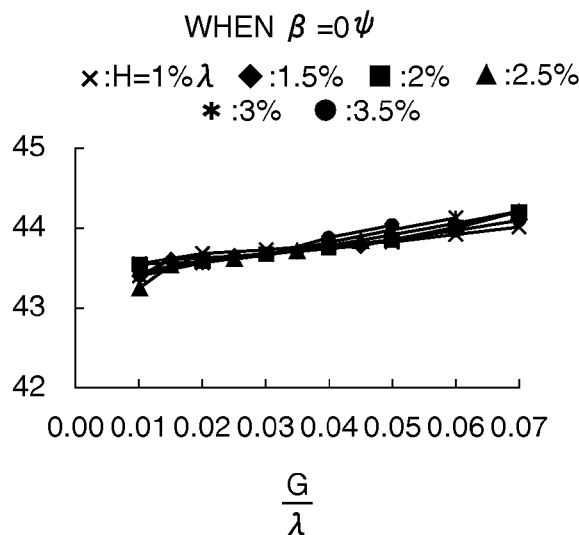
FIG. 35 is a diagram in which the relationships between the inter-electrode finger groove depth G and Euler angle Ψ for each electrode film thickness H are summarized in a graph.

The relationship between Ψ and the groove depth G obtained from η1 in the graphs shown in FIGS. 34A to 34F is summarized in FIG. 35. The reason for selecting η1 is as described above. As shown in FIG. 35, there is hardly any change in the angle Ψ, even though the thickness of the electrode film changes, and it is seen that the optimum angle Ψ changes in accordance with the fluctuation of the groove depth G. It can be said that this too is proof that a high proportion of the change in the second-order temperature coefficient β is due to the form of the quartz crystal substrate 30.

Figure 36:
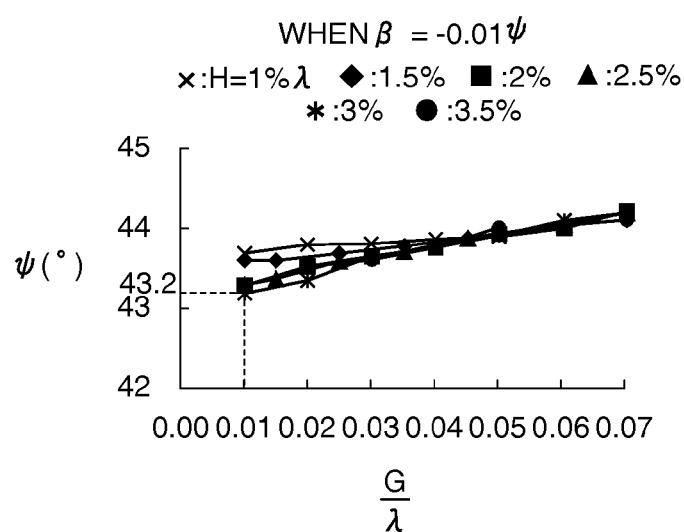
FIG. 36 is a graph illustrating a relationship between an inter-electrode finger groove depth at which the second-order temperature coefficient β is −0.01 (ppm/° C.$^2$) and the Euler angle Ψ.
Figure 37:
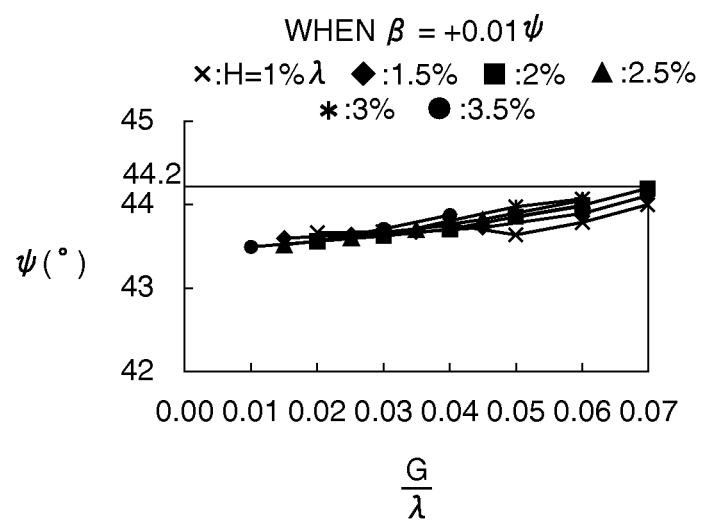
FIG. 37 is a graph illustrating a relationship between an inter-electrode finger groove depth at which the second-order temperature coefficient β is +0.01 (ppm/° C.$^2$) and the Euler angle Ψ.

In the same way as described above, the relationships between the groove depth G and Ψ when the second-order temperature coefficient β=−0.01 (ppm/° C.$^2$), and Ψ when β=+0.01 (ppm/° C.$^2$), are obtained, and summarized in FIGS. 36 and 37. By obtaining from these graphs (FIGS. 35 to 37) the angles Ψ at which it is possible to achieve −0.01≤β≤+0.01, it is possible to fix the preferable Ψ angle range under the above-described conditions at 43°<Ψ<45°, and it is possible to more preferably fix the range at 43.2°≤Ψ≤44.2°.

A simulation is carried out for the range of Ψ which satisfies the requirement |β|≤0.01 (ppm/° C.$^2$) when changing the groove depth G, in the case of changing the electrode film thickness H. The results of the simulation are shown in FIGS. 38A to 44B. The quartz crystal substrates used are all ones with Euler angles (0°, 123°, and Ψ), and with regard to Ψ, an angle at which ΔF is smallest is appropriately selected.

Figure 38A:
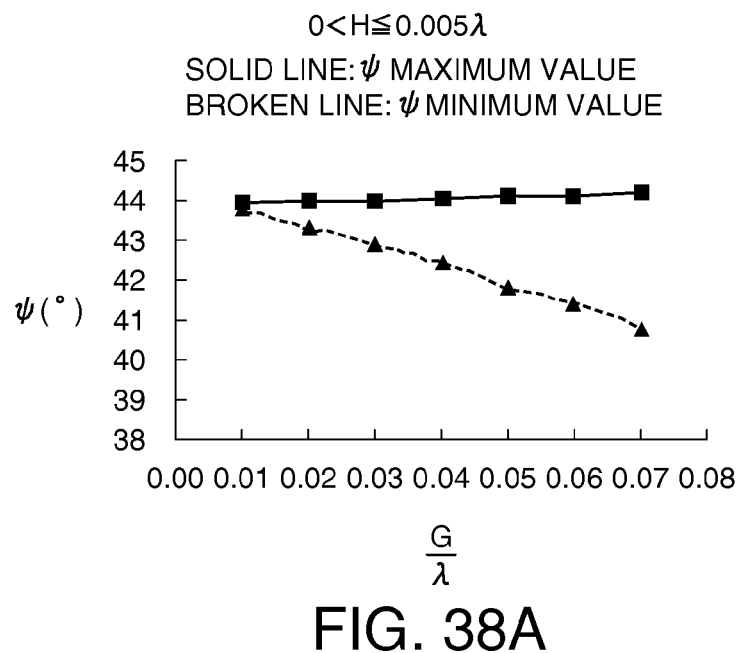
FIGS. 38A and 38B are graphs illustrating a range of Ψ which satisfies the requirement of |β|≤0.01 (ppm/° C.$^2$) when the range of the electrode film thickness H is 0<H≤0.005λ, where

FIG. 38A is a graph illustrating the range of Ψ which satisfies the requirement |β|≤0.01 (ppm/° C.$^2$) when the range of the electrode film thickness H is 0<H≤0.005λ. Here, the range sandwiched by the straight line connecting the plots indicating the maximum value of Ψ and the broken line connecting the plots indicating the minimum value of Ψ is the range which satisfies the above-described condition.

Figure 38B:
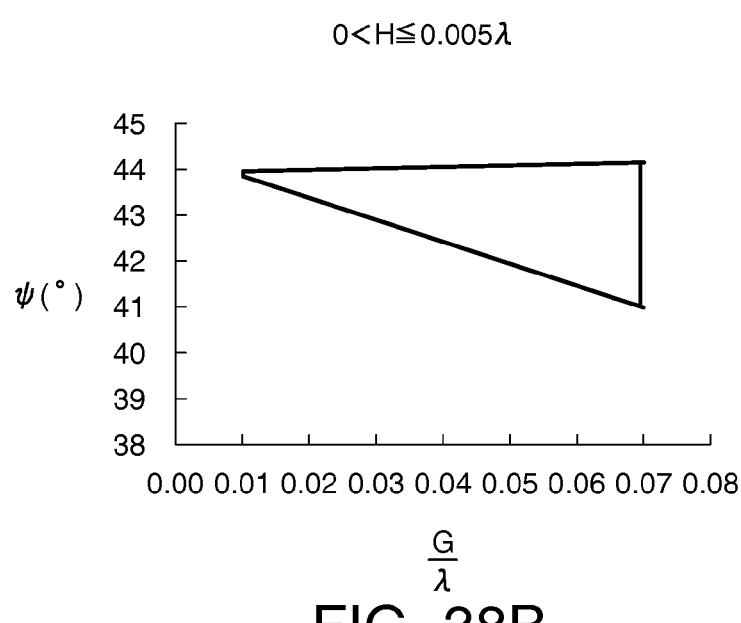

In the groove depth G in the range of 0.01λ≤G≤0.0695λ, when approximating the range of the solid line and broken line shown in FIG. 38A as a polygon, it can be shown as in FIG. 38B, and it can be said that β satisfies the above-described condition in a range corresponding to the interior of the polygon shown by the solid lines in FIG. 38B. When expressing the range of the polygon shown in FIG. 38B in an approximate equation, it can be expressed by Equations (14) and (15).

$$\Psi \leq 3.0 \times G/\lambda + 43.92 \text{ provided that } 0.0100\lambda \leq G \leq 0.0695\lambda \quad (14)$$

$$\Psi \leq -48.0 \times G/\lambda + 44.35 \text{ provided that } 0.0100\lambda \leq G \leq 0.0695\lambda \quad (15)$$

Figure 39A:
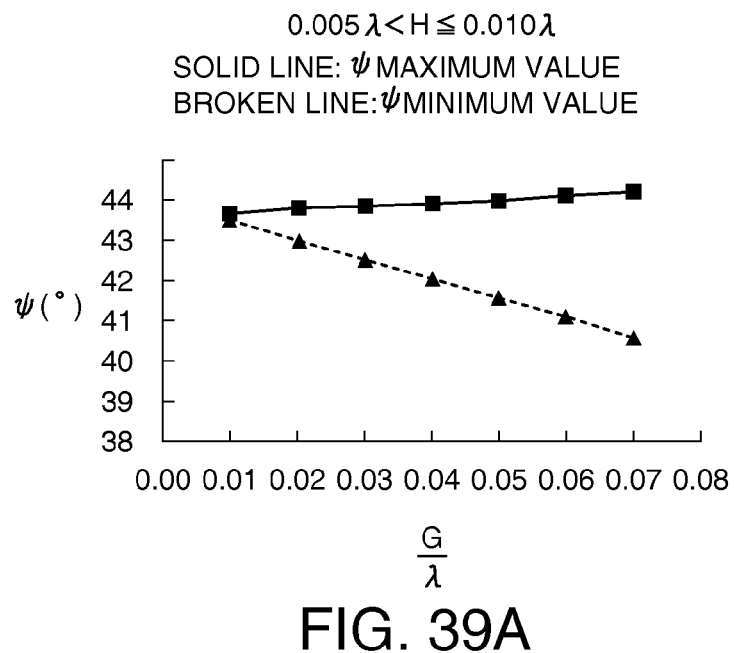
FIGS. 39A and 39B are graphs illustrating a range of Ψ which satisfies the requirement of |β|≤0.01 (ppm/° C.$^2$) when the range of the electrode film thickness H is 0.005λ<H≤0.010λ, where

FIG. 39A is a graph illustrating the range of Ψ which satisfies the requirement |β|≤0.01 (ppm/° C.$^2$) when the range of the electrode film thickness H is 0.005λ≤H≤0.010λ. Here, the range sandwiched by the straight line connecting the plots indicating the maximum value of Ψ and the broken line connecting the plots indicating the minimum value of Ψ is the range which satisfies the above-described condition.

Figure 39B:
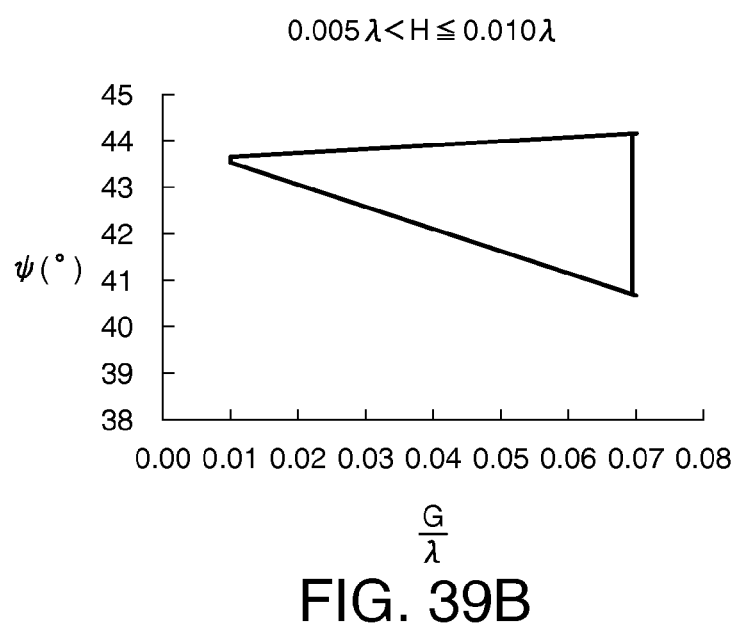

In the groove depth G in the range of 0.01λ≤G≤0.0695λ, when approximating the range of the solid line and broken line shown in FIG. 39A as a polygon, it can be shown as in FIG. 39B, and it can be said that β satisfies the above-described condition in a range corresponding to the interior of the polygon shown by the solid lines in FIG. 39B. When expressing the range of the polygon shown in FIG. 39B in an approximate equation, it can be expressed by Equations (16) and (17).

$$\Psi \leq 8.0 \times G/\lambda + 43.60 \text{ provided that } 0.0100\lambda \leq G \leq 0.0695\lambda \quad (16)$$

$$\Psi \leq -48.0 \times G/\lambda + 44.00 \text{ provided that } 0.0100\lambda \leq G \leq 0.0695\lambda \quad (17)$$

Figure 40A:
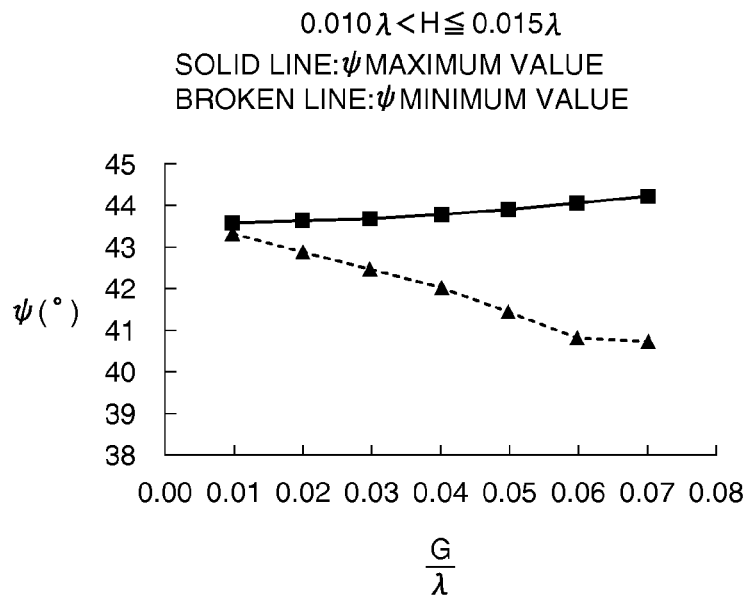
FIGS. 40A and 40B are graphs illustrating a range of Ψ which satisfies the requirement of |β|≤0.01 (ppm/° C.$^2$) when the range of the electrode film thickness H is 0.010λ<H≤0.015λ, where

FIG. 40A is a graph illustrating the range of Ψ which satisfies the requirement |β|≤0.01 (ppm/° C.$^2$) when the range of the electrode film thickness H is 0.010λ≤H≤0.015λ. Here, the range sandwiched by the straight line connecting the plots indicating the maximum value of Ψ and the broken line connecting the plots indicating the minimum value of Ψ is the range which satisfies the above-described condition.

Figure 40B:
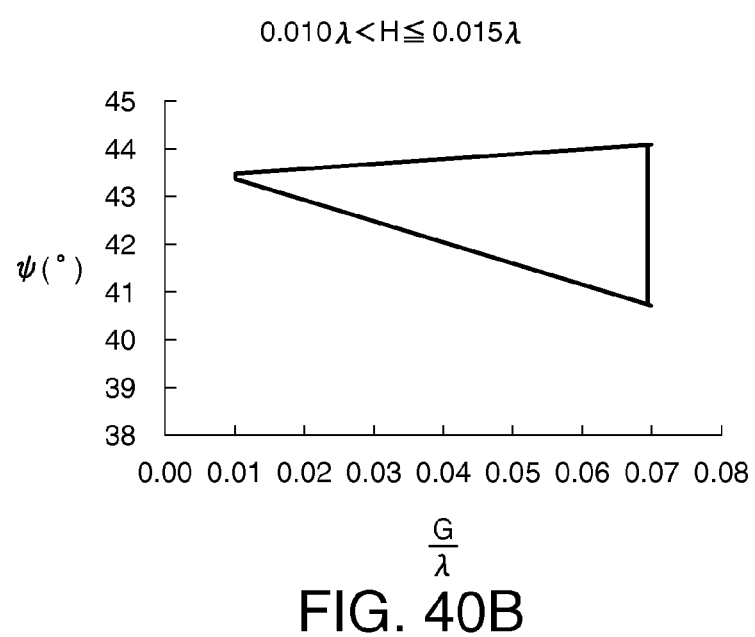

In the groove depth G in the range of 0.01λ≤G≤0.0695λ, when approximating the range of the solid line and broken line shown in FIG. 40A as a polygon, it can be shown as in FIG. 40B, and it can be said that β satisfies the above-described condition in a range corresponding to the interior of the polygon shown by the solid lines in FIG. 40B. When expressing the range of the polygon shown in FIG. 40B in an approximate equation, it can be expressed by Equations (18) and (19).

$$\Psi \leq 10.0 \times G/\lambda + 43.40 \text{ provided that } 0.0100\lambda \leq G \leq 0.0695\lambda \quad (18)$$

$$\Psi \geq -44.0 \times G/\lambda + 43.80 \text{ provided that } 0.0100\lambda \leq G \leq 0.0695\lambda \quad (19)$$

Figure 41A:
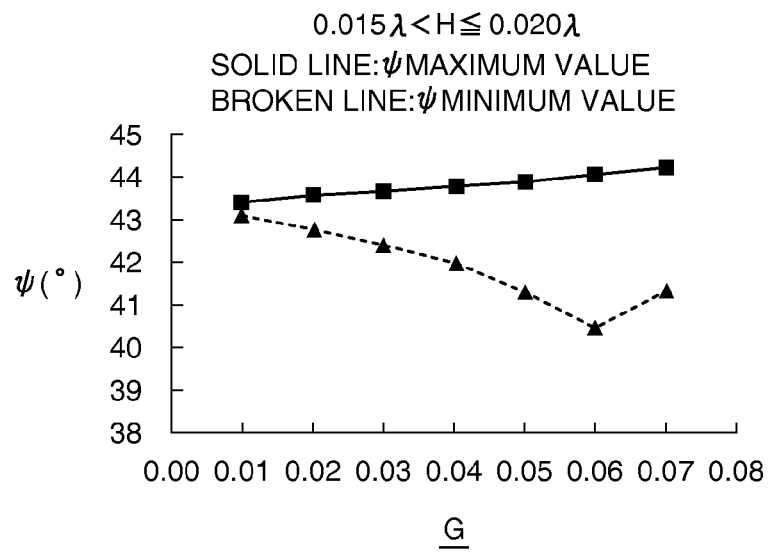
FIGS. 41A and 41B are graphs illustrating a range of Ψ which satisfies the requirement of |β|≤0.01 (ppm/° C.$^2$) when the range of the electrode film thickness H is 0.015λ<H≤0.020λ, where

FIG. 41A is a graph illustrating the range of Ψ which satisfies the requirement |β|≤0.01 (ppm/° C.$^2$) when the range of the electrode film thickness H is 0.015λ≤H≤0.020λ. Here, the range sandwiched by the straight line connecting the plots indicating the maximum value of Ψ and the broken line connecting the plots indicating the minimum value of Ψ is the range which satisfies the above-described condition.

Figure 41B:
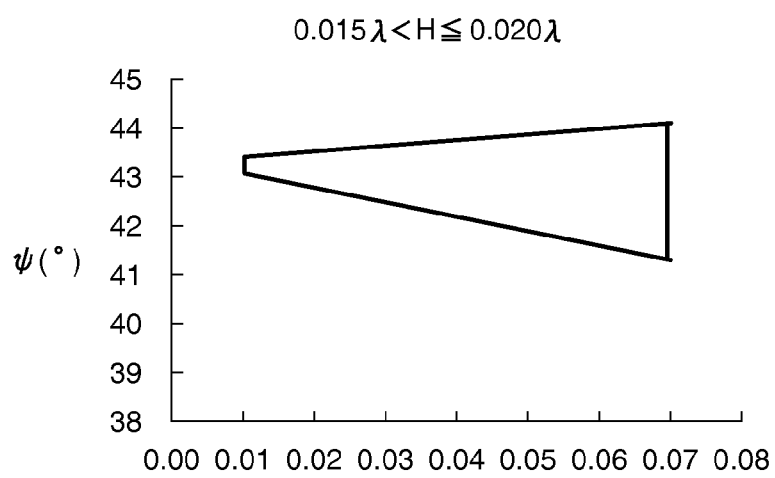

In the groove depth G in the range of 0.01λ≤G≤0.0695λ, when approximating the range of the solid line and broken line shown in FIG. 41A as a polygon, it can be shown as in FIG. 41B, and it can be said that β satisfies the above-described condition in a range corresponding to the interior of the polygon shown by the solid lines in FIG. 41B. When expressing the range of the polygon shown in FIG. 41B in an approximate equation, it can be expressed by Equations (20) and (21).

$$\Psi \leq 12.0 \times G/\lambda + 43.31 \text{ provided that } 0.0100\lambda \leq G \leq 0.0695\lambda \quad (20)$$

$$\Psi \geq -30.0 \times G/\lambda + 43.40 \text{ provided that } 0.0100\lambda \leq G \leq 0.0695\lambda \quad (21)$$

Figure 42A:
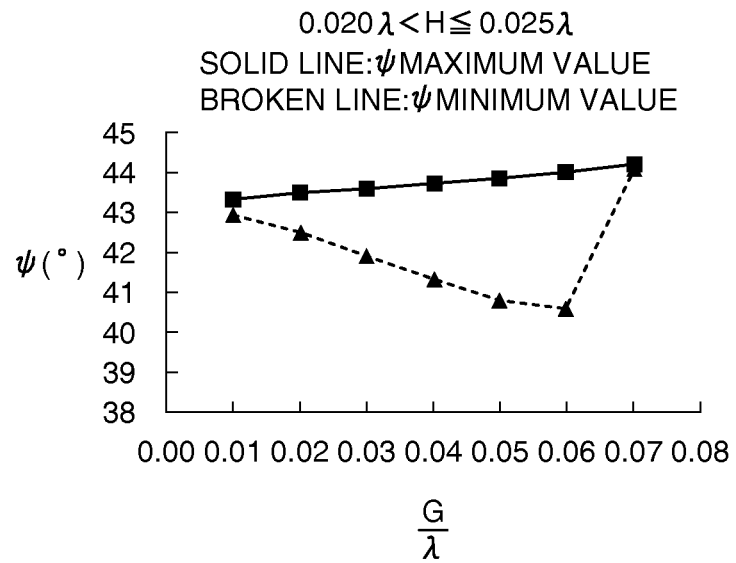
FIGS. 42A and 42B are graphs illustrating a range of Ψ which satisfies the requirement of |β|≤0.01 (ppm/° C.$^2$) when the range of the electrode film thickness H is 0.020λ<H≤0.025λ, where

FIG. 42A is a graph illustrating the range of Ψ which satisfies the requirement |β|≤0.01 (ppm/° C.$^2$) when the range of the electrode film thickness H is 0.020λ≤H≤0.025λ. Here, the range sandwiched by the straight line connecting the plots indicating the maximum value of Ψ and the broken line connecting the plots indicating the minimum value of Ψ is the range which satisfies the above-described condition.

Figure 42B:
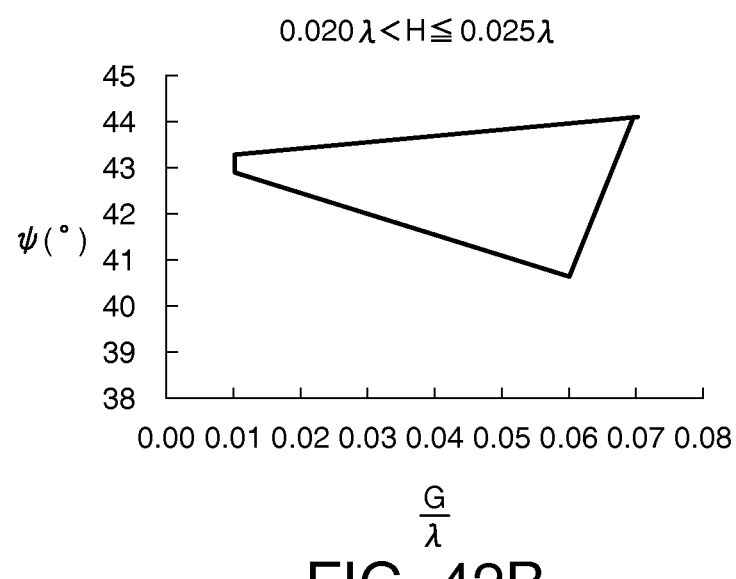

In the groove depth G in the range of 0.01λ≤G≤0.0695λ, when approximating the range of the solid line and broken line shown in FIG. 42A as a polygon, it can be shown as in FIG. 42B, and it can be said that β satisfies the above-described condition in a range corresponding to the interior of the polygon shown by the solid lines in FIG. 42B. When expressing the range of the polygon shown in FIG. 42B in an approximate equation, it can be expressed by Equations (22) to (24).

$$\Psi \leq 14.0 \times G/\lambda + 43.16 \text{ provided that } 0.0100\lambda \leq G \leq 0.0695\lambda \quad (22)$$

$$\Psi \geq -45.0 \times G/\lambda + 43.45 \text{ provided that } 0.0100\lambda \leq G \leq 0.0600\lambda \quad (23)$$

$$\Psi \geq 367.368 \times G/\lambda + 18.608 \text{ provided that } 0.0600\lambda \leq G \leq 0.0695\lambda \quad (24)$$

Figure 43A:
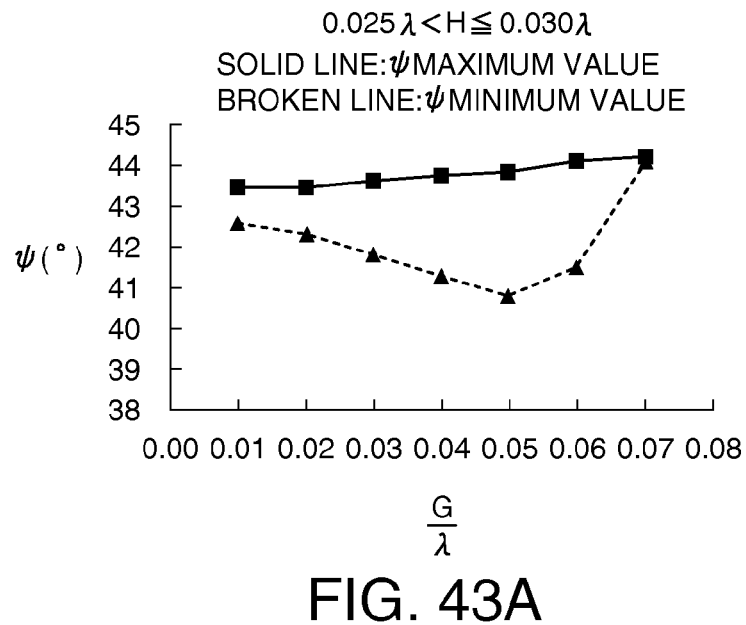
FIGS. 43A and 43B are graphs illustrating a range of Ψ which satisfies the requirement of |β|≤0.01 (ppm/° C.$^2$) when the range of the electrode film thickness H is 0.025λ<H≤0.030λ, where

FIG. 43A is a graph illustrating the range of Ψ which satisfies the requirement |β|≤0.01 (ppm/° C.$^2$) when the range of the electrode film thickness H is 0.025λ≤H≤0.030λ. Here, the range sandwiched by the straight line connecting the plots indicating the maximum value of Ψ and the broken line connecting the plots indicating the minimum value of Ψ is the range which satisfies the above-described condition.

Figure 43B:
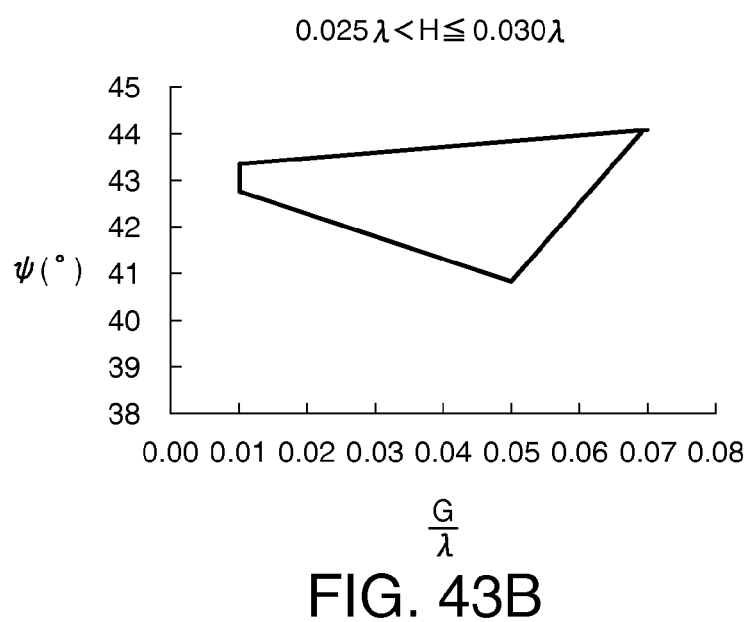

In the groove depth G in the range of 0.01λ≤G≤0.0695λ, when approximating the range of the solid line and broken line shown in FIG. 43A as a polygon, it can be shown as in FIG. 43B, and it can be said that β satisfies the above-described condition in a range corresponding to the interior of the polygon shown by the solid lines in FIG. 43B. When expressing the range of the polygon shown in FIG. 43B in an approximate equation, it can be expressed by Equations (25) to (27).

$$\Psi \leq 12.0 \times G/\lambda + 43.25 \text{ provided that } 0.0100\lambda \leq G \leq 0.0695\lambda \quad (25)$$

$$\Psi \geq -50.0 \times G/\lambda + 43.32 \text{ provided that } 0.0100\lambda \leq G \leq 0.0500\lambda \quad (26)$$

$$\Psi \geq 167.692 \times G/\lambda + 32.435 \text{ provided that } 0.0500\lambda \leq G \leq 0.0695\lambda \quad (27)$$

Figure 44A:
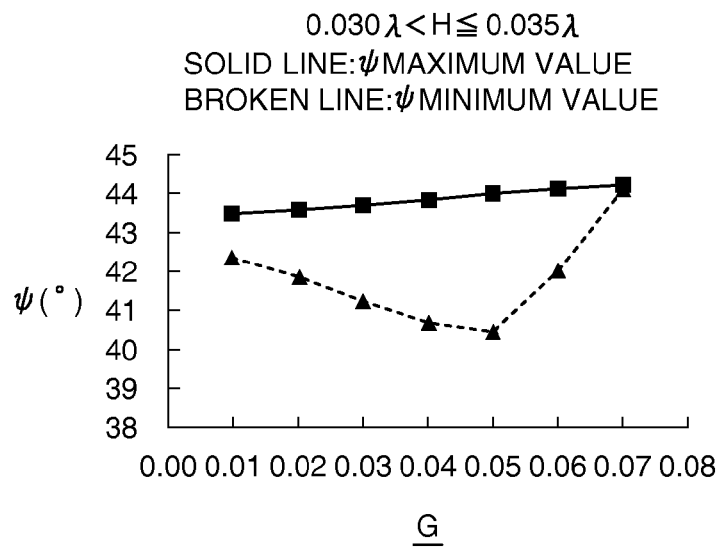
FIGS. 44A and 44B are graphs illustrating a range of Ψ which satisfies the requirement of |β|≤0.01 (ppm/° C.$^2$) when the range of the electrode film thickness H is 0.030λ<H≤0.035λ, where

FIG. 44A is a graph illustrating the range of Ψ which satisfies the requirement |β|≤0.01 (ppm/° C.$^2$) when the range of the electrode film thickness H is 0.030λ≤H≤0.035λ. Here, the range sandwiched by the straight line connecting the plots indicating the maximum value of Ψ and the broken line connecting the plots indicating the minimum value of is the range which satisfies the above-described condition.

Figure 44B:
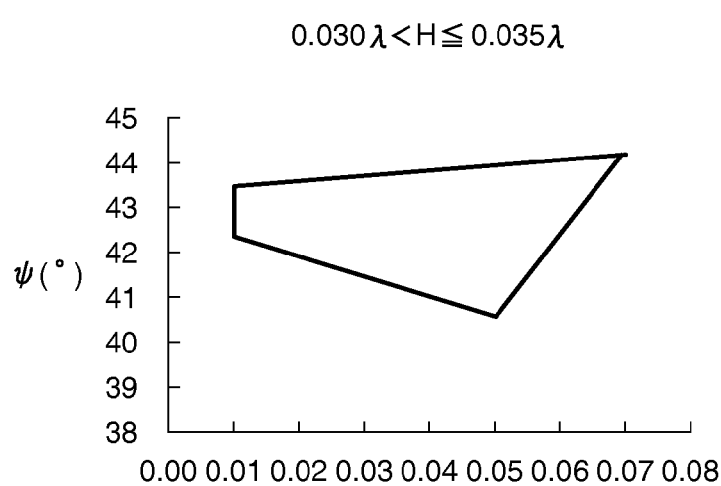

In the groove depth G in the range of 0.01≤G≤0.0695λ, when approximating the range of the solid line and broken line shown in FIG. 44A as a polygon, it can be shown as in FIG. 44B, and it can be said that β satisfies the above-described condition in a range corresponding to the interior of the polygon shown by the solid lines in FIG. 44B. When expressing the range of the polygon shown in FIG. 44B in an approximate equation, it can be expressed by Equations (28) to (30).

$$\Psi \leq 12.0 \times G/\lambda + 43.35 \text{ provided that } 0.0100\lambda \leq G \leq 0.0695\lambda \quad (28)$$

$$\Psi \leq -45.0 \times G/\lambda + 42.80 \text{ provided that } 0.0100\lambda \leq G \leq 0.0500\lambda \quad (29)$$

$$\Psi \leq -186.667 \times G/\lambda + 31.217 \text{ provided that } 0.0500\lambda \leq G \leq 0.0695\lambda \quad (30)$$

Figure 45:
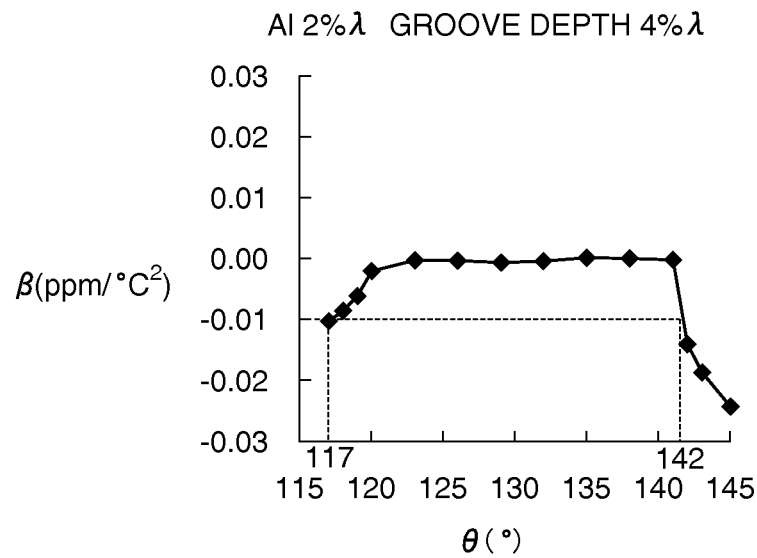
FIG. 45 is a graph illustrating a relationship between an Euler angle θ and the second-order temperature coefficient β when the electrode film thickness is 0.02λ and the inter-electrode finger groove depth is 0.04λ.

Next, the change in the second-order temperature coefficient β when the angle θ is altered, that is, the relationship between θ and the second-order temperature coefficient β, is shown in FIG. 45. Here, the SAW device used in the simulation is a quartz crystal substrate with cut angles and SAW propagation direction of (0, θ, and Ψ) in Euler angle representation, with a groove depth G of 0.04λ, and the electrode film thickness H is 0.02λ. With regard to Ψ, a value at which the absolute value of the second-order temperature coefficient β is smallest in the above-described angle range is appropriately selected, based on the θ setting angle. In addition, with regard to η, it is 0.6383, in accordance with Equation (8).

Under these conditions, from FIG. 45, which shows the relationship between θ and the second-order temperature coefficient β, it can be seen that, provided that θ is within the range of 117° or more to 142° or less, the absolute values of the second-order temperature coefficient β are within a range of 0.01 (ppm/° C.$^2$). Therefore, it can be said that, with the above-described setting values, by fixing θ in the range of $117° \leq \theta \leq 142°$, it is possible to configure a SAW resonator 10 which has good frequency-temperature characteristics.

Tables 17 to 19 are shown as simulation data proving the relationship between θ and the second-order temperature coefficient β.

TABLE 17

| H/λ % | G/λ % | θ ° | β ppm/° C.² |
|---|---|---|---|
| 0.01 | 4.00 | 117 | $-0.09 \times 10^{-1}$ |
| 0.01 | 4.00 | 142 | $0.05 \times 10^{-1}$ |
| 3.50 | 4.00 | 117 | $-0.09 \times 10^{-1}$ |
| 3.50 | 4.00 | 142 | $-0.08 \times 10^{-1}$ |

Table 17 being a table illustrating the relationship between θ and the second-order temperature coefficient β when the electrode film thickness H is changed, it shows the values of the second-order temperature coefficient β at the critical values (117° and 142°) of θ when the electrode film thickness H is 0.01%λ, and when the electrode film thickness H is 3.50%λ. The groove depths G in the simulation are all 4%λ. From Table 17, it can be seen that, in the range of $117° \leq \theta \leq 142°$, even though the thickness of the electrode film thickness H is changed (0≈0.01%λ and 3.5%λ stipulated as critical values of the electrode film thickness), $|\beta| \leq 0.01$ (ppm/° C.²) is satisfied regardless of the thickness.

TABLE 18

| H/λ % | G/λ % | θ ° | β ppm/° C.² |
|---|---|---|---|
| 2.00 | 1.00 | 117 | $-0.09 \times 10^{-1}$ |
| 2.00 | 1.00 | 142 | $-0.08 \times 10^{-1}$ |
| 2.00 | 6.95 | 117 | $-0.09 \times 10^{-1}$ |
| 2.00 | 6.95 | 142 | $-0.09 \times 10^{-1}$ |

Table 18 being a table illustrating the relationship between θ and the second-order temperature coefficient β when the groove depth G is changed, it shows the values of the second-order temperature coefficient β at the critical values (117° and 142°) of θ when the groove depth G is 1.00%λ, and 6.95%λ. The electrode film thicknesses H in the simulation are all 2.00%λ. From Table 18, it can be seen that, in the range of $117° \leq \theta \leq 142°$, even though the groove depth G is changed (1.00%λ, and 6.95%λ, stipulated as critical values of the groove depth G), $|\beta| \leq 0.01$ (ppm/° C.²) is satisfied regardless of the depth.

TABLE 19

| H/λ % | G/λ % | η | θ ° | β ppm/° C.² |
|---|---|---|---|---|
| 2.00 | 4.00 | 0.62 | 117 | $-0.10 \times 10^{-1}$ |
| 2.00 | 4.00 | 0.62 | 142 | $-0.03 \times 10^{-1}$ |
| 2.00 | 4.00 | 0.76 | 117 | $-0.09 \times 10^{-1}$ |
| 2.00 | 4.00 | 0.76 | 142 | $-0.09 \times 10^{-1}$ |

Table 19 being a table illustrating the relationship between θ and the second-order temperature coefficient β when the line occupation rate η is changed, it shows the values of the second-order temperature coefficient β at the critical values (117° and 142°) of θ when the line occupation rate η is 0.62 and 0.76. The electrode film thicknesses H in the simulation are all 2.00%λ, and the groove depths G are all 4.00%λ. From Table 19, it can be seen that, in the range of $117° \leq \theta \leq 142°$, even though the line occupation rate η is changed (η=0.62 and 0.76 are the minimum value and maximum value of η when the groove depth is 4%λ in FIG. 31A, which shows the relationship between the line occupation rate η (η1) and groove depth G with the electrode film thickness H in the range of 0.020λ to 0.025λ), $|\beta| \leq 0.01$ (ppm/° C.²) is satisfied regardless of the value.

Figure 46:
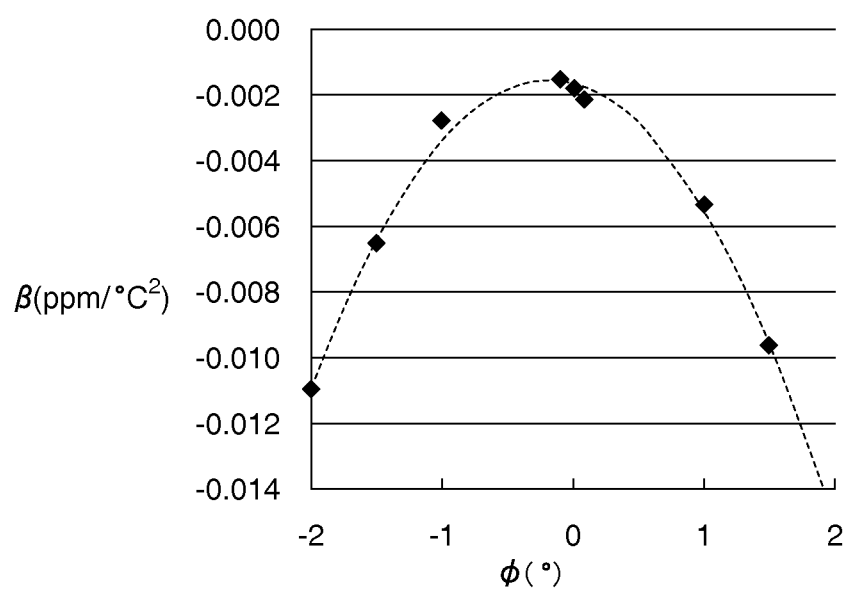
FIG. 46 is a graph illustrating a relationship between an Euler angle φ and the second-order temperature coefficient β.

FIG. 46 is a graph illustrating the relationship between the angle φ and the second-order temperature coefficient β in a case of using a quartz crystal substrate 30 of (φ, 123°, and 43.77°) in Euler angle representation, with a groove depth G of 0.04λ, an electrode film thickness H of 0.02λ, and a line occupation rate η of 0.65.

From FIG. 46, it can be seen that when φ is −2° and +2°, the second-order temperature coefficient β is lower than −0.01 (ppm/° C.²) in each case, but provided that φ is in the range of −1.5° to +1.5°, the absolute values of the second-order temperature coefficient β are consistently a range of less than 0.01 (ppm/° C.²). Therefore, with the above-described kinds of setting value, by fixing φ in the range of −1.5°≤φ≤+1.5°, or preferably −1°≤φ≤1°, it is possible to configure a SAW resonator 10 which has good frequency-temperature characteristics.

Figure 47:
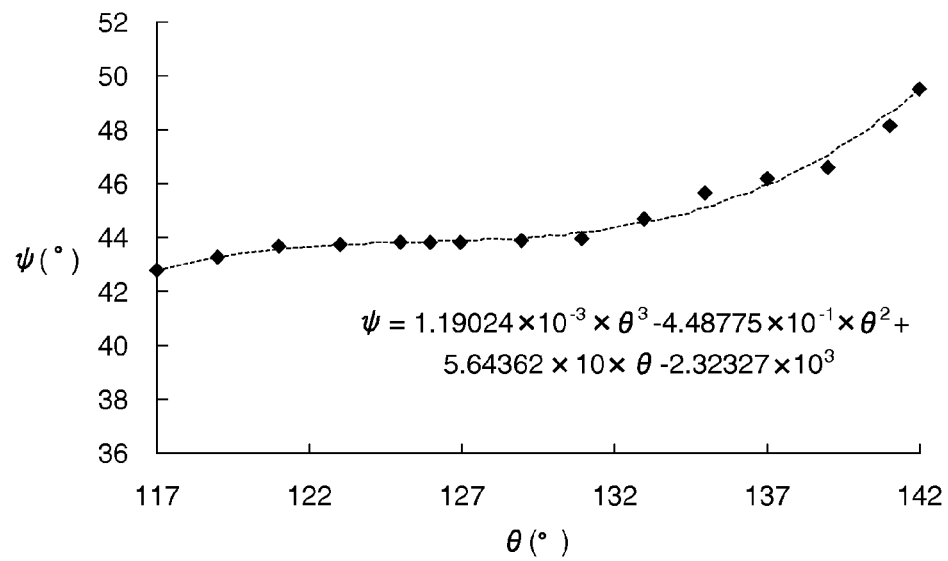
FIG. 47 is a graph illustrating a relationship between the Euler angle θ and Euler angle Ψ when the frequency-temperature characteristics are good.

In the above description, the range of optimum values of each of φ, θ, and Ψ is derived for the relationship with the groove depth G under specific conditions. In contrast to this, an extremely preferable relationship between θ and Ψ, where the frequency fluctuation amount at −40° C. to +85° C. is smallest, is shown in FIG. 47, and an approximate equation is obtained. According to FIG. 47, the angle Ψ changes along with an increase of the angle θ, increasing so as to describe a cubic curve. In the example of FIG. 47, Ψ is 42.79° when θ=117°, and Ψ is 49.57° when θ=142°. When illustrating these plots as an approximate curve, they become the curve shown by the broken line in FIG. 47, and can be expressed as an approximate equation by Equation (31).

$$\Psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad (31)$$

Because of this, it is possible to fix Ψ by θ being fixed, and it is possible to make the range of Ψ 42.79°≤Ψ≤9.57° when the range of θ is $117° \leq \theta \leq 142°$. The groove depth G and electrode film thickness H in the simulation are G=0.04λ, and H=0.02λ.

Due to the above-described kinds of reason, by configuring the SAW resonator 10 in accordance with the various conditions fixed in the embodiment, it is possible to obtain a SAW resonator which can realize good frequency-temperature characteristics fulfilling the target values.

Figure 54:
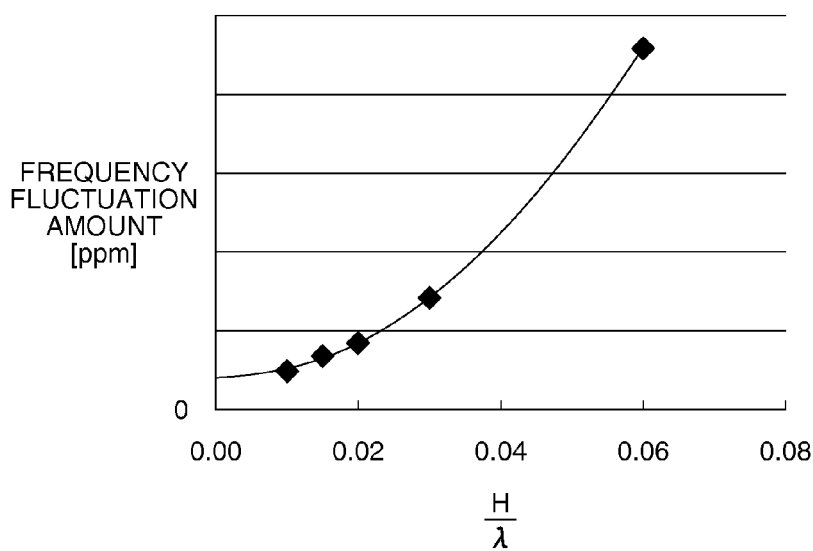
FIG. 54 is a graph illustrating a relationship between the electrode film thickness H and frequency fluctuation in a heat cycle test.

In addition, with the SAW resonator 10 according to the embodiment, the improvement in the frequency-temperature characteristics is sought by having the film thickness H of the electrode film in the range of 0<H≤0.035λ, as shown in Equation (7) and FIGS. 15A to 26F. This, differing from the improvement in the frequency-temperature characteristics by making the film thickness H extremely large such as in the related art, realizes the improvement in the frequency-temperature characteristics while still maintaining environmental resistance characteristics. The relationship between the electrode film thickness (Al electrode film thickness) and frequency fluctuation in a heat cycle test is shown in FIG. 54. The results of the heat cycle test shown in FIG. 54 are taken after a cycle in which the SAW resonator is exposed to an atmosphere of −55° C. for 30 minutes, then exposed for 30 minutes with the atmosphere temperature raised to +125° C., is repeated eight times. From FIG. 54, it can be seen that the frequency fluctuation (F fluctuation) in the range of the electrode film thickness H of the SAW resonator 10 according to the embodiment is ⅓ or less in comparison with that of a case where the electrode film thickness H is 0.06λ, and where no inter-electrode finger groove is provided. For every plot in FIG. 54, H+G=0.06λ.

In addition, on carrying out a high temperature storage test on a SAW resonator manufactured under the same conditions as those in FIG. 54, exposing it to an atmosphere of 125° C. for 1,000 hours, it is confirmed that the frequency fluctuation amount of the SAW resonator according to the embodiment before and after testing (the four conditions H=0.03λ and G=0.03λ, H=0.02λ and G=0.04λ, H=0.015λ and G=0.045λ, and H=0.01λ and G=0.05λ) is ⅓ or less in comparison with that of the SAW resonator (H=0.06λ and G=0) in the related art.

Figure 48:
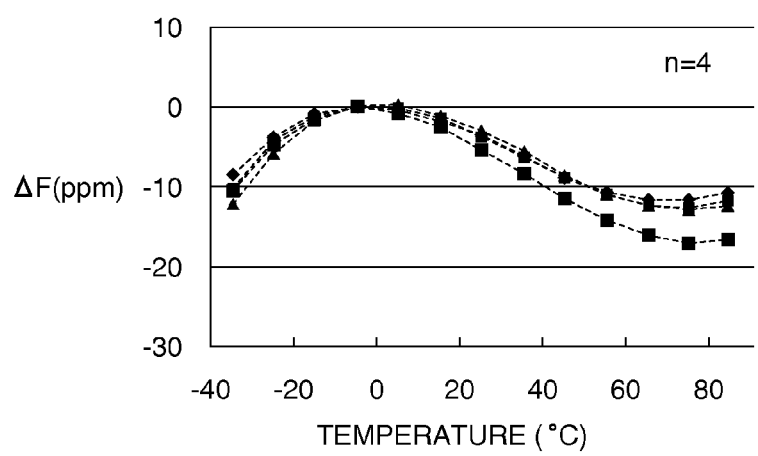
FIG. 48 is a diagram illustrating an example of frequency-temperature characteristics data from four test specimens under conditions at which the frequency-temperature characteristics are best.

In the SAW resonator 10 manufactured under the above-described conditions, conditions where H+G=0.067λ (aluminum film thickness 2,000 angstrom, groove depth 4,700 ANGSTROM), the IDT line occupation rate ηi=0.6, the reflector line occupation rate ηr=0.8, the Euler angles are (0°, 123°, and 43.5°), the IDT pair number is 120, the intersection width is 40λ (λ=10 μm), the number of reflectors (one side) is 72 (36 pairs), and the electrode fingers have no angle of tilt (the electrode finger array direction and SAW phase velocity direction correspond with each other), frequency-temperature characteristics like those shown in FIG. 48 are exhibited.

In FIG. 48, the frequency-temperature characteristics are plotted for n=4 test specimens. According to FIG. 48, it can be seen that the frequency fluctuation amount ΔF in the operating temperature range of the test specimens is suppressed to 20 ppm or less.

Figures 49, 50:
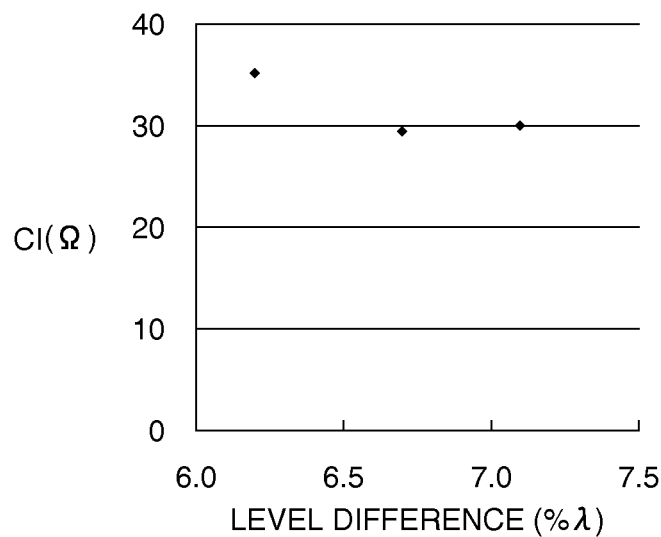
FIG. 49 is a graph illustrating a relationship between a level difference, which is the sum of the inter-electrode finger groove depth and electrode film thickness, and a CI value.
FIG. 50 is a table illustrating an example of an equivalent circuit constant and static characteristic of the SAW resonator according to the embodiment.

In the embodiment, a description has been made of the effect on the frequency-temperature characteristics of the groove depth G, electrode film thickness H, and the like. However, the combined depth of the groove depth G and electrode film thickness H (the level difference) also has an effect on static characteristics such as the equivalent circuit constant and CI value, and on the Q value. For example, FIG. 49 is a graph illustrating the relationship between the level difference and CI value when changing the level difference from 0.062λ to 0.071λ. According to FIG. 49, it can be seen that the CI value converges when the level difference is 0.067λ, and does not improve (does not become lower) even when increasing the level difference further.

The frequency, equivalent circuit constant, and static characteristics of the SAW resonator 10 exhibiting frequency-temperature characteristics like those shown in FIG. 48 are collected in FIG. 50. Here, F represents the frequency, Q represents the Q value, γ represents the capacitance ratio, CI represents the CI (Crystal Impedance) value, and M represents the figure of merit.

Figure 52:
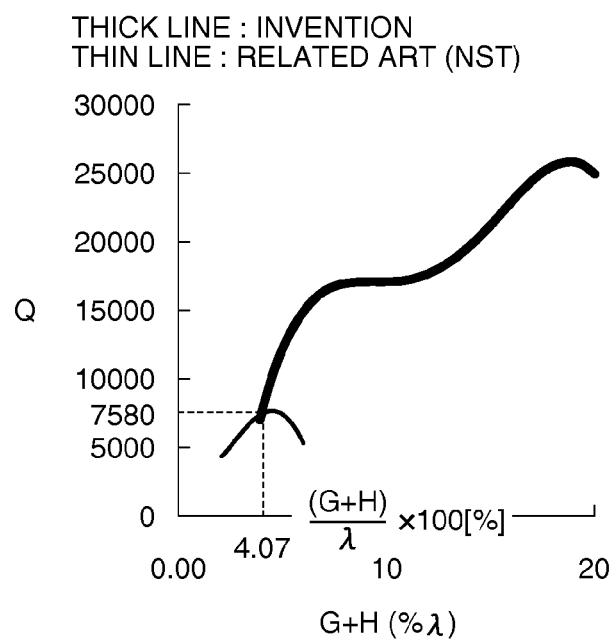
FIG. 52 is a graph for comparing a relationship between the level difference and a Q value for the SAW resonator in the related art and a relationship between the level difference and the Q value for the SAW resonator according to the embodiment.

In addition, FIG. 52 shows a graph for comparing the relationship between the level difference and Q value for the SAW resonator in the related art and the SAW resonator 10 according to the embodiment. In FIG. 52, the graph shown with the thick line indicates the characteristics of the SAW resonator 10 according to the embodiment, grooves are provided between the electrode fingers, and the stop band upper end mode resonance is used. The graph shown with the thin line indicates the characteristics of the SAW resonator in the related art, the stop band upper end mode resonance is used with no groove being provided between the electrode fingers. As is clear from FIG. 52, when providing the grooves between the electrode fingers, and using the stop band upper end mode resonance, a higher Q value is obtained in the area in which the level difference (G+H) is 0.0407λ (4.07%λ) or more than in a case of using the stop band lower end mode resonance with no groove being provided between the electrode fingers.

The basic data of the SAW resonators according to the simulation is as follows.
Basic Data of SAW Resonator 10 According to the Embodiment
H: 0.02λ
G: changes
IDT line occupation rate ηi: 0.6
Reflector line occupation rate ηr: 0.8
Euler angles (0°, 123°, and 43.5°)
Pair number: 120
Intersection width: 40λ (λ=10 μm)
Reflector number (one side): 60
No electrode finger tilt angle
Basic Data of SAW Resonator in the Related Art
H: changes
G: zero
IDT line occupation rate ηi: 0.4
Reflector line occupation rate ηr: 0.3
Euler angles (0°, 123°, and 43.5°)
Pair number: 120
Intersection width: 40λ (λ=10 μm)
Reflector number (one side): 60
No electrode finger tilt angle When referring to FIGS. 50 and 52 in order to compare the characteristics of the SAW resonators, it can be understood how much higher the Q of the SAW resonator 10 according to the embodiment is. It can be supposed that this high Q is due to an energy confinement effect, for the following reasons.

Figure 53:
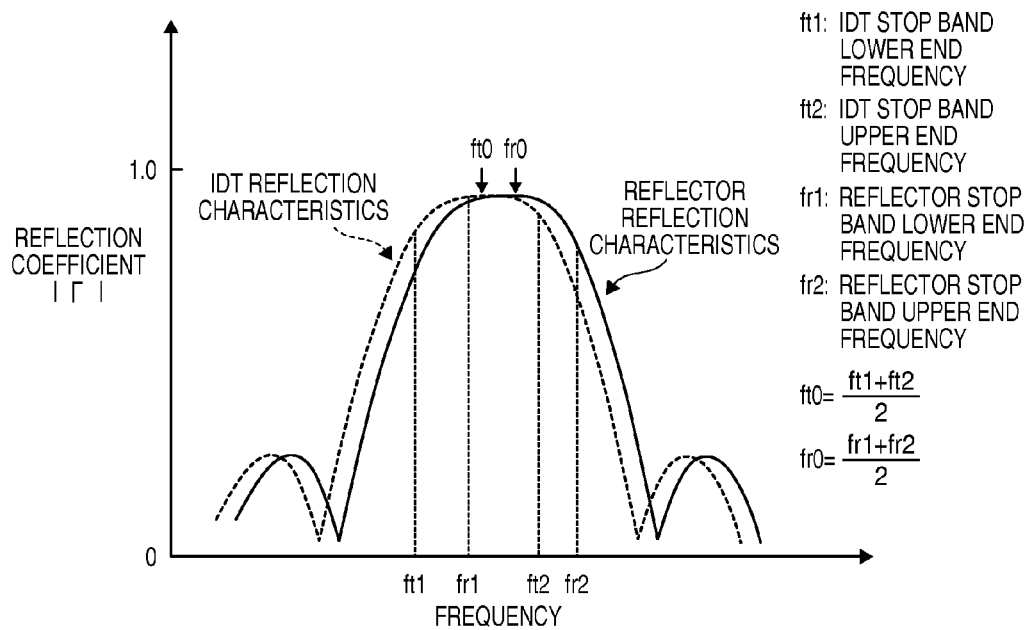
FIG. 53 is a diagram illustrating SAW reflection characteristics of the IDT and reflectors.

In order to efficiently confine the energy of a surface acoustic wave excited in the stop band upper end mode, a stop band upper end frequency ft2 of the IDT 12 may be set between a stop band lower end frequency fr1 of the reflectors 20 and a stop band upper end frequency fr2 of the reflectors 20, as in FIG. 53. That is, it may be set so as to satisfy the relationship of $$fr1 < ft2 < fr2 \qquad (32)$$

With this, a reflection coefficient Γ of the reflectors 20 at the stop band upper end frequency ft2 of the IDT 12 increases, and the stop band upper end mode SAW excited with the IDT 12 is reflected by the reflectors 20 to the IDT 12 side with a high reflection coefficient. Then, the stop band upper end mode SAW energy confinement becomes stronger, and it is possible to realize a low-loss resonator.

As opposed to this, in a case where the relationship between the stop band upper end frequency ft2 of the IDT 12 and the stop band lower end frequency fr1 of the reflectors 20 and stop band upper end frequency fr2 of the reflectors 20 is set to the condition of ft2<fr1, or the condition of fr2<ft2, the reflection coefficient Γ of the reflectors 20 at the stop band upper end frequency ft2 of the IDT 12 decreases, and it becomes difficult to realize a strong energy confinement condition.

Here, in order to realize the condition of Equation (32), it is necessary to make a frequency shift of the stop band of the reflectors 20 to an area higher than the stop band of the IDT 12. Specifically, this can be realized by making the array cycle of the conductor strips 22 of the reflectors 20 shorter than that of the array cycle of the electrode fingers 18 of the IDT 12. In addition, as in other methods, it can be realized by making the thickness of the electrode film formed as the conductor strips 22 of the reflectors 20 less than the thickness of the electrode film formed as the electrode fingers 18 of the IDT 12, or by making the depth of the inter-conductor strip grooves of the reflectors 20 less than the depth of the inter-electrode finger grooves of the IDT 12. In addition, a plurality of these methods may be employed in combination.

Figure 51:
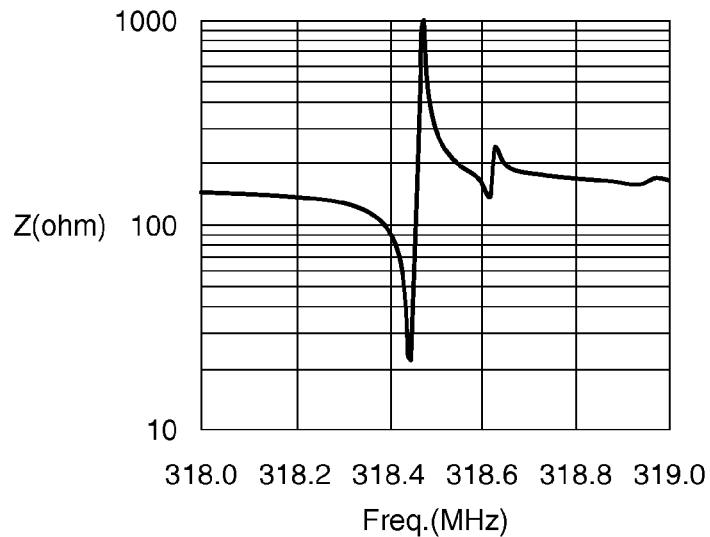
FIG. 51 is impedance curve data of the SAW resonator according to the embodiment.

According to FIG. 50, it can be said that, apart from the high Q, it is possible to obtain a high figure of merit M. In addition, FIG. 51 is a graph illustrating the relationship between an impedance Z and the frequency for the SAW resonator from which FIG. 50 is obtained. From FIG. 51, it can be seen that no unnecessary spurious response exists in the vicinity of the resonance point.

As described above, as the SAW resonator according to the embodiment of the invention has inflection points within the operating temperature range (temperature range to be used: −40° C. to +85° C.), as shown in FIG. 48, it is possible to realize frequency-temperature characteristics which describe a cubic curve, or an approximate cubic curve, with an extremely small frequency fluctuation amount of approximately 20 ppm or less.

Figure 56A:
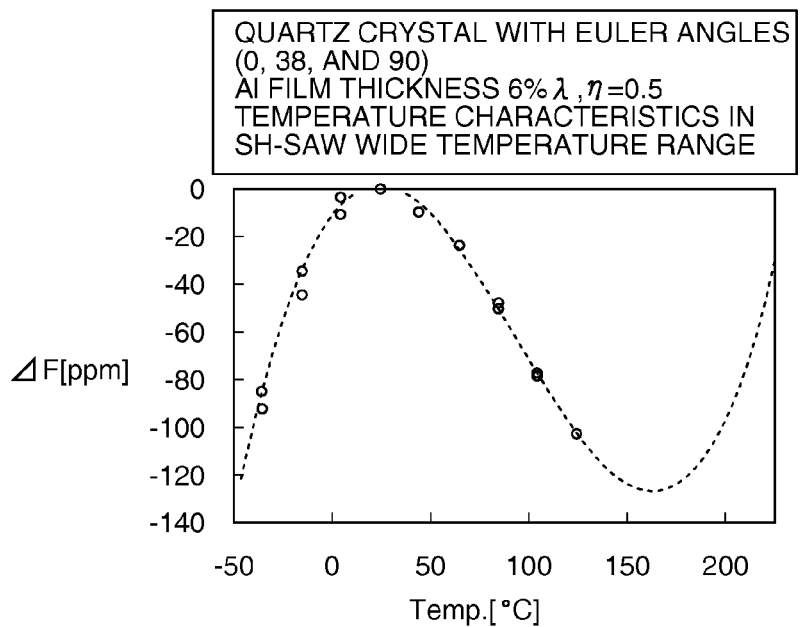
FIGS. 56A and 56B are graphs illustrating frequency-temperature characteristics of a SAW resonator, where
Figure 56B:
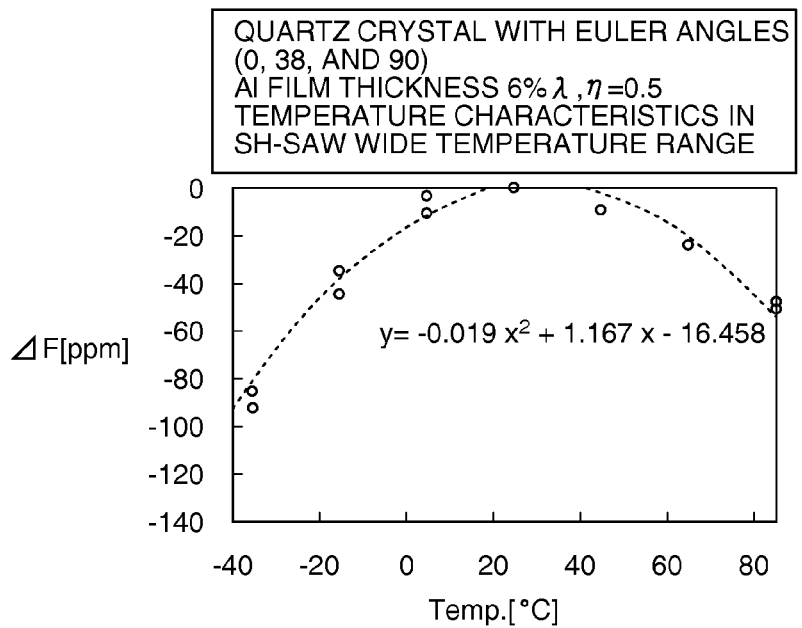

FIG. 56A is a graph illustrating the frequency-temperature characteristics of the SAW resonator disclosed in JP-A-2006-203408. Although the frequency-temperature characteristics describe a cubic curve, as an inflection point exists in an area beyond the operating temperature range (temperature range to be used: −40° C. to +85° C.), as can be seen, it is essentially a quadratic curve which has an upwardly convex peak, as shown in FIG. 56B. For this reason, the frequency fluctuation amount has an extremely high value of 100 (ppm).

As opposed to this, the SAW resonator according to the embodiment of the invention, with the frequency fluctuation amount describing a cubic curve, or an approximate cubic curve, within the operating temperature range, realizes a dramatic reduction of the frequency fluctuation amount. Changes in the frequency fluctuation amount within the operating range for a SAW resonator whose IDT and reflectors are covered with a protective film are shown in FIGS. 57 and 58.

Figure 57:
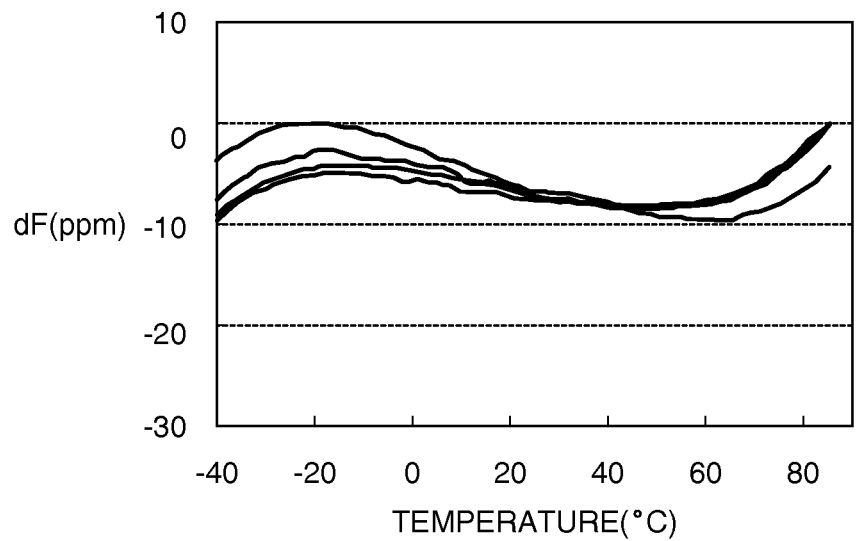
FIG. 57 is a graph illustrating changes in the frequency fluctuation amount in the operating range for a SAW resonator of which the IDT and reflectors are covered with alumina as a protective film.

The example shown in FIG. 57 is a diagram illustrating the frequency fluctuation amount within the operating temperature range when the electrodes are coated with alumina as a protective film. According to FIG. 57, it can be seen that it is possible to keep the frequency fluctuation amount within the operating temperature range at 10 (ppm) or less.
Basic Data of SAW Resonator According to Example Shown in FIG. 57
H: (material: aluminum): 2,000 (ANGSTROM)
G: 4700 (ANGSTROM)
(H+G=0.067λ)
IDT line occupation rate ηi: 0.6
Reflector line occupation rate ηr: 0.8
In-plane rotation ST cut substrate with Euler angles (0°, 123°, and 43.5°)
Pair number: 120
Intersection width: 40λ(λ=10 μm)
Reflector number (one side): 36
No electrode finger tilt angle
Protective film (alumina) thickness 400 (ANGSTROM)
Second-order temperature coefficient β=+0.0007 (ppm/° C.$^2$)

Figure 58:
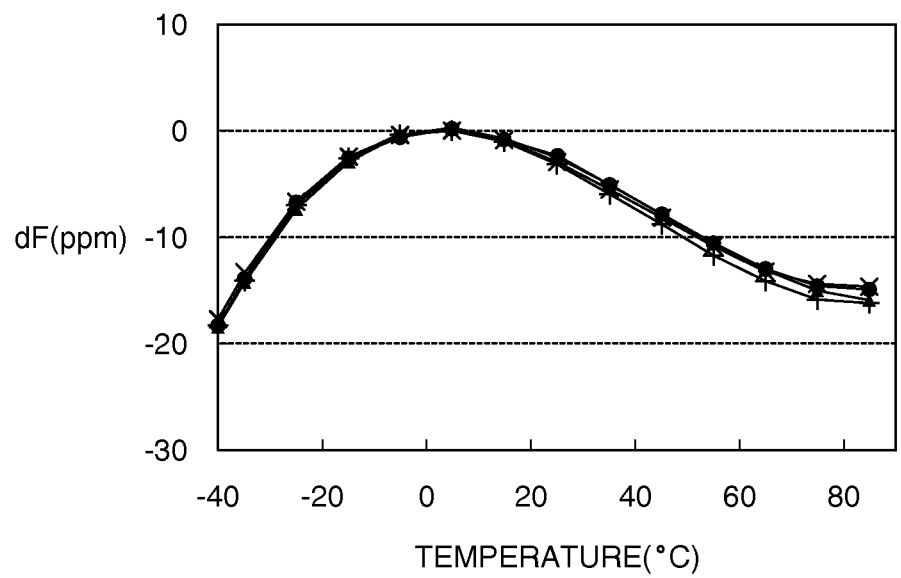
FIG. 58 is a graph illustrating changes in the frequency fluctuation amount in the operating range for a SAW resonator of which the IDT and reflectors are covered with SiO2 as a protective film.

The example shown in FIG. 58 is a diagram illustrating the frequency fluctuation amount within the operating temperature range when the electrodes are coated with SiO$_2$ as a protective film. According to FIG. 58, it can be seen that it is possible to keep the frequency fluctuation amount within the operating temperature range at 20 (ppm) or less.
Basic Data of SAW Resonator According to Example Shown in FIG. 58
H: (material: aluminum): 2,000 (ANGSTROM)
G: 4,700 (ANGSTROM)
(H+G=0.067λ)
IDT line occupation rate ηi: 0.6
Reflector line occupation rate ηr: 0.8
In-plane rotation ST cut substrate with Euler angles (0°, 123°, and 43.5°)
Pair number: 120
Intersection width: 40λ (λ=10 μm)
Reflector number (one side): 36
No electrode finger tilt angle
Protective film (SiO$_2$) thickness 400 (ANGSTROM)
Second-order temperature coefficient β=+0.0039 (ppm/° C.$^2$)

The inventor has described that the absolute value of the second-order temperature coefficient β can be made 0.01 ppm/° C.$^2$ or less by adjusting the line occupation rate η for the above-described designed G and H. On the other hand, the inventor has found that, in a case where the line occupation rate η fluctuates when excitation is performed in the stop band upper end mode, the frequency-temperature characteristics of the surface acoustic wave fluctuate. When a plurality of surface acoustic wave resonators are manufactured, there are cases in which it is difficult to match all the surface acoustic wave resonators with a desired design line occupation rate and thus surface acoustic wave resonators with a line occupation rate different from the design line occupation rate may be manufactured. At this time, fluctuation amounts of the line occupation rates with the design line occupation rate are not constant, and variations in the line occupation rates occur. Therefore, when a plurality of surface acoustic wave resonators are manufactured, variations occur in the frequency-temperature characteristics of the surface acoustic wave. The inventor has found that this causes variations in frequency deviations in an operating temperature range of the surface acoustic wave element, which is a cause of reducing a yield of surface acoustic wave resonators.

In addition, as described above, the inventor has found that a value of the line occupation rate η when a fluctuation amount of the first-order temperature coefficient is the minimum in a case where variations occur in the line occupation rate η and a value of the line occupation rate η where the second-order temperature coefficient β is the minimum (−0.01≤β≤0.01) do not correspond with each other. Therefore, in the second embodiment, a description will be made of a SAW device which can suppress a value of the second-order temperature coefficient β to the above-described range, and can minimize a fluctuation amount of the first-order temperature coefficient which dominantly functions in the frequency-temperature characteristics in the operating temperature range.

Figure 59A:
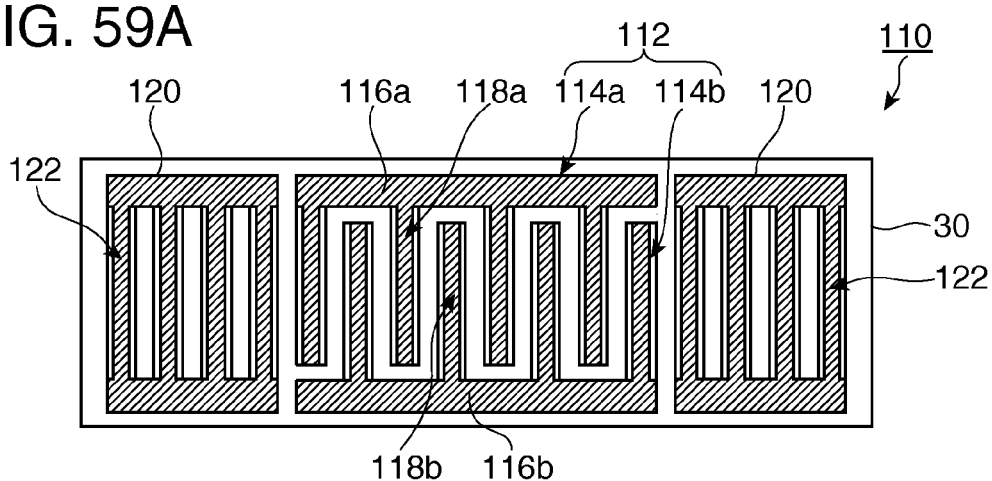
FIGS. 59A to 59D are diagrams illustrating a configuration of a SAW resonator according to a second embodiment, where
Figure 59B:
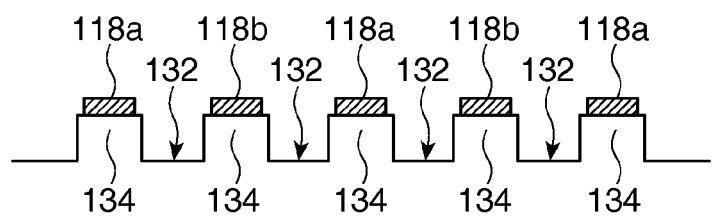
Figure 59C:
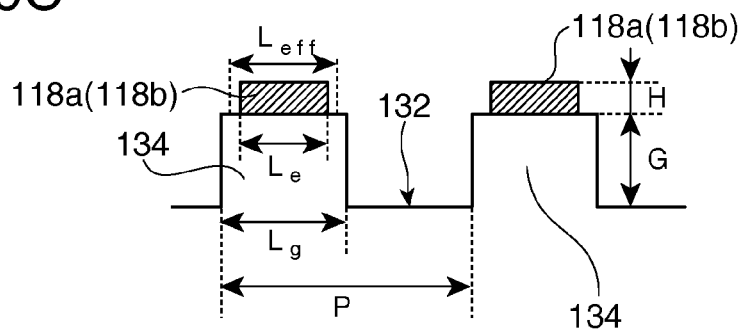
Figure 59D:
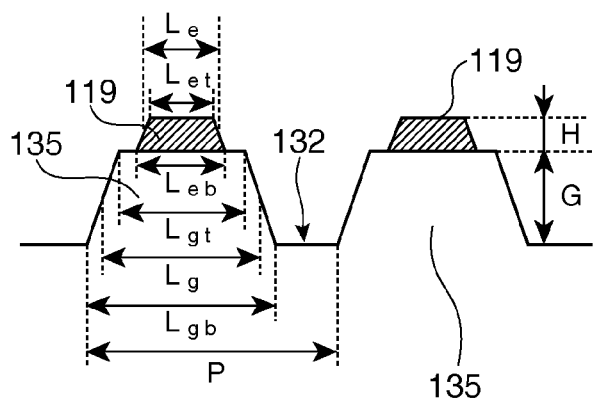

FIGS. 59A to 59D are schematic diagrams of a SAW resonator according to the second embodiment. In FIGS. 59A to 59D, FIG. 59A is a plan view of the SAW resonator according to the second embodiment, FIG. 59B is a partial enlarged sectional view, FIG. 59C is an enlarged view for describing details of FIG. 59B, and FIG. 59D is a diagram which, related to the partial enlarged view of FIG. 59C, is for describing an IDT electrode finger effective line occupation rate ηeff identification method in a case where the cross-sectional shape is not rectangular but trapezoidal, which is a conceivable sectional shape when the SAW resonator according to the embodiment of the invention is manufactured using a photolithography technique and an etching technique.

A basic configuration of the SAW resonator according to the second embodiment is similar to that of the surface acoustic wave resonator 10 according to the first embodiment. That is to say, the SAW resonator 110 includes a quartz crystal substrate 30, an IDT 112 formed on the quartz crystal substrate, and reflectors 120 formed at both sides of the IDT 112. The IDT 112 extends in a direction perpendicular to the direction where surface acoustic wave (wavelength λ) propagates, and is formed by pectinate electrodes 114a and 114b which intersect each other. The pectinate electrode 114a is constituted by a plurality of electrode fingers 118a which are arranged in the propagation direction of the surface acoustic wave at the same interval (λ) and a bus bar 116a which connects a plurality of electrode fingers 118a in parallel to each other. In a similar way, the pectinate electrode 114b is constituted by a plurality of electrode fingers 118b which are arranged in the propagation direction of the surface acoustic wave at the same interval (λ) and a bus bar 116b which connects a plurality of electrode fingers 118b in parallel to each other. Therefore, the electrode fingers 118a and the electrode fingers 118b are alternately disposed in the propagation direction of the surface acoustic wave at the same interval (λ/2). The reflectors 120 have conductor strips 122 which are disposed in the propagation direction of the surface acoustic wave at the same interval (λ/2). In addition, the SAW resonators 110 excite the surface acoustic wave in the stop band upper end mode.

In the first embodiment, the widths of the convex portions 34 formed by the inter-electrode finger grooves 32 correspond with those of the electrode fingers 18a and 18b in the propagation direction of the surface acoustic wave. However, the second embodiment is different from the first embodiment in that the widths of the electrode fingers 118a and 118b in the propagation direction of the surface acoustic wave on the convex portions 134 formed by the inter-electrode finger grooves 132 are smaller than the widths of the convex portions in the propagation direction of the surface acoustic wave. In addition, both ends of the electrode fingers 118a and 118b in the propagation direction of the surface acoustic wave are disposed at inner sides than both ends of the convex portions 134 in the propagation direction of the surface acoustic wave in a plan view. Therefore, both the ends of the convex portions 134 in the propagation direction of the surface acoustic wave are not covered with the electrode fingers 118a and 118b and thus are exposed.
In addition, the same configuration is formed in the reflectors 120 which are disposed at both sides of the IDT 112.

In FIG. 59C, when the width of the convex portion 134 in the propagation direction of the surface acoustic wave is Lg, and the width of each of the electrode fingers 118a and 118b in the propagation direction of the surface acoustic wave is Le, it gives $$L_g > L_e \tag{33}$$

With this, since an amount (solid angle) where lines of electric force emitted from the electrode fingers 118a and 118b are absorbed by the convex portions 134 increases, an excitation efficiency of the surface acoustic wave increases, thereby reducing loss in the SAW resonator 110 in comparison with the first embodiment.

However, in the SAW resonator 10 according to the first embodiment, the surface acoustic wave is reflected at the parts where step differences of both ends of the convex portion 34 (refer to FIGS. 1A to 1D) with the width L in the thickness (G) direction rise. In addition, the line occupation rate η is adjusted by adjusting the width L, and thus it is possible to minimize the second-order temperature coefficient β by adjusting a reflection position of the surface acoustic wave. Further, a fluctuation amount of the first-order temperature coefficient depends on the line occupation rate η of the convex portions 34, and thus it is possible to minimize the fluctuation amount of the first-order temperature coefficient by adjusting a value thereof. However, since the widths of the convex portions 134 corresponding to the line occupation rate η are also L, in the configuration according to the first embodiment, it is difficult to simultaneously specify a line occupation rate η which minimizes the second-order temperature coefficient β and a line occupation rate η which minimizes a fluctuation amount of the first-order temperature coefficient.

On the other hand, in the SAW resonator 110 according to the second embodiment, the surface acoustic wave is reflected at the parts where step differences of both ends of the convex portion 134 with the width Lg in the thickness (G) direction rise and at the parts where step differences of both ends of each of the electrode fingers 118a and 118b with the width Le in the thickness (H) direction rise. Therefore, in the second embodiment, it is supposed that the electrode fingers 118a and 118b have $$L_{\it eff} = (L_g + L_e)/2 \tag{34}$$

as an effective width and reflect the surface acoustic wave at the both end positions.

Therefore, if a line occupation rate of the convex portions 134 is ηg (=Lg/P), and a line occupation rate of the electrode fingers 118a and 118b is ηe (=Le/P), the effective line occupation rate ηeff at this time becomes $$\eta_{\it eff} = (\eta_g + \eta_e)/2 \tag{35}$$

At this time, $$\eta_g > \eta_e \tag{36}$$

Therefore, the second-order temperature coefficient can be adjusted by adjusting ηeff. On the other hand, a fluctuation amount of the first-order temperature coefficient can be adjusted using ηg. Thus, the second-order temperature coefficient can be adjusted by adjusting ηeff, and a fluctuation amount of the first-order temperature coefficient can be adjusted by adjusting ηg.

Further, in a case where, as in FIG. 59D, both side surfaces of electrode fingers 119 and convex portions 135 in the width direction are tilted, and the cross-sectional shapes thereof are trapezoidal, it is assumed that the lower end width of the electrode finger 119 in the thickness direction is Leb, and the upper end width thereof is Let. In addition, it is assumed that the lower end width of the convex portion 135 in the thickness direction is Lgb, and the upper end width thereof is Lgt. At this time, $$\begin{cases} L_{eb} > L_{et} \\ L_{gb} > L_{gt} \\ L_{gt} > L_{eb} \end{cases} \tag{37}$$

Here, Le and Lg are defined as $$\begin{cases} L_e = \dfrac{L_{et} + L_{eb}}{2} \\ L_g = \dfrac{L_{gt} + L_{gb}}{2} \end{cases} \tag{38}$$

The inventor investigated a frequency deviation, a CI value, and a fluctuation amount of the first-order temperature coefficient in a case (type 1) where the width Le of the electrode finger corresponds with the width Lg of the convex portion as in the first embodiment and in a case (type 2) of Lg>Le as in the second embodiment.

In the SAW device used in the investigation for both of the types 1 and 2, the Euler angles were (φ=0°, θ=123°, and Ψ=44°, G=0.046λ, H=0.021λ, the IDT electrode pair number was 210, and the number of the reflectors disposed at both ends of the IDT electrodes was 94 at one sides.

First, as an example 1, in the type 1, the line occupation rate ηe of the electrode fingers was 0.64, and the line occupation rate ηg of the convex portions 34 (refer to FIGS. 1A to 1D) was 0.64 such that the line occupation rate η was 0.64.

In the type 2, the ηe was 0.57 and ηg was 0.71 such that the effective line occupation rate ηeff was 0.64.

Next, as an example 2, in the type 1, the line occupation rate ηe of the electrode fingers 118 and 118b was 0.66, and the line occupation rate ηg of the convex portions 134 was 0.66 such that the line occupation rate η was 0.66. In the type 2, the ηe was 0.59 and ηg was 0.73 such that the effective line occupation rate ηeff was 0.66. That is to say, in both the examples, ηeff in the type 2 maintains the value of 1 in the type 1, and is adjusted such that ηg>ηe. In addition, with regard to a CI value, a plurality of samples (1784) were prepared for each type, and an average value thereof was calculated.

Figure 60:
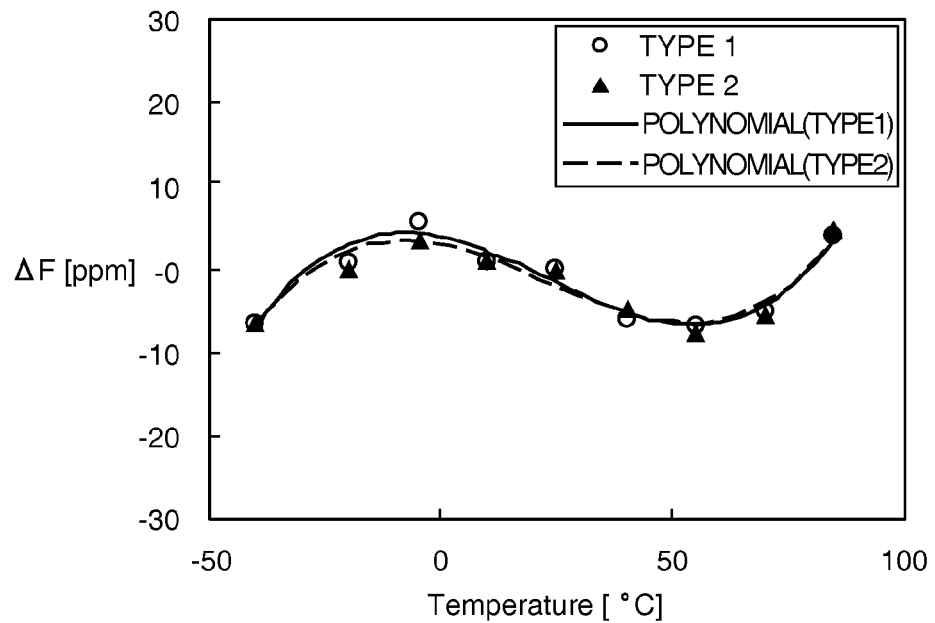
FIG. 60 is a diagram illustrating frequency-temperature characteristics of the type 1 and the type 2 in an example 1.
Figure 61:
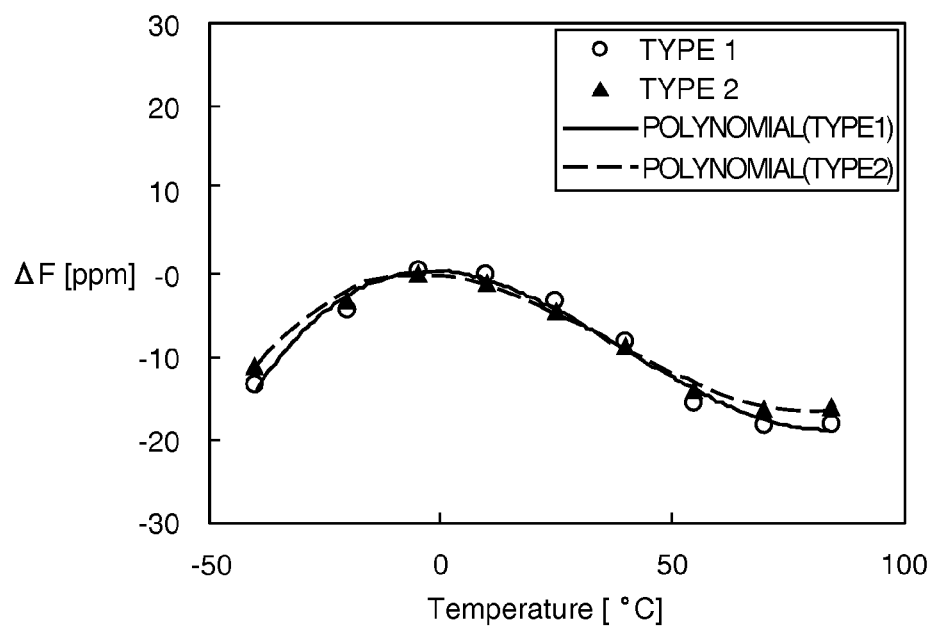
FIG. 61 is a diagram illustrating frequency-temperature characteristics of the type 1 and the type 2 in an example 2.

FIG. 60 shows frequency-temperature characteristics of the type 1 and the type 2 in the example 1, and FIG. 61 shows frequency-temperature characteristics of the type 1 and the type 2 in the example 2. As shown in FIG. 60, in the example 1, both of the type 1 and the type 2 describe a tertiary functional curve having about 25° C. as a temperature (reference temperature) of the inflection point. In addition, as shown in FIG. 61, in the example 2, both of the type 1 and the type 2 describe a tertiary functional curve having about 40° C. as a temperature (reference temperature) of the inflection point. Therefore, it can be seen that both the type 1 and the type 2 have the very small value of the second-order temperature coefficient β in the examples 1 and 2.

As shown in FIG. 60, in the example 1, both the type 1 and the type 2 have the frequency deviation of 12 ppm at −40° C. to +85° C. and the same curve shape. In addition, as shown in FIG. 61, in the example 2, the type 1 has the frequency deviation of 18 ppm, and the type 2 has the frequency deviation of 16 ppm. Therefore, it can be seen that the type 2 maintains the frequency-temperature characteristics of the type 1 as long as ηeff of the type 2 maintains η (ηg) of the type 1 even if the type 1 is transformed into the type 2.

Further, in the example 1, the CI value of the type 1 was 23.8Ω, but that of the type 2 was improved to 20.1Ω. In addition, in the example 2, the CI value of the type 1 was 22.4Ω, but that of the type 2 was improved to 19.2Ω, and thus the type 2 realizes a low-loss SAW resonator in the examples 1 and 2. It is thought that this is because the solid angle at which the convex portions anticipate the lines of electric force generated from the electrode fingers is greater in the type 2 than in the type 1, and thus the excitation efficiency increases, as described above.

Figure 62:
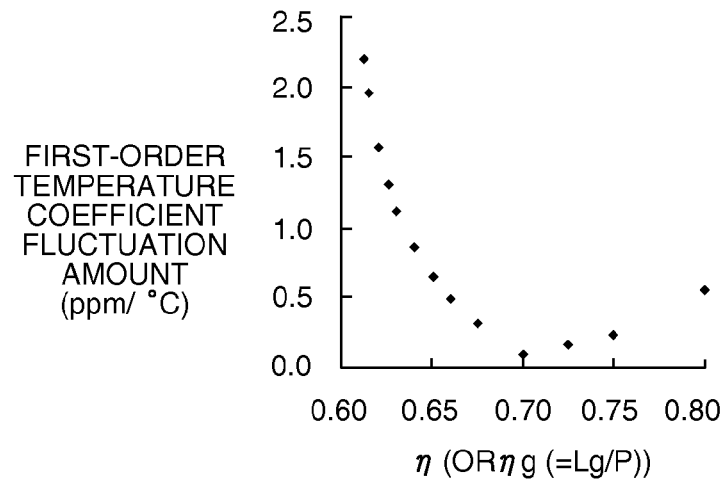
FIG. 62 is a diagram illustrating changes in a fluctuation amount of the first-order temperature coefficient when the line occupation rate η of the type 1 is changed.
Figure 63:
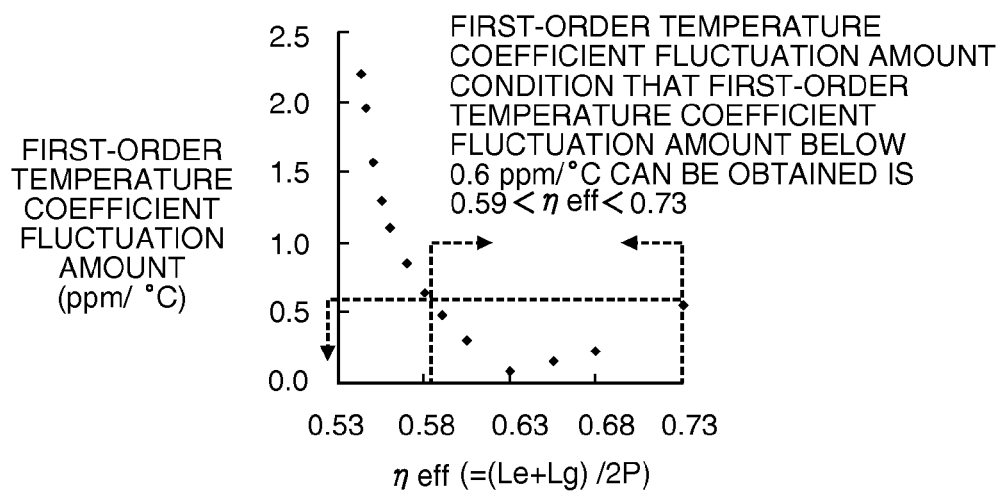
FIG. 63 is a diagram illustrating changes in a fluctuation amount of the first-order temperature coefficient when the effective line occupation rate ηeff of the type 2 is changed.

Next, changes in the fluctuation amounts of the first-order temperature coefficient of the type 1 and the type 2 were investigated. FIG. 62 shows a change of the fluctuation amount of the first-order temperature coefficient when the line occupation rate η of the type 1 changes by 0.01, and FIG. 63 shows a change of the fluctuation amount of the first-order temperature coefficient when the effective line occupation rate ηeff of the type 2 changes by 0.01. In the SAW device used in the investigation for both of the type 1 and the type 2, the Euler angles were (φ=0°, θ=123°, and Ψ=44°), G=0.045λ, and H=0.02λ.

As shown in FIG. 62, in the type 1, the fluctuation amount of the first-order temperature coefficient shows monotone decreasing if η (or ηg) increases from 0.60, it has the minimal value at 0.70, and then shows monotone increasing at 0.70 or more.

On the other hand, as shown in FIG. 63, in the type 2, the fluctuation amount of the first-order temperature coefficient shows monotone decreasing if ηeff increases from 0.53, it has the minimal value at 0.63, and then shows monotone increasing at 0.63 or more.

As described above, the type 1 and the type 2 in the example 1 have a favorable frequency deviation of 12 ppm as shown in FIG. 60. However, in the type 1, the fluctuation amount of the first-order temperature coefficient is 0.6 ppm/° C. when η (or ηg) is 0.64 as shown in FIG. 62. Therefore, due to the variation in the line occupation rate η (ηg), variations in the first-order temperature coefficient (that is, variations in the frequency-temperature characteristics) is remarkable. On the other hand, it can be seen that, in the type 2, if an approximate curve is generated from the plot in FIG. 63 and ηeff = 0.64 is extracted from the approximate curve, the fluctuation amount of the first-order temperature coefficient is about 0.2. Further, from FIG. 63, it can be seen that the following relationship can suppress the fluctuation amount of the first-order temperature coefficient to 0.6 ppm/° C. or less.

$$0.58 < \eta_{eff} < 0.73 \quad (39)$$

In addition, a plurality of samples (1784) for the type 1 and the type 2 in the example 1 were prepared, and variations in the first-order temperature coefficient and variations in the resonance frequency at 25° C. were investigated. If the magnitude of the variation in the first-order temperature coefficient of the type 1 is 1, the magnitude of the variation in the first-order temperature coefficient of the type 2 is improved up to 0.2. As described above, in the type 1, the line occupation rate ηg of the convex portions 34 (refer to FIGS. 1A to 1D) is 0.64, where the fluctuation amount of the first-order temperature coefficient is 0.6 ppm/° C. from FIG. 62. On the other hand, in the type 2, it is confirmed that if the line occupation rate ηg of the convex portions 134 is 0.71, an approximate curve is generated from the plot in FIG. 62, and ηg=0.71 is extracted from the approximate curve, the fluctuation amount of the first-order temperature coefficient is about 0.1 ppm/° C. In addition, it is considered that this improvement can be seen since the variation in the first-order temperature coefficient is proportional to the fluctuation amount of the first-order temperature coefficient. Further, in relation to the variation in the resonance frequency at 25° C. as well, if the magnitude thereof is 1 in the type 1, the magnitude thereof is improved up to 0.5 in the type 2.

In addition, from the above description, the type 2 maintains the frequency-temperature characteristics of the type 1 which has η equal to a value of ηeff. Therefore, it may be considered that η is replaced with ηeff in all the drawings where 1 is expressed by the above-described transverse axis. Therefore, ηeff is designed so as to be included in the range of Equation (39) and the range which is surrounded by the line connected so as to make a round in an alphabetical order, that is, the range satisfying the above Equations (3), (5) and (6) in FIG. 13B, to thereby suppress the fluctuation amount in the first-order temperature coefficient, thereby suppressing the variations in the frequency deviation in the operating temperature range of the SAW resonator 110, and suppressing an absolute value of the second-order temperature coefficient β to 0.01 (ppm/° C.$^2$) or less.

Further, ηeff is set so as to be included in the range of Equation (39), and a range included in the range surrounded by the line connecting the respective points shown with the plane coordinates (G/λ, ηeff) in the figures in an alphabetical order so as to make a round, in FIG. 27A (0<H≤0.005λ), FIG. 28A (0.005λ<H≤0.010λ), FIG. 29A (0.010λ<H≤0.015λ), FIG. 30A (0.015λ<H≤0.020λ), FIG. 31A

(0.020λ<H≤0.025λ), FIG. 32A (0.025λ<H≤0.030λ), and FIG. 33A (0.030λ<H≤0.035λ). This can suppress the variations in the first-order temperature coefficient, thereby suppressing the variations in the frequency-temperature characteristics, that is, the variations in the frequency deviation in the operating range of the SAW resonator 110, and suppressing the absolute value of the second-order temperature coefficient β to 0.01 (ppm/° C.$^2$) or less so as to correspond to the film thickness H of the electrode finger.

In the embodiments, the IDT 12 forming the SAW resonator 10 and the IDT 112 forming the SAW resonator 110 are shown such that all the electrode fingers alternately intersect each other. However, the SAW resonator 10 and the SAW resonator 110 according to the embodiments of the invention can achieve considerable effects only with the quartz crystal substrate. For this reason, even in a case where the electrode fingers 18 in the IDT 12 and the electrode fingers 118a and 118b in the IDT 112 are thinned out, it is possible to achieve the same effect.

In addition, in the first embodiment, the grooves 32 may be partially provided between the electrode fingers 18 and between the conductor strips 22 of the reflectors 20. In particular, as the central portion of the IDT 12, which has a high oscillatory displacement, has a dominant effect on the frequency-temperature characteristics, a structure may be adopted where the grooves 32 are provided only in that portion. In this kind of structure as well, it is possible to achieve a SAW resonator 10 with good frequency-temperature characteristics.

In addition, in the above-described embodiment, it is noted that Al or an Al-based alloy is used as the electrode film. However, the electrode film may be configured using another metal material, provided that it is a metal which can achieve the same effect as the embodiment. Further, a protective film such as SiO$_2$ or alumina may be provided on the electrode film.

In addition, although the above-described embodiment is a one-terminal pair SAW resonator in which only one IDT is provided, the invention is also applicable to a two-terminal pair SAW resonator in which a plurality of IDTs are provided, and is also applicable to a longitudinally coupled or transversally coupled double mode SAW filter or multiple mode SAW filter.

Figure 55A:
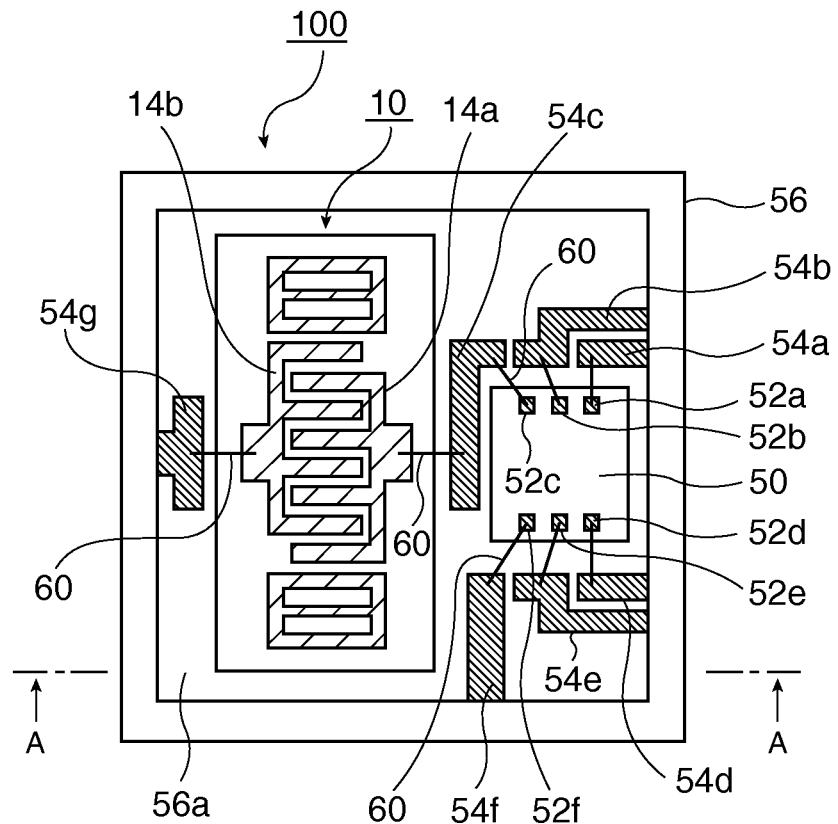
FIGS. 55A and 55B are diagrams illustrating a configuration of a SAW oscillator according to the embodiment.
Figure 55B:
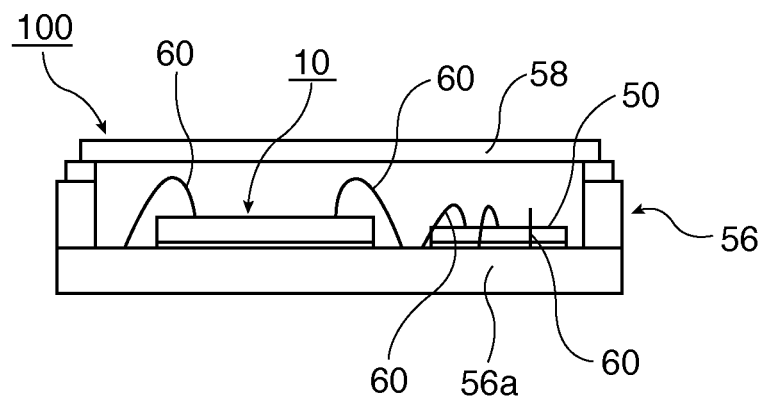

Next, a description will be made, referring to FIGS. 55A and 55B, of the SAW oscillator according to the embodiment of the invention. The SAW oscillator according to the embodiment of the invention, as shown in FIGS. 55A and 55B, is configured of the SAW resonator 10 (the SAW resonator 110), an IC (integrated circuit) 50, which applies voltage to the IDT 12 of the SAW resonator 10 (the SAW resonator 110) so as to control driving thereof, and a package which houses them. In FIGS. 55A and 55B, FIG. 55A is a plan view with a lid removed, and FIG. 55B is a cross-sectional view taken along the line A-A in FIG. 55A.

In the SAW oscillator 100 according to the embodiment, the SAW resonator 10 and IC 50 are housed in the same package 56, and electrode patterns 54a to 54g formed on a bottom plate 56a of the package 56, and the pectinate electrodes 14a and 14b of the SAW resonator 10 and pads 52a to 52f of the IC 50, are connected by metal wires 60. Then, a cavity of the package 56 housing the SAW resonator 10 (the SAW resonator 110) and IC 50 is hermetically sealed with a lid 58. By adopting this configuration, it is possible to electrically connect the IDT 12 (refer to FIGS. 1A to 1D), the IC 50, and an externally mounted electrode (not shown) formed on the bottom surface of the package 56.

Therefore, in response to a demand for an expansion of operating temperature range and higher accuracy of internally mounted electronic devices, with the effect of internal heat generation increasing along with the miniaturization of blade servers and other packages, in addition to a higher reference clock frequency due to the speeding-up of information communication in recent years, and furthermore, in response to a market which needs long-term, stable operating in environments from low temperature to high temperature, such as wireless base stations installed outdoors, the SAW oscillator according to the embodiments of the invention is preferred, as it has extremely good frequency-temperature characteristics of a frequency fluctuation amount of approximately 20 (ppm) or less in its operating temperature range (temperature range to be used: −40° C. to +85° C.)

Furthermore, as the SAW resonator according to the invention, or SAW oscillator including the SAW resonator, realizes a significant improvement in frequency-temperature characteristics, it contributes largely to realizing a product with, as well as extremely good frequency-temperature characteristics, excellent jitter characteristics and phase noise characteristics, for example, a mobile telephone, a hard disk, a personal computer, a tuner receiving a BS and CS broadcast, an instrument processing a high frequency signal transmitted through a coaxial cable or an optical signal transmitted through an optical cable, or an electronic instrument such as a server network instrument or wireless communication instrument which needs a high frequency, high accuracy clock (low jitter, low phase noise) in a wide temperature range, and it goes without saying that it contributes greatly to further system reliability and quality improvement.

The entire disclosure of Japanese Patent Application No. 2010-270953, filed Dec. 3, 2010 is expressly incorporated by reference herein.

What is claimed is:
1. A surface acoustic wave resonator comprising:
a quartz crystal substrate with Euler angles (−1.5°≤φ≤1.5°, 117°≤θ≤142°, and 42.79°≤|Ψ|≤49.57°); and
an IDT that is provided on the quartz crystal substrate, includes a plurality of electrode fingers, and excites a stop band upper end mode surface acoustic wave,
wherein inter-electrode finger grooves which are depressions of the quartz crystal substrate are provided between the electrode fingers in a plan view, and
wherein if a line occupation rate of convex portions of the quartz crystal substrate disposed between the inter-electrode finger grooves is ηg, and a line occupation rate of the electrode fingers disposed on the convex portions is ηe, the following relationships are satisfied in a case where an effective line occupation rate ηeff of the IDT is an arithmetic mean of the line occupation rate ηg and the line occupation rate ηe

$\eta_g > \eta_e$ $0.59 < \eta_{eff} < 0.73$.

2. The surface acoustic wave resonator according to claim 1, wherein if a wavelength of the surface acoustic wave is λ, a depth of the inter-electrode finger groove is G, an electrode film thickness of the IDT is H, and plane coordinates (G/λ, ηeff) are indicated using the value G/λ obtained by dividing the depth G of the inter-electrode finger groove by the wavelength λ of the surface acoustic wave, and the effective line occupation rate ηeff, the plane coordinates (G/λ, ηeff) are included in one of (1) at $0.000\lambda < H \leq 0.005\lambda$ a range surrounded by a line connecting (0.010, 0.710), (0.020, 0.710), (0.030, 0.710), (0.040, 0.710), (0.050, 0.710), (0.060, 0.710), (0.070, 0.710), (0.080, 0.710), (0.090, 0.710), (0.090, 0.420), (0.080, 0.570), (0.070, 0.590), (0.060, 0.615), (0.050, 0.630), (0.040, 0.635), (0.030, 0.650), (0.020, 0.670), and (0.010, 0.710) in this order, and a range surrounded by a line connecting (0.030, 0.590), (0.040, 0.580), (0.050, 0.550), (0.060, 0.520), (0.070, 0.480), (0.080, 0.450), (0.090, 0.400), (0.090, 0.180), (0.080, 0.340), (0.070, 0.410), (0.060, 0.460), (0.050, 0.490), (0.040, 0.520), (0.030, 0.550), and (0.030, 0.590) in this order, (2) at $0.005\lambda < H \leq 0.010\lambda$ a range surrounded by a line connecting (0.010, 0.770), (0.020, 0.740), (0.030, 0.715), (0.040, 0.730), (0.050, 0.740), (0.060, 0.730), (0.070, 0.730), (0.080, 0.730), (0.080, 0.500), (0.070, 0.570), (0.060, 0.610), (0.050, 0.630), (0.040, 0.635), (0.030, 0.655), (0.020, 0.680), (0.010, 0.760), and (0.010, 0.770) in this order, and a range surrounded by a line connecting (0.020, 0.650), (0.030, 0.610), (0.040, 0.570), (0.050, 0.550), (0.060, 0.520), (0.070, 0.470), (0.070, 0.370), (0.060, 0.440), (0.050, 0.480), (0.040, 0.520), (0.030, 0.550), (0.020, 0.590), and (0.020, 0.650) in this order, (3) at $0.010\lambda < H \leq 0.015\lambda$ a range surrounded by a line connecting (0.010, 0.770), (0.020, 0.760), (0.030, 0.760), (0.040, 0.750), (0.050, 0.750), (0.060, 0.750), (0.070, 0.740), (0.080, 0.740), (0.080, 0.340), (0.070, 0.545), (0.060, 0.590), (0.050, 0.620), (0.040, 0.645), (0.030, 0.670), (0.020, 0.705), (0.010, 0.760), and (0.010, 0.770) in this order, and a range surrounded by a line connecting (0.010, 0.740), (0.020, 0.650), (0.030, 0.610), (0.040, 0.570), (0.050, 0.540), (0.060, 0.480), (0.070, 0.430), (0.070, 0.350), (0.060, 0.420), (0.050, 0.470), (0.040, 0.510), (0.030, 0.550), (0.020, 0.610), (0.010, 0.700), and (0.010, 0.740) in this order, (4) at $0.015\lambda < H \leq 0.020\lambda$ a range surrounded by a line connecting (0.010, 0.770), (0.020, 0.770), (0.030, 0.760), (0.040, 0.760), (0.050, 0.760), (0.060, 0.750), (0.070, 0.750), (0.070, 0.510), (0.060, 0.570), (0.050, 0.620), (0.040, 0.640), (0.030, 0.660), (0.020, 0.675), (0.010, 0.700), and (0.010, 0.770) in this order, and a range surrounded by a line connecting (0.010, 0.690), (0.020, 0.640), (0.030, 0.590), (0.040, 0.550), (0.050, 0.510), (0.060, 0.470), (0.070, 0.415), (0.070, 0.280), (0.060, 0.380), (0.050, 0.470), (0.040, 0.510), (0.030, 0.550), (0.020, 0.610), (0.010, 0.680), and (0.010, 0.690) in this order, (5) at $0.020\lambda < H \leq 0.025\lambda$ a range surrounded by a line connecting (0.010, 0.770), (0.020, 0.770), (0.030, 0.760), (0.040, 0.760), (0.050, 0.760), (0.060, 0.760), (0.070, 0.760), (0.070, 0.550), (0.060, 0.545), (0.050, 0.590), (0.040, 0.620), (0.030, 0.645), (0.020, 0.680), (0.010, 0.700), and (0.010, 0.770) in this order, and a range surrounded by a line connecting (0.010, 0.690), (0.020, 0.640), (0.030, 0.590), (0.040, 0.550), (0.050, 0.510), (0.060, 0.420), (0.070, 0.415), (0.070, 0.340), (0.060, 0.340), (0.050, 0.420), (0.040, 0.470), (0.030, 0.520), (0.020, 0.580), (0.010, 0.650), and (0.010, 0.690) in this order, (6) at $0.025\lambda < H \leq 0.030\lambda$ a range surrounded by a line connecting (0.010, 0.770), (0.020, 0.770), (0.030, 0.770), (0.040, 0.760), (0.050, 0.760), (0.060, 0.760), (0.070, 0.760), (0.070, 0.550), (0.060, 0.505), (0.050, 0.590), (0.040, 0.620), (0.030, 0.645), (0.020, 0.680), (0.010, 0.700), and (0.010, 0.770) in this order, and a range surrounded by a line connecting (0.010, 0.670), (0.020, 0.605), (0.030, 0.560), (0.040, 0.520), (0.050, 0.470), (0.060, 0.395), (0.070, 0.500), (0.070, 0.490), (0.060, 0.270), (0.050, 0.410), (0.040, 0.470), (0.030, 0.520), (0.020, 0.580), (0.010, 0.620), and (0.010, 0.670) in this order (7) at $0.030\lambda < H \leq 0.035\lambda$ a range surrounded by a line connecting (0.010, 0.770), (0.020, 0.770), (0.030, 0.770), (0.040, 0.760), (0.050, 0.760), (0.060, 0.760), (0.070, 0.760), (0.070, 0.550), (0.060, 0.500), (0.050, 0.545), (0.040, 0.590), (0.030, 0.625), (0.020, 0.650), (0.010, 0.680), and (0.010, 0.770) in this order a range surrounded by a line connecting (0.010, 0.655), (0.020, 0.590), (0.030, 0.540), (0.040, 0.495), (0.050, 0.435), (0.060, 0.395), (0.070, 0.500), (0.070, 0.550), (0.060, 0.380), (0.050, 0.330), (0.040, 0.410), (0.030, 0.470), (0.020, 0.520), (0.010, 0.590), and (0.010, 0.655) in this order.

3. The surface acoustic wave resonator according to claim 1, wherein the depth G of the inter-electrode finger groove and the effective line occupation rate $\eta_{eff}$ satisfy the following relationships:

$$-2.0000 \times G/\lambda + 0.7200 \leq \eta_{eff} \leq -2.5000 \times G/\lambda + 0.7775$$

provided that $0.0100\lambda \leq G \leq 0.0500\lambda$ $$-3.5898 \times G/\lambda + 0.7995 \leq \eta_{eff} \leq -2.5000 \times G/\lambda + 0.7775$$

provided that $0.0500\lambda < G \leq 0.0695\lambda$.

4. The surface acoustic wave resonator according to claim 3, wherein the electrode film thickness H of the IDT satisfies the following relationship $$0 < H \leq 0.035\lambda.$$

5. The surface acoustic wave resonator according to claim 4, wherein the effective line occupation rate $\eta_{eff}$ satisfies the following relationship $$\eta_{eff} = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \pm 0.04.$$

6. The surface acoustic wave resonator according to claim 2, wherein the sum of the depth G of the inter-electrode finger groove and the electrode film thickness H satisfies the following relationship $$0.0407\lambda \leq G + H.$$

7. The surface acoustic wave resonator according to claim 1, wherein $\Psi$ and $\theta$ satisfy the following relationship $$\Psi = 1.191 \times 10^{-3} \times \theta^3 - 4.490 \times 10^{-1} \times \theta^2 + 5.646 \times 10^1 \times \theta - 2.324 \times 10^3 \pm 1.0.$$

8. The surface acoustic wave resonator according to claim 1, wherein if a stop band upper end mode frequency of the IDT is ft2, a stop band lower end mode frequency of reflectors provided so as to sandwich the IDT in the propagation direction of the surface acoustic wave is fr1, and a stop band upper end mode frequency of the reflectors is fr2, the following relationship is satisfied $$fr1 < ft2 < fr2.$$

9. The surface acoustic wave resonator according to claim 1, wherein an inter-conductor strip groove is provided between conductor strips forming the reflectors, and wherein a depth of the inter-conductor strip groove is smaller than that of the inter-electrode finger groove.

10. A surface acoustic wave oscillator comprising the surface acoustic wave resonator according to claim 1 and a circuit that drives the IDT.

11. An electronic apparatus comprising the surface acoustic wave resonator according to claim 1.

* * * * *